United States Patent
Hatakeyama et al.

(10) Patent No.: US 7,629,106 B2
(45) Date of Patent: *Dec. 8, 2009

(54) RESIST COMPOSITION AND PATTERNING PROCESS USING THE SAME

(75) Inventors: Jun Hatakeyama, Niigata (JP); Koji Hasegawa, Niigata (JP); Youichi Ohsawa, Niigata (JP); Seiichiro Tachibana, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/580,962

(22) Filed: Oct. 16, 2006

(65) Prior Publication Data

US 2007/0111140 A1  May 17, 2007

(30) Foreign Application Priority Data

Nov. 16, 2005 (JP) .............................. 2005-332189

(51) Int. Cl.
G03F 7/039 (2006.01)

(52) U.S. Cl. .................... 430/270.1; 430/326; 430/910; 430/913; 430/914; 430/921; 430/925

(58) Field of Classification Search .............. 430/270.1, 430/286.1, 913, 914, 921, 925, 910
See application file for complete search history.

(56) References Cited

U.S. PATENT DOCUMENTS

| | | | | |
|---|---|---|---|---|
| 4,491,628 | A | | 1/1985 | Ito et al. |
| 5,130,392 | A | * | 7/1992 | Schwalm et al. ............ 526/288 |
| 6,673,511 | B1 | * | 1/2004 | Hatakeyama et al. .... 430/270.1 |
| 2002/0182541 | A1 | * | 12/2002 | Gonsalves ............... 430/287.1 |
| 2005/0014090 | A1 | * | 1/2005 | Hirayama et al. ........ 430/270.1 |
| 2005/0202351 | A1 | * | 9/2005 | Houlihan et al. ............ 430/322 |
| 2006/0105266 | A1 | * | 5/2006 | Khojasteh et al. ........ 430/270.1 |
| 2006/0105267 | A1 | * | 5/2006 | Khojasteh et al. ........ 430/270.1 |
| 2008/0020289 | A1 | * | 1/2008 | Hatakeyama et al. .......... 430/4 |

FOREIGN PATENT DOCUMENTS

| | | |
|---|---|---|
| EP | 0 249 139 A2 | 12/1987 |
| JP | A-63-27829 | 2/1988 |
| JP | B2-2-27660 | 6/1990 |
| JP | A-4-230645 | 8/1992 |
| JP | A-9-73173 | 3/1997 |
| JP | A-9-90637 | 4/1997 |
| JP | A-9-230595 | 9/1997 |
| JP | A-10-10739 | 1/1998 |
| JP | A-2000-26446 | 1/2000 |
| JP | A-2000-159758 | 6/2000 |
| JP | A-2000-327633 | 11/2000 |
| JP | 2002-107933 | * 4/2002 |
| JP | A-2002-107933 | 4/2002 |
| JP | A-2002-371114 | 12/2002 |
| JP | A-2004-163877 | 6/2004 |
| JP | A-2005-84365 | 3/2005 |
| WO | WO 97/33198 A1 | 9/1997 |
| WO | WO 2004/074242 A2 | 9/2004 |
| WO | WO 2005/109102 | * 11/2005 |

OTHER PUBLICATIONS

Dammel, Ralph R. et al. "193 nm Immersion Lithography-Taking the Plunge," Journal of Photopolymer Science and Technology, vol. 17, No. 4, May 19, 2004, p. 587-601.

Gonsalves, Kenneth E. et al. "High Resolution Resists for Next Generation Lithography: The Nanocomposite Approach," Mat. Res. Soc. Symp. Proc., vol. 636, 2001.

Okino, Takeshi et al. "Resists Using the Absorption Band Shift Method for ArF Excimer Laser Lithography," Journal of Photopolymer Science and Technology, vol. 11, No. 3, Jun. 10, 1998, p. 489-492.

* cited by examiner

*Primary Examiner*—Cynthia H Kelly
*Assistant Examiner*—Anca Eoff
(74) *Attorney, Agent, or Firm*—Oliff & Berridge, PLC

(57) ABSTRACT

There is disclosed a resist composition which shows high sensitivity and high resolution on exposure to high energy beam, provides reduced Line Edge Roughness because swelling at the time of development is reduced, provides minor amounts of residue after development, has excellent dry etching resistance, and can also be used suitably for the liquid immersion lithography; and a patterning process using the resist composition. There can be provided a resist composition which comprises, at least, a polymer including repeating units represented by the following general formulae (a) and (b).

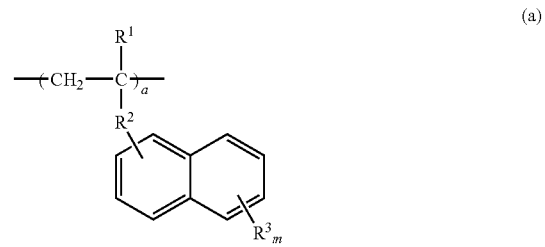

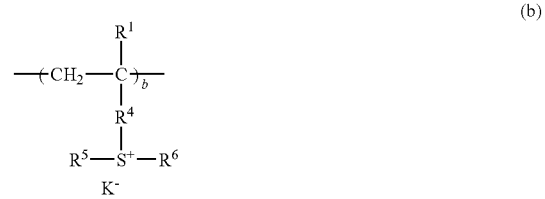

25 Claims, No Drawings

RESIST COMPOSITION AND PATTERNING PROCESS USING THE SAME

BACKGROUND OF THE INVENTION

1. Field of the Invention

The present invention relates to a resist composition, especially to a chemically amplified positive resist composition, suitable as a micropatterning material, especially for the VLSI manufacture or for the photomask patterning, which shows a very high alkali dissolution-rate contrast before and after exposure, high sensitivity and high resolution, a reduced Line Edge Roughness, and an outstanding etching resistance upon exposure to a high energy beam; and to a patterning process using the resist composition.

2. Description of the Related Art

In recent years, with a tendency of realizing higher integration and higher speed of LSI, a finer pattern rule has been implemented rapidly. This rapid implementation of a finer pattern rule is based on achievement of higher NA of a projection lens, improvement of resist composition properties, and use of shorter wavelength radiation. Especially use of KrF (248 nm) instead of i line (365 nm), the former has a shorter wavelength than the latter, has brought major changes. For example, mass production of a device under 0.18 micron rule is made possible. In the tendency that resolution and sensitivity of resist compositions become higher, the acid-catalyzed chemically amplified positive resist composition (for example, see Japanese Publication of Examined Application No. 2-27660; and Japanese Publication of Unexamined Application No. 63-27829) has excellent features and thus has become a main resist composition especially for deep-ultraviolet lithography.

The resist compositions for KrF excimer laser have began to be used generally for a 0.3 micron process. The compositions are applying to mass-production under 0.25 micron rule and then now under 0.18 micron rule. Furthermore, examination of a 0.15 micron rule has also been started. In this way, the tendency of realizing a finer pattern rule is accelerated increasingly. It is expected that a design rule should be finer of 0.13 µm or less by shifting to shorter wavelength of from a KrF excimer laser to an ArF excimer laser (193 nm). However, it is hard to use novolak resins and polyvinyl phenol resins which have been used conventionally as a base resin for resist, because they have a quite strong absorption around the wavelength of 193 nm. Then, aliphatic resins such as acrylic resins or cycloolefin resins have been examined to ensure transparency and a required dry etching resistance (for example, see Japanese Publication of Unexamined Application No. 9-73173; Japanese Publication of Unexamined Application No. 10-10739; Japanese Publication of Unexamined Application No. 9-230595; and International Publication No. 97/33198).

Among the above resist compositions, the (meth)acrylic-based resist compositions with high resolution have been examined. As for the (meth)acrylic resins, combination of a (meth)acrylic unit which has methyl adamantane ester as an acid labile group unit and a (meth)acrylic unit which has an ester of a lactone ring as an adhesion group unit has been proposed (for example, see Japanese Publication of Unexamined Application No. 9-90637). Furthermore, norbornyl lactone is proposed as an adhesion group with an enhanced etching resistance (for example, see Japanese Publication of Unexamined Application No. 2000-26446; Japanese Publication of Unexamined Application No. 2000-159758; and Japanese Publication of Unexamined Application No. 2002-371114).

Some important issues to be achieved in ArF lithography are to reduce Line Edge Roughness and residue after development. One of the causes for Line Edge Roughness is swelling at the time of development. Polyhydroxystyrene used for a resist composition for KrF lithography resists swelling because phenol of polyhydroxy styrene is a slightly acidic group and has a moderate alkali solubility. On the other hand, polymers containing a highly hydrophobic alicyclic group tend to swell at the time of development, because the polymers are dissolved with a carboxylic acid with strong acidity.

A naphthalene ring has a weak absorption at the wavelength of 193 nm. Vinylnaphthalene-copolymer-based ArF resist compositions have been proposed (for example, see J. Photopolym. Sci. Technol., Vol. 11, No. 3, p 489 (1998); Japanese Publication of Unexamined Application No. 2004-163877; and Japanese Publication of Unexamined Application No. 2002-107933). Because a naphthalene ring having a hydroxy group is slightly acid like phenol, and it is expected that the compositions are conducive to preventing swell at the time of development. The naphthalene ring also has the advantage of having high etching resistance.

The ArF lithography was partially introduced to fabricate devices of 130 nm node, and has become the main lithography technique to fabricate devices of 90 nm node and 65 nm node. As a next lithography technique to fabricate devices of 45 nm node, 157 nm lithography with $F_2$ laser was initially thought to be promising. However, a delay in developing the lithography technique was pointed out due to problems such as low quality of a $CaF_2$ single crystal used for a projection lens, involvement of design changes of optical systems owing to indispensable use of hard pellicle, and deterioration of etching resistance of resists. Therefore, the ArF liquid immersion lithography has suddenly gathered attention (for example, see Journal of photopolymer Science and Technology Vol. 17, No. 4, p 587 (2004)).

The more numerical aperture (NA) of a projection lens projecting pattern image onto a substrate increases, the more resolution of the lens improves. In the liquid immersion lithography, a gap between a projection lens and a wafer is filled with liquid with a higher index of refraction than that of air to design NA of the projection lens to be 1.0 or more, thus high resolution can be achieved. As for the liquid, water with an index of refraction of 1.4366 is under review.

However, the liquid immersion lithography caused problems that a resist pattern obtained through the liquid immersion exposure and development collapses or becomes T-top profile. Therefore, a patterning process that can provide an excellent resist pattern after development with the liquid immersion lithography has been demanded.

SUMMARY OF THE INVENTION

The present invention has been accomplished to solve the above-mentioned problems, and an object of the present invention is to provide a resist composition which shows high sensitivity and high resolution upon exposure to high energy beam, shows reduced Line Edge Roughness because swelling at the time of development is reduced, provides minor amounts of residue after development, has high etching resistance, and can also be used suitably for the liquid immersion lithography; and a patterning process using the resist composition.

To achieve the object, the present invention provides a resist composition which comprises, at least, a polymer including repeating units represented by the following general formulae (a) and (b),

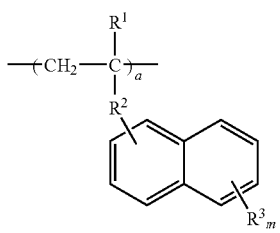

(a)

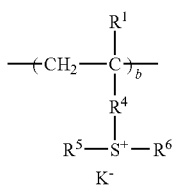

(b)

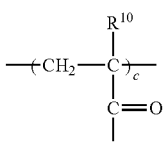

(c)

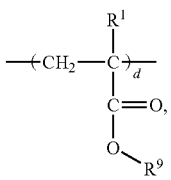

(d)

wherein $R^1$, which may be the same or different, represents a hydrogen atom or a methyl group;

$R^2$ represents any one of a single bond, —O—, —C(=O)—O—, and —C(=O)—NH—;

$R^3$ represents any one of a hydroxy group, a hydroxy group substituted with an acid labile group or an acetyl group, a carboxy group, and a carboxy group substituted with an acid labile group;

$R^4$ represents any one of a phenylene group, —O—$R^7$—, —C(=O)—$X^1$—$R^7$—, —C(=O)—O—$C_2H_4$—O—$Y^1$—, —C(=O)—O—$Z^1$—C(=O)—$CH_2$—, —$Z^1$-C(=O)—$CH_2$—, —C(=O)—O—$Z^1$-$CH_2$—, and —C(=O)—$X^1$—$R^7$-$Z^1$-;

$X^1$ represents an oxygen atom or NH;

$R^7$ represents a linear, branched or cyclic alkylene group having 1-6 carbon atoms which may contain a carbonyl group, an ester group or an ether group or an arylene group having 6-8 carbon atoms which may contain a carbonyl group, an ester group or an ether group;

$Y^1$ represents any one of a phenylene group, a naphthylene group, and an anthrylene group;

$Z^1$ represents a phenylene group;

$R^5$ and $R^6$, which may be the same or different, represent a linear, branched or cyclic alkyl group having 1-12 carbon atoms which may contain a carbonyl group, an ester group or an ether group, an aryl group having 6-12 carbon atoms, an aralkyl group having 7-20 carbon atoms or a thiophenyl group;

$R^5$ and $R^6$ can be linked to form a ring;

$K^-$ represents a non-nucleophilic counter ion;

m represents 1 or 2;

a satisfies 0<a<1.0; and b satisfies 0<b≦0.8.

The resist composition according to the present invention shows, upon exposure to a high energy beam, a sharply high alkali dissolution-rate contrast before and after exposure, a high sensitivity, a high resolution, and a reduced Line Edge Roughness because swelling at the time of development is suppressed. Furthermore, the resist composition provides minor amount of etch residues, and has an excellent etching resistance. Therefore, the resist composition with the above properties is highly practical, and is suitable as micropatterning material for the VLSI manufacture or for a photomask patterning.

Furthermore, application of the resist composition according to the present invention to the liquid immersion lithography hardly cause a problem that water infiltrates the resist and then the resist swells. Therefore, the water immersion exposure (the liquid immersion exposure) hardly deforms pattern profiles. Consequently, the resist composition according to the present invention can be suitably used for the liquid immersion lithography.

In the above case, it is preferable that the polymer further includes repeating units represented by the following general formulae (c) and/or (d), wherein $R^1$ represents a hydrogen atom or a methyl group;

$R^8$ represents an adhesion group with lactone;

$R^9$ represents an acid labile group;

$R^{10}$ represents any one of a hydrogen atom, a methyl group, and —$CH_2$—C(=O)—O—$CH_3$; and c and d satisfies 0≦c≦0.8, 0≦d≦0.8, and 0<c+d≦0.8.

In this way, by further including repeating units (c) and/or (d), the resist composition has desired hydrophilicity, alkali solubility, and adhesion property.

In the above cases it is preferable that the resist composition according to the present invention is a chemically amplified positive resist composition.

The resist composition comprising the polymer includes a polymeric acid generator as the repeating unit (b), and then can function as a chemically amplified positive resist composition. An acid generated from the acid generator upon exposure to radiation cleaves an acid cleavable group to change an exposed area of the resist to be soluble in a developer. Thus, the chemically amplified positive resist composition provides a pattern with extremely high precision.

In the above cases, the resist composition according to the present invention can further contain any one or more of an organic solvent, a basic compound, a dissolution inhibitor and a surfactant.

In this way, by further adding an organic solvent, for example, an application property of the resist composition to a substrate etc. can be improved. By adding a basic compound, a diffusion rate of acid in a resist film can be suppressed and thus resolution can be further improved. By adding a dissolution inhibitor, difference of a dissolution rate between an exposed area and a non-exposed area can be further increased and thus resolution can be further improved. By adding a surfactant, an application property of the resist composition can be further improved or controlled.

Such a resist composition of the present invention can be used for patterning semiconductor substrates, mask substrates, and so on. A patterning process with the resist composition comprises: at least, a step of applying the resist composition over a substrate; a step of exposing the substrate to high energy beam after heat-treatment; and a step of developing the substrate with a developer.

In this patterning process, it is natural that development may be conducted after heat treatment following exposure, and other various processes, such as an etching process, a resist removing process, a washing process, etc. may be performed.

In the above case, it is preferable that the high energy beam has a wavelength of 200 nm or less.

In particular, the resist composition according to the present invention is suitably exposed to a high energy beam with a wavelength of 200 nm or less. The resist composition shows an excellent sensitivity upon exposure to radiation with the wavelength.

In addition, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

The resist composition of the present invention shows high sensitivity and high resolution upon exposure to ArF excimer laser light, provides reduced Line Edge Roughness. The resist composition hardly causes a problem that water infiltrates the resist and then the resist swells. Therefore, the water immersion exposure (the liquid immersion exposure) hardly deform pattern profiles. Consequently, use of the resist composition as a patterning composition in the ArF liquid immersion lithography provides a precise resist pattern without deteriorating the pattern profile thereof.

As described above, the present invention provides a resist composition which shows high sensitivity to high energy beams, especially to ArF excimer laser, $F_2$ excimer laser, EUV, X-ray, EB, etc., and which provides high resolution, a reduced size difference between isolated pattern and congested pattern, a reduced Line Edge Roughness, and which has high etching resistance. And also, because generated acid is insoluble in water, deformation of pattern profiles is hardly observed even with water immersion exposure (liquid immersion exposure). Consequently, the present invention provides a resist composition which is extremely useful for a precise ultra-fine processing.

DESCRIPTION OF THE INVENTION AND A PREFERRED EMBODIMENT

Hereafter, an embodiment of the present invention will be explained, but the present invention is not limited thereto.

In recent years, higher integration and higher speed of LSI have been achieved, and finer pattern rule has been demanded. Then, deep-ultraviolet lithography and vacuum ultraviolet lithography are regarded as possible micropatterning techniques of next generation. Especially, photolithography using ArF excimer laser light as a light source is an indispensable technique for ultra micropatterning of 0.13 μm or less.

Among the photolithography using ArF excimer laser light as a light source, the ArF liquid immersion lithography has gathered attention. The liquid immersion lithography achieves high resolution by exposure with filling a gap between a projection optical system and a substrate with liquid. However, there are problems that a resist pattern obtained through the liquid immersion exposure and development collapses or has T-top profile.

Then, the immersion liquid was analyzed and it was confirmed that anion generated by an acid generator or photolysis of an acid generator dissolved into water. Against this cause, applying an overcoat for resist has been suggested to prevent dissolution of anion generated by an acid generator or photolysis of an acid generator into water. The process using the overcoat has come to be viable due to development of an overcoat for resist with which development can be performed. However, some device makers are reluctant to add the process step for attaching the overcoat, thus improvement of resist has been demanded not to use an overcoat. Therefore, development of an acid generator and anionic type that do not dissolve into water has been demanded.

Meanwhile, a resist with high sensitivity and high resolution has been demanded in EB or EUV lithography. It is effective to add a large amount of an acid generator with high efficiency of acid generation to a resist with high sensitivity. However, addition of a large amount of a monomeric acid generator leads to decrease of rigidity of the film, thus an acid diffusion distance increases and results in a problem of resolution deterioration. Accordingly, an acid generator of which addition to a resist with high sensitivity does not cause resolution deterioration has been demanded.

Then, a bilayer resist containing silicone which was formed by copolymerizing a methacrylic monomer with pendant sulfonium salt is suggested in Mat. Res. Soc. Symp. Proc. Vol. 636, D6. 5. 1 (2001).

Furthermore, a polymerizable onium salt is proposed in Japanese Publication of Unexamined Application No. 4-230645 and Japanese Publication of Unexamined Application No. 2005-084365.

Then, the present inventors have studied thoroughly based on the knowledge to achieve the above mentioned object. As a result, they have found that an acid generator obtained by polymerizing a sulfonium salt having a polymerizable unsaturated bond, especially a polymer comprising a repeating unit (b) obtained by polymerizing a sulfonium salt represented by the following general formula is highly sensitive to ArF excimer laser light and insoluble in water, thus the polymer is applicable to the ArF liquid immersion exposure, and that the polymer has sufficient thermal stability and preservation stability. And also, they have found that a resist composition comprising the polymer has high resolution, can improve Line Edge Roughness and proximity bias of isolated and dense pattern, and is extremely useful for a precise ultra-fine processing.

Furthermore, the present inventors have studied thoroughly to obtain a positive resist composition which shows high sensitivity and high resolution on exposure to high energy beam, provides reduced Line Edge Roughness because swelling at the time of development is reduced, and provides minor amounts of residue after development.

Polyhydroxystyrene, which is used for KrF excimer laser lithography, is characterized by minor swelling in alkaline developers because polyhydroxystyrene has phenolic groups with proper acidity. However, polyhydroxystyrene cannot be used for ArF excimer laser lithography because a benzene ring has a quite strong absorption at the wavelength of 193 nm. Then, use of vinylnaphthalene, which has absorption peak at longer wavelength than the benzene ring, was porposed. However, even though vinylnaphthalene has weaker absorption than styrene, vinylnaphthalene has very strong absorption for a resist composition. This restricts introduction ratio of vinylnaphthalene and requires thinner resist films.

By the way, the problem that resist patterns collapse after development becomes serious, and thinner resist films tend to be used. Use of resist films with a thickness of 150 nm or less is examined in 45 nm generation. Along with this, degradation of etching resistance of the films becomes serious. In addition, it is known that use of thinner resist films causes a problem that Line Edge Roughness increases. When thinner resist films are used, resist compositions with high absorption rather have an advantage in that such resist compositions does not provide reverse taper pattern profiles.

When resist compositions for implantation are used, a substrate with high reflectivity is used. Therefore, it is necessary to reduce transmittance of the composition intentionally to reduce reflection from the substrate. To reduce the transmittance, increasing addition amount of photoacid generator (PAG) has conventionally been effective. However, excessive increase of PAG addition amount leads to deterioration of properties such as degradation of etching resistance, deterioration of resolution due to increase of acid diffusion, or increase of proximity bias.

Then, the present inventors have studied thoroughly to conceive introducing phenolic hydroxy groups and thus to examine copolymerizing the monomers corresponding to the repeating unit (a) and (b). The monomer corresponding to the repeating unit (a) has hydroxynaphthalene with a polymerizable unsaturated bond such as vinyl, vinyl ether, or (meth)acrylate as an adhesion group. The monomer corresponding to the repeating unit (b) is sulfonium salt with a polymerizable unsaturated bond.

The present inventors have also found that further copolymerizing the monomer corresponding to the repeating unit (c) having lactone as an adhesion group makes it possible to balance hydrophilicity, alkaline solubility, and adhesion property. In particular, the present inventors have found that use of a polymer obtained by combining (meth)acrylate with a bridged cyclic lactone group, (meth)acrylate with an acid cleavable group corresponding to the repeating unit (d), an adhesion group having (meth)acrylate with a pendant hydroxy naphthyl group, and sulfonium salt with a polymerizable unsaturated bond as a base resin makes it possible to provide a positive resist composition with high sensitivity and high resolution which provides reduced Line Edge Roughness due to swelling during development, provides minor amounts of residue after development, and has excellent dry etching resistance. Thus, they have accomplished the present invention.

That is, a resist composition according to the present invention comprises, at least, a polymer including repeating units represented by the following general formulae (a) and (b),

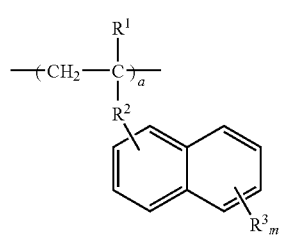

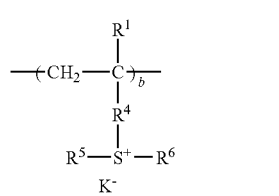

wherein $R^1$, which may be the same or different, represents a hydrogen atom or a methyl group;

$R^2$ represents any one of a single bond, —O—, —C(=O)—O—, and —C(=O)—NH—;

$R^3$ represents any one of a hydroxy group, a hydroxy group substituted with an acid labile group or an acetyl group, a carboxy group, and a carboxy group substituted with an acid labile group;

$R^4$ represents any one of a phenylene group, —O—$R^7$—, —C(=O)—$X^1$—$R^7$—, —C(=O)—O—$C_2H_4$—O—$Y^1$—, —C(=O)—O-$Z^1$-C(=O)—$CH_2$—, -$Z^1$-C(=O)—$CH_2$—, —C(=O)—O-$Z^1$-$CH_2$—, and —C(=O)—$X^1$—$R^7$-$Z^1$-;

$X^1$ represents an oxygen atom or NH;

$R^7$ represents a linear, branched or cyclic alkylene group having 1-6 carbon atoms which may contain a carbonyl group, an ester group or an ether group or an arylene group having 6-8 carbon atoms which may contain a carbonyl group, an ester group or an ether group;

$Y^1$ represents any one of a phenylene group, a naphthylene group, and an anthrylene group;

$Z^1$ represents a phenylene group;

$R^5$ and $R^6$, which may be the same or different, represent a linear, branched or cyclic alkyl group having 1-12 carbon atoms which may contain a carbonyl group, an ester group or an ether group, an aryl group having 6-12 carbon atoms, an aralkyl group having 7-20 carbon atoms or a thiophenyl group;

$R^5$ and $R^6$ can be linked to form a ring;

$K^-$ represents a non-nucleophilic counter ion;

m represents 1 or 2;

a satisfies $0<a<1.0$; and b satisfies $0<b\leq0.8$.

Such a resist composition according to the present invention, upon exposure to high energy beam, exhibits a high alkali dissolution-rate contrast before and after exposure, high sensitivity and high resolution, provids reduced Line Edge Roughness because swelling at the time of development is reduced, provides minor amounts of residue after development, and shows excellent etching resistance. Consequently, the resist composition with the above properties is highly practical, and is suitable for micropatterning material for the VLSI manufacture or for a photomask patterning.

Furthermore, because the repeating unit (a) is insoluble in water, application of a resist composition according to the present invention to the liquid immersion lithography hardly causes a problem that water infiltrates the resist and then the resist swells. Moreover, because acid generated from a polymeric acid generator represented by the repeating unit (b) is insoluble in water, deformation of pattern profiles is hardly observed even with water immersion exposure (liquid immersion exposure). Consequently, the resist composition according to the present invention can be suitably used for the liquid immersion lithography.

In the above case, it is preferable that the polymer further includes repeating units represented by the following general formulae (c) and/or (d),

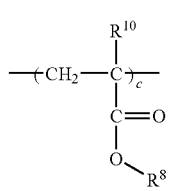

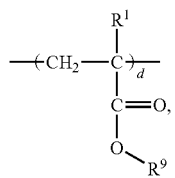
(d)

wherein $R^1$ represents a hydrogen atom or a methyl group;
$R^8$ represents an adhesion group with lactone;
$R^9$ represents an acid labile group;
$R^{10}$ represents any one of a hydrogen atom, a methyl group, and —$CH_2$—C(=O)—O—$CH_3$; and
c and d satisfies $0 \leq c \leq 0.8$, $0 \leq d \leq 0.8$, and $0 < c+d \leq 0.8$.

In this way, by further including the repeating units (c) and/or (d), the resist composition aquires desired hydrophilicity, alkali solubility, and adhesion property.

Next, examples of monomer a for obtaining the repeating unit represented by the above general formula (a) are shown below.

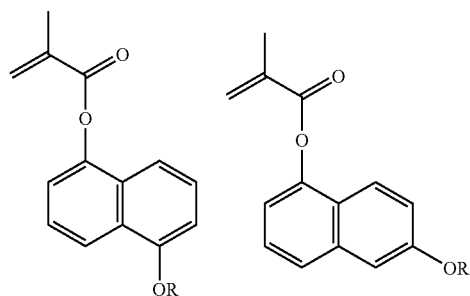

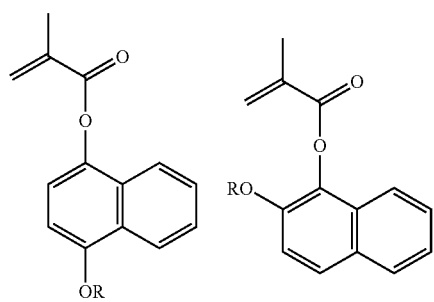

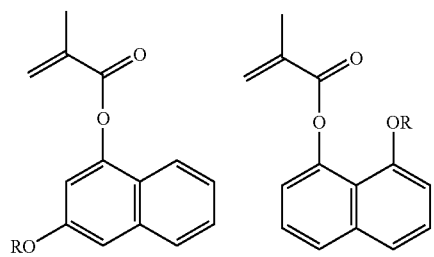

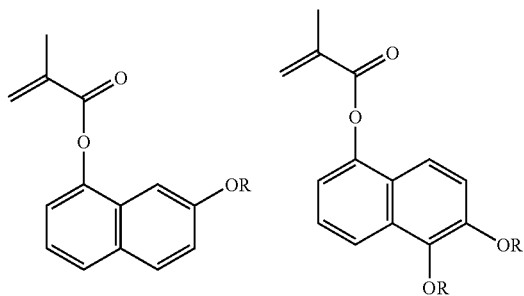

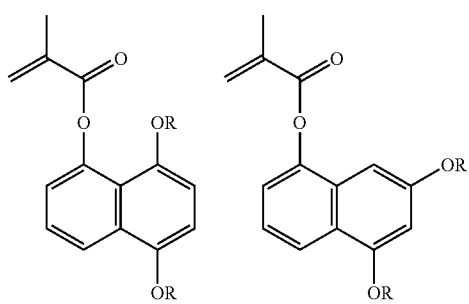

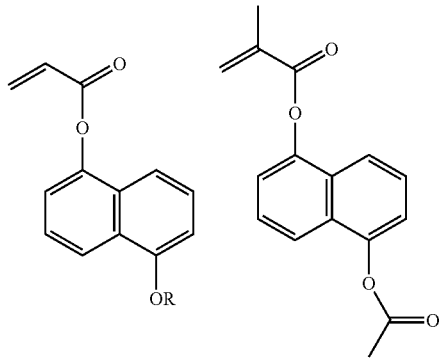

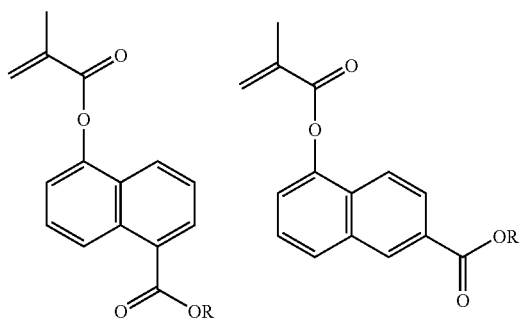

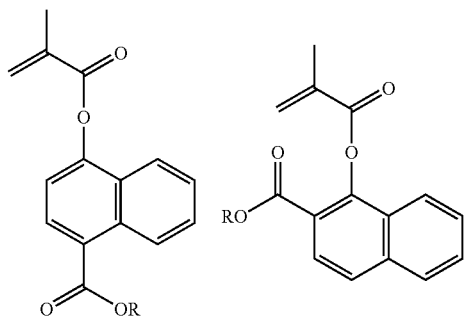

-continued
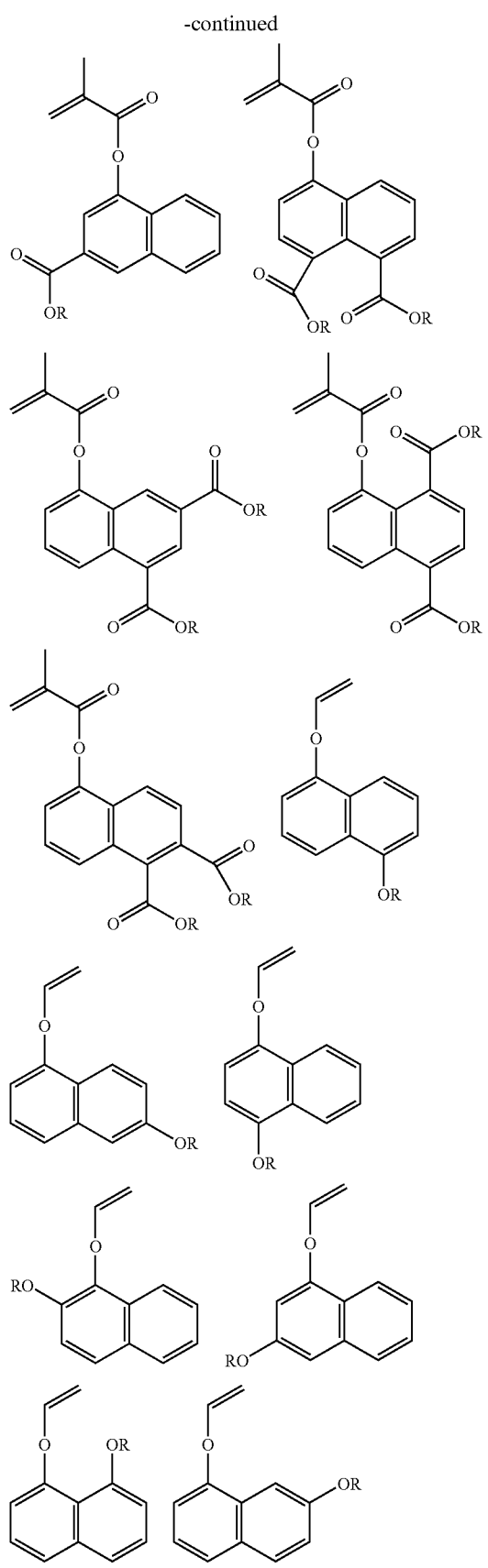
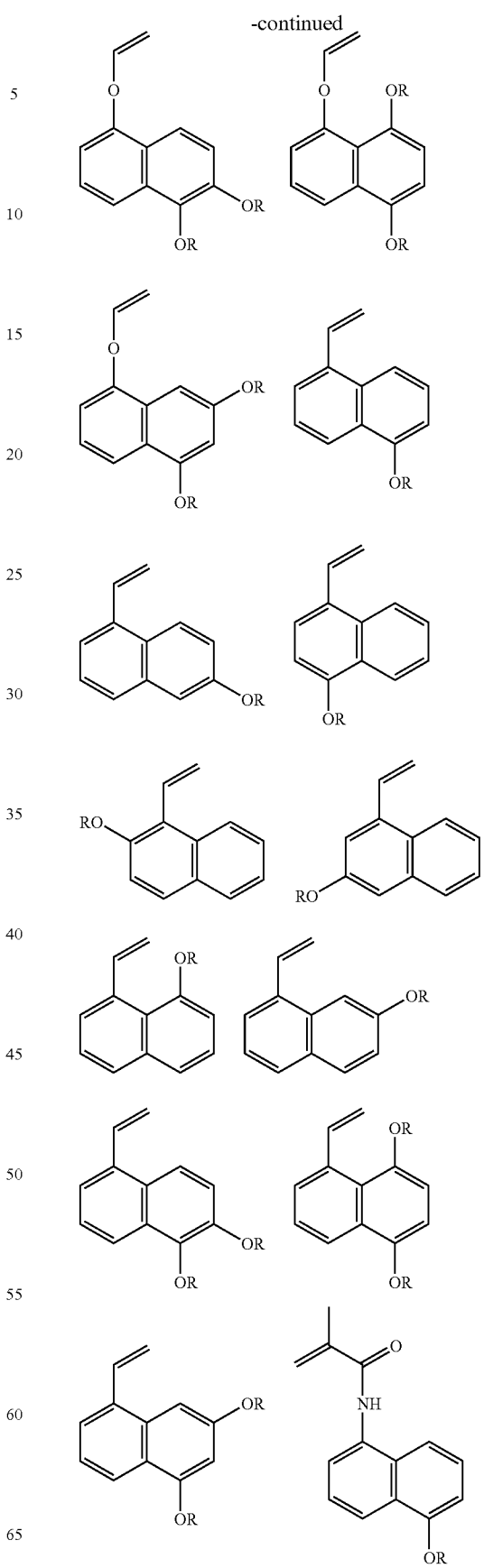

-continued

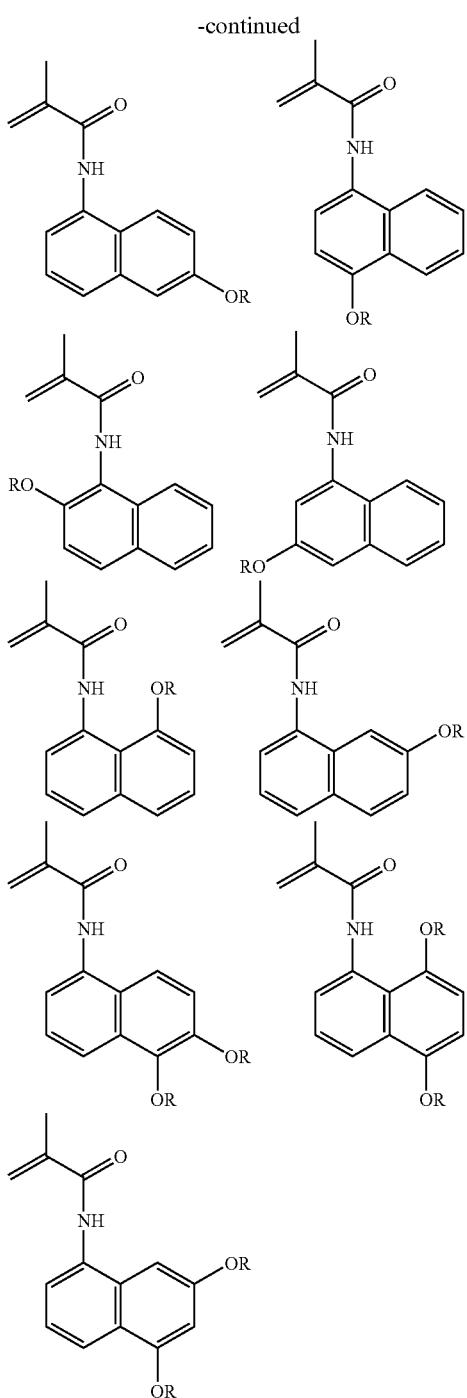

In the above formulae, R represents a hydrogen atom or an acid labile group. When a hydroxy group is substituted with an acetyl group, alkaline hydrolysis after polymerization can deprotect the acetyl group to give a hydroxy group. When a hydroxy group is substituted with an acid labile group such as acetal, acid catalytic hydrolysis can deprotect the acid labile group to give a hydroxy group. The deprotection after polymerization may optionally not be conducted.

The polymer according to the present invention is required to be obtained by copolymerizing the polymerizable unsaturated compound(s) with a naphthyl group corresponding to the above general formula (a), and the sulfonium salt(s) with a polymerizable unsaturated bond corresponding to the above general formula (b).

Examples of monomer b for obtaining the repeating unit represented by the above general formula (b) are shown below.

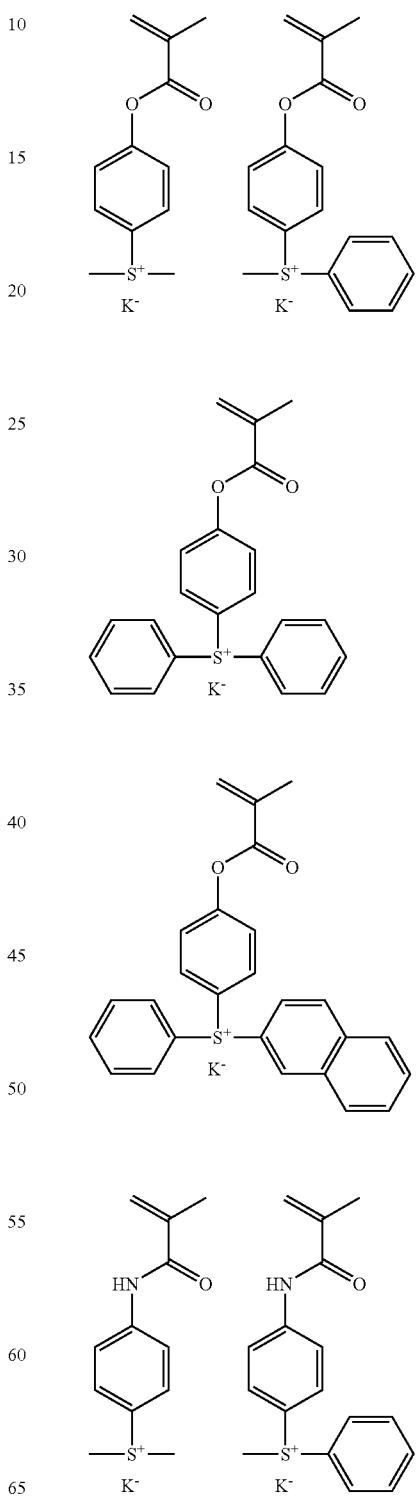

-continued
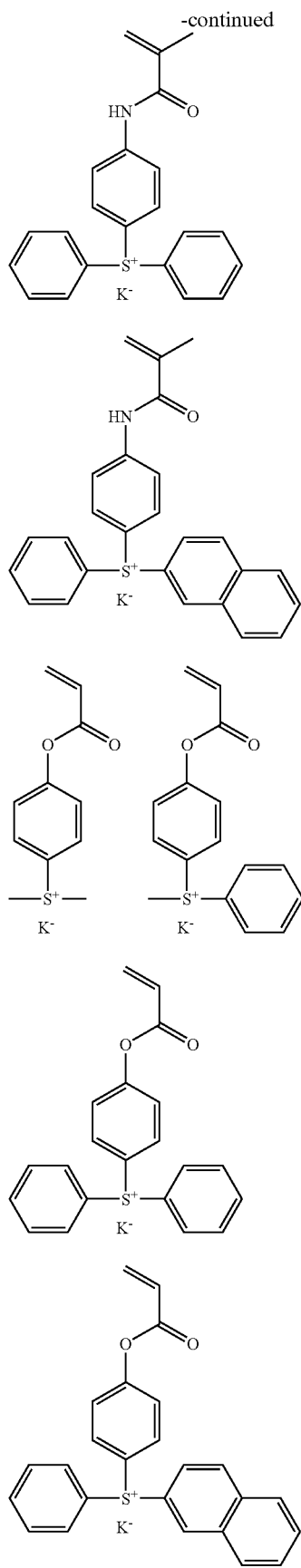
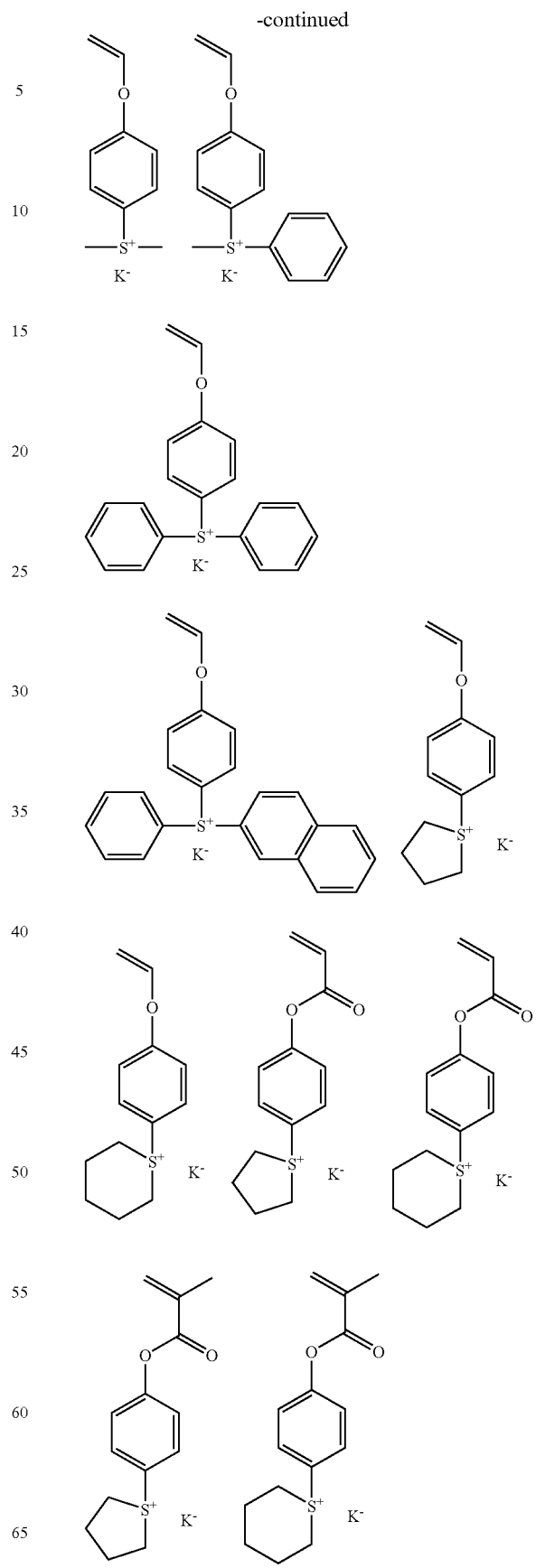

-continued
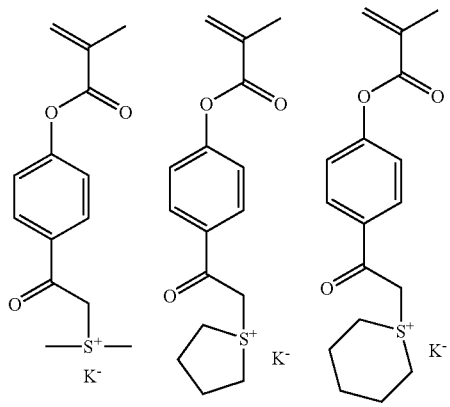
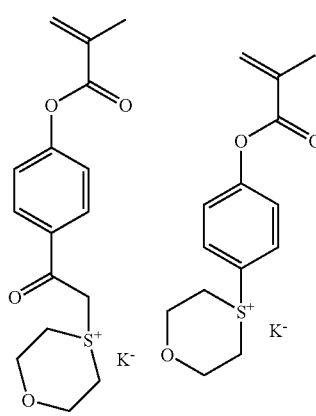
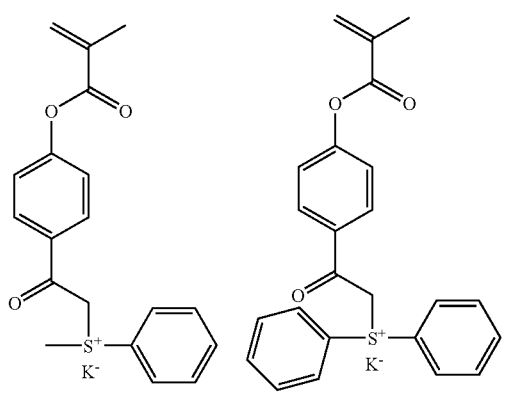
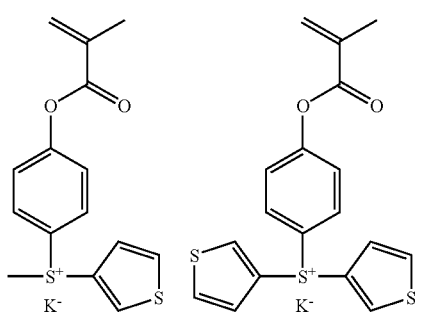
-continued
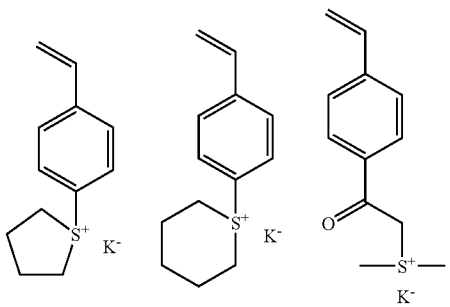
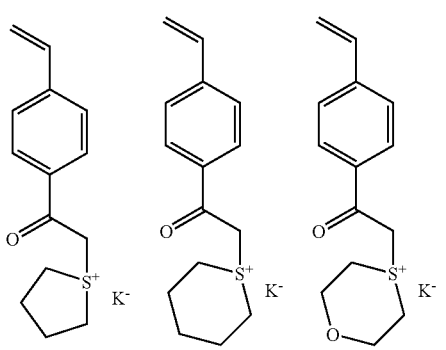
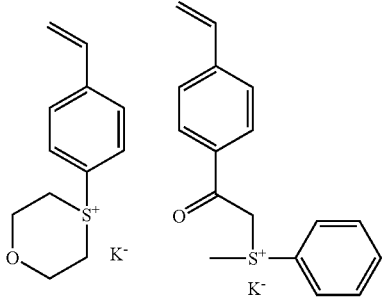
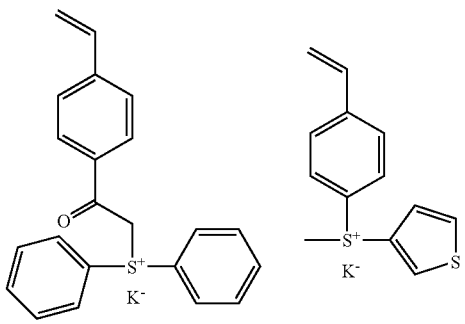
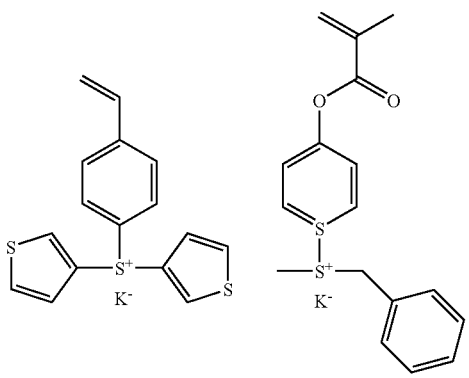

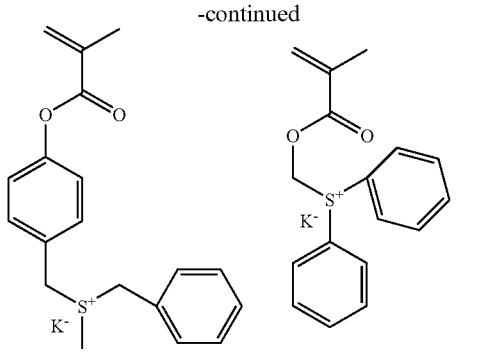
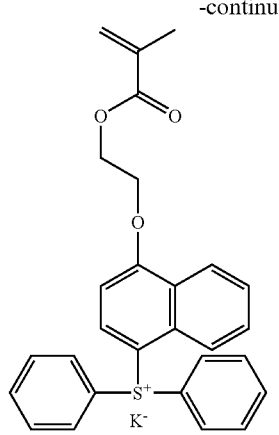
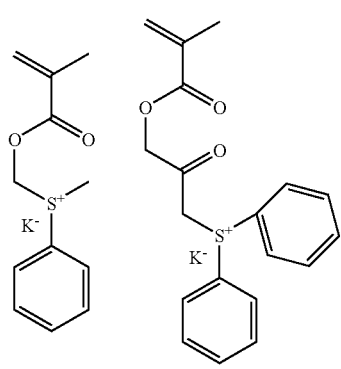
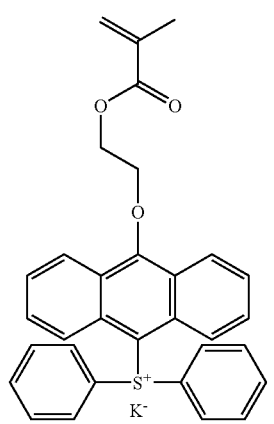
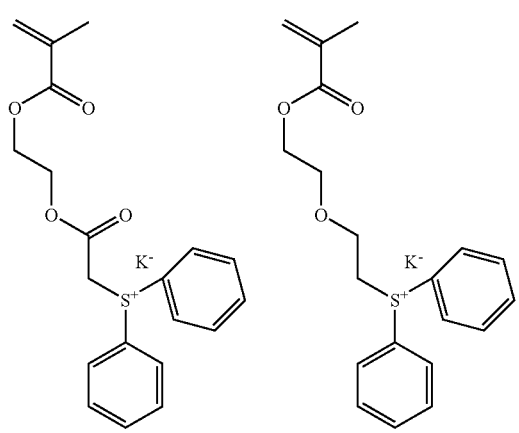
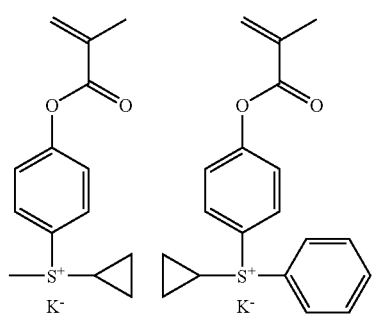
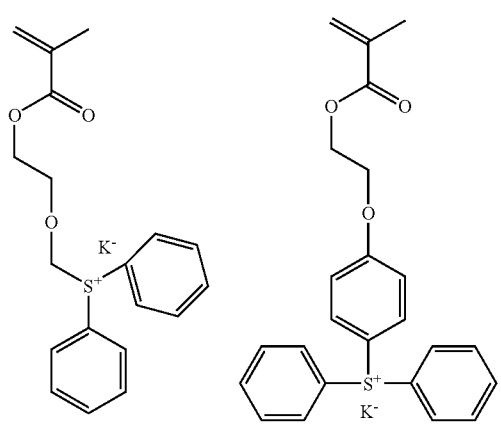
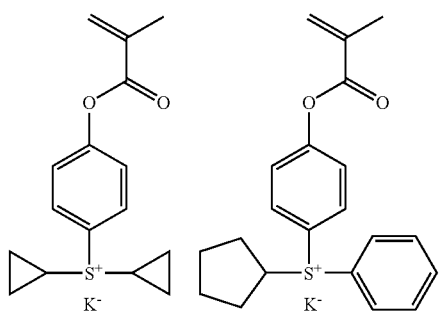

-continued

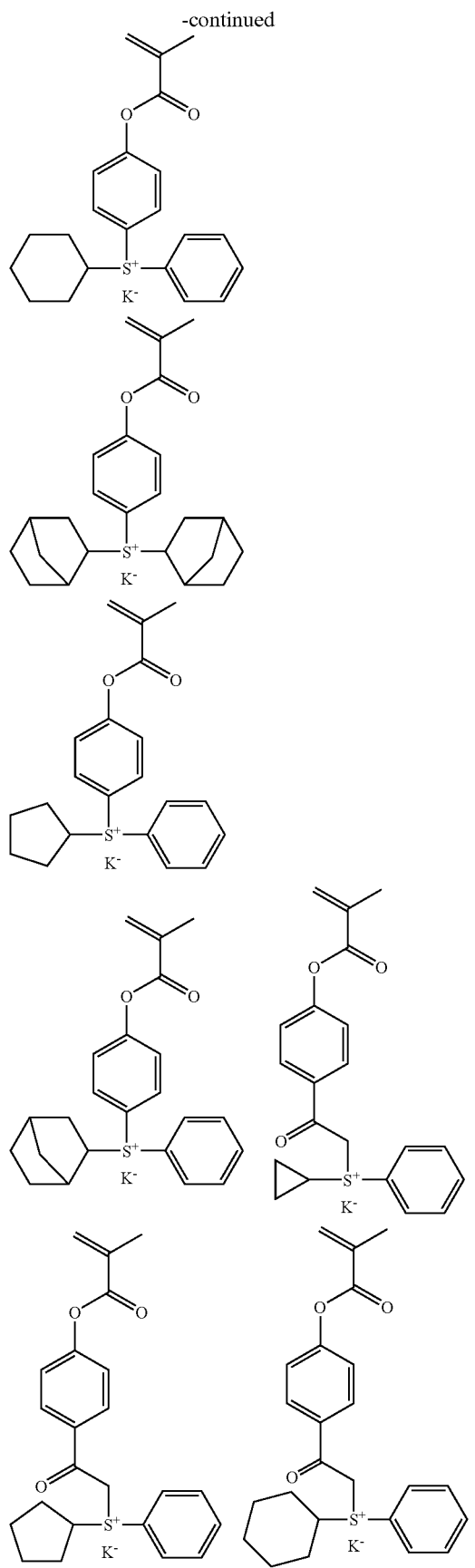
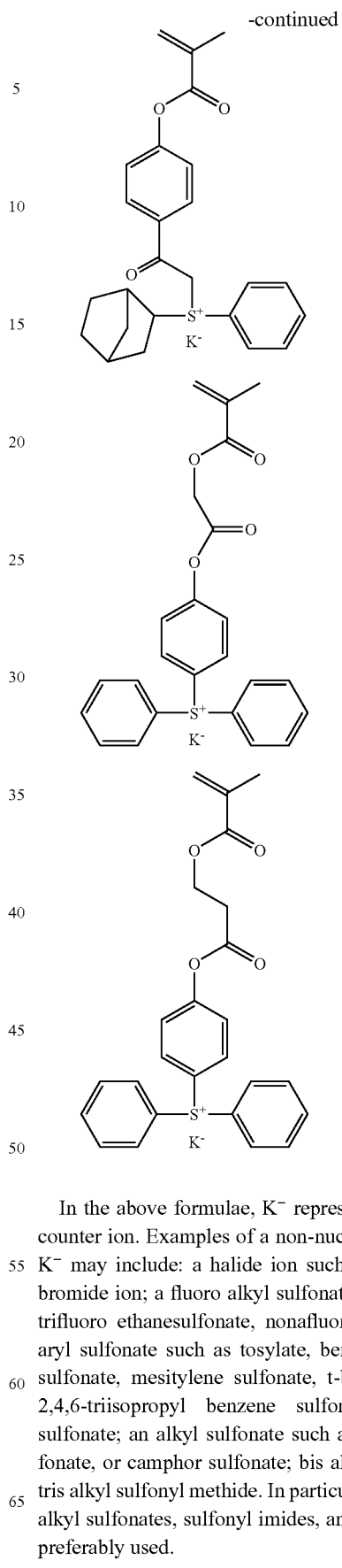

In the above formulae, K⁻ represents a non-nucleophilic counter ion. Examples of a non-nucleophilic counter ion as K⁻ may include: a halide ion such as a chloride ion or a bromide ion; a fluoro alkyl sulfonate such as triflate, 1,1,1-trifluoro ethanesulfonate, nonafluoro butane sulfonate; an aryl sulfonate such as tosylate, benzene sulfonate, xylene sulfonate, mesitylene sulfonate, t-butylbenzene sulfonate, 2,4,6-triisopropyl benzene sulfonate, or naphthalene-sulfonate; an alkyl sulfonate such as mesylate, butane sulfonate, or camphor sulfonate; bis alkyl sulfonyl imide, and tris alkyl sulfonyl methide. In particular, the following fluoro alkyl sulfonates, sulfonyl imides, and sulfonyl methides are preferably used.

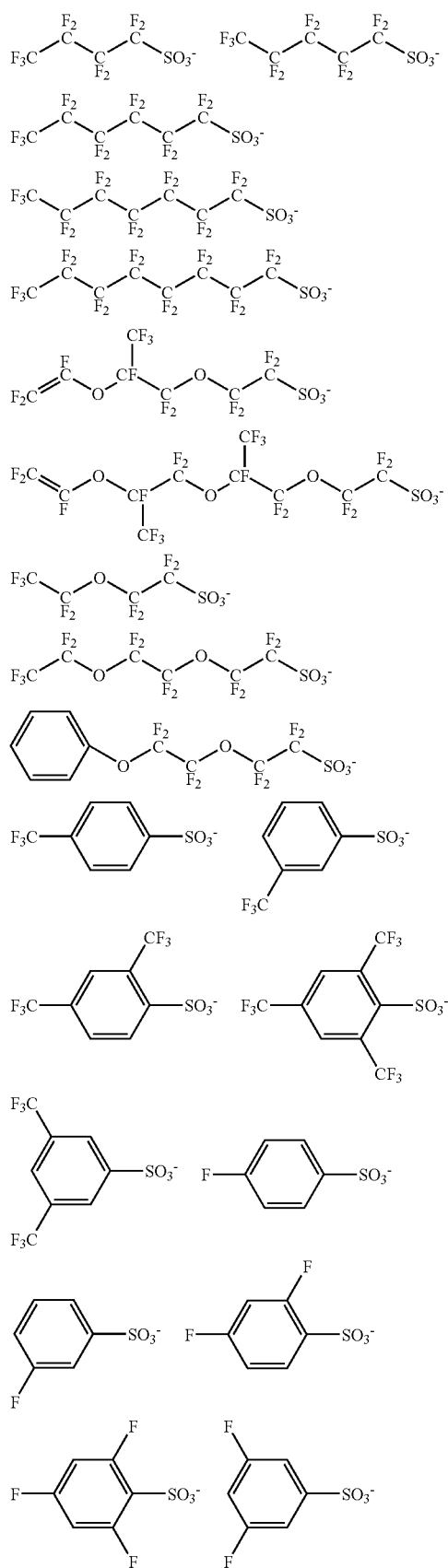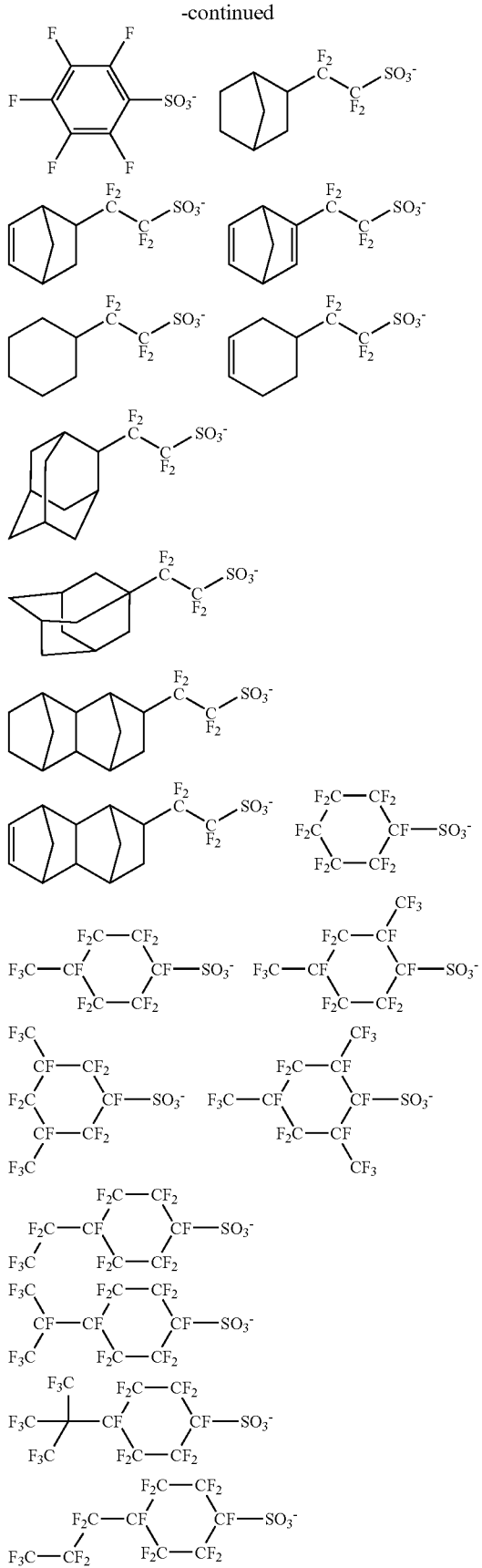

-continued
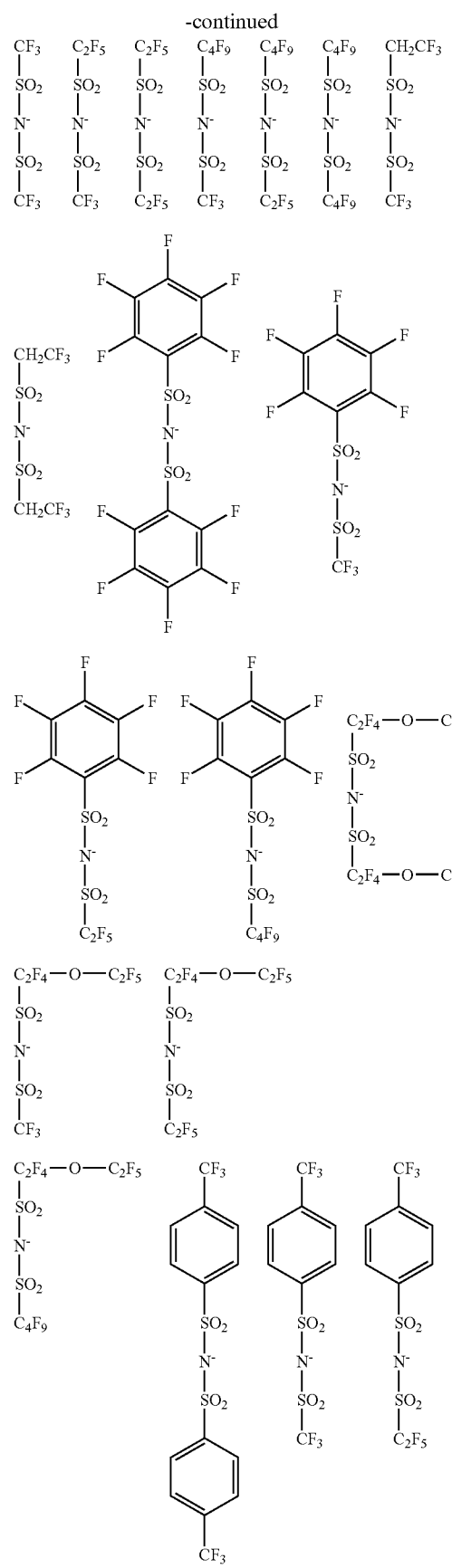
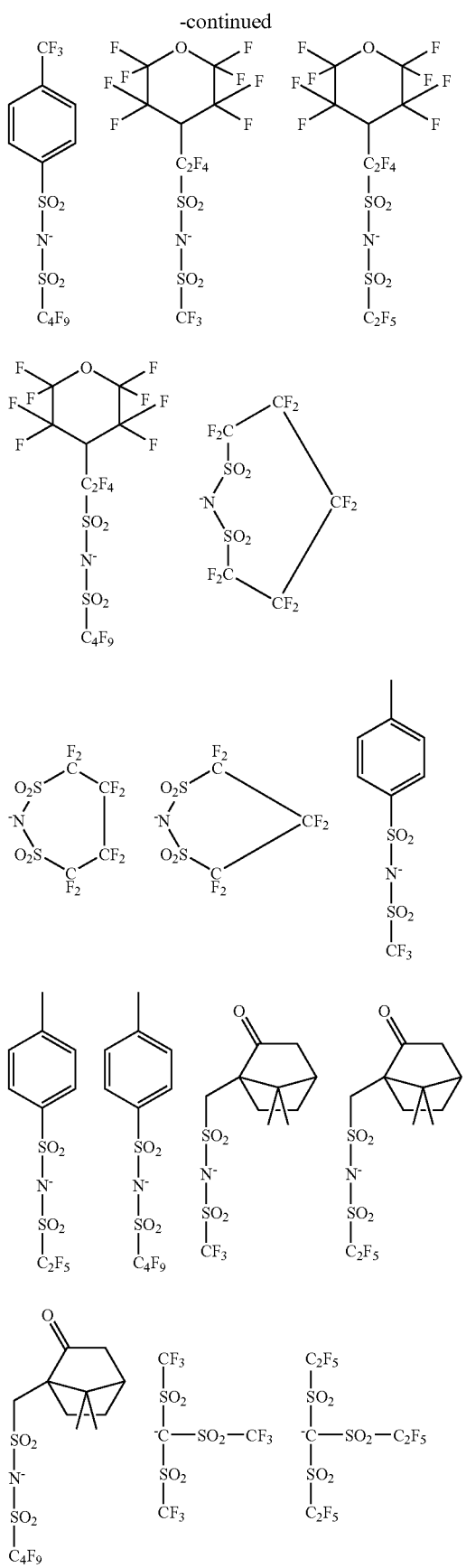

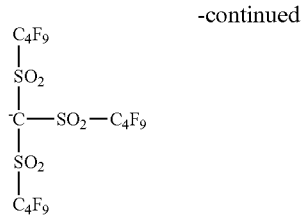

A synthetic process for obtaining methacrylate with pendant sulfonate as shown in the above examples of the monomer b is not particularly restricted. For example, the following method in which a sulfonate with a phenol group is reacted with chloride methacrylate as disclosed in Mat. Res. Soc. Symp. Proc. Vol. 636, D6. 5. 1 (2001) can be given.

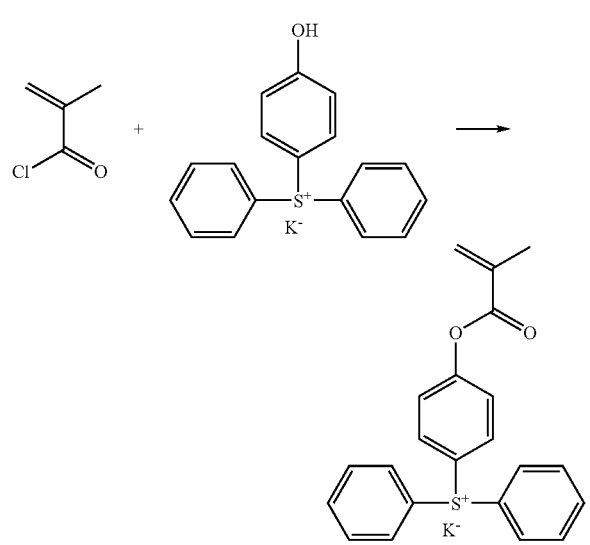

In the formula, K⁻ represents the same as explained above.

Next, examples of monomer c ((meth)acrylate with a lactone adhesion group) for obtaining the repeating unit represented by the above general formula (c) are shown below.

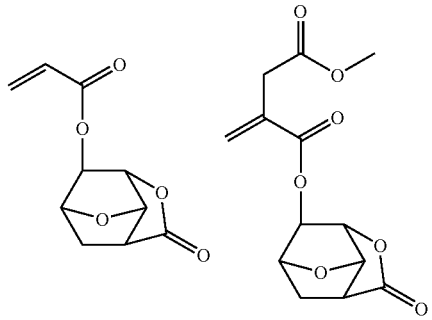

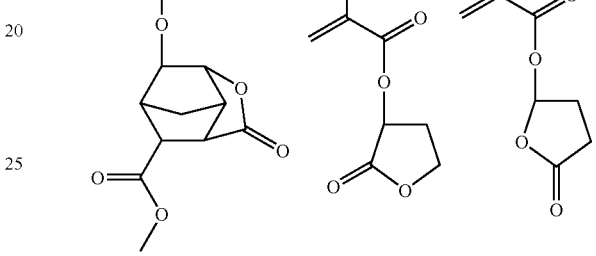

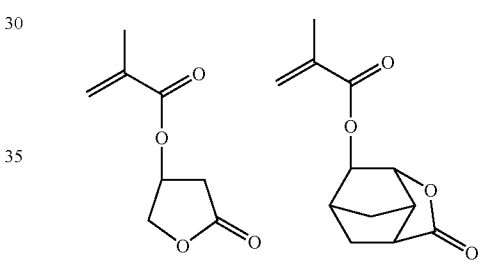

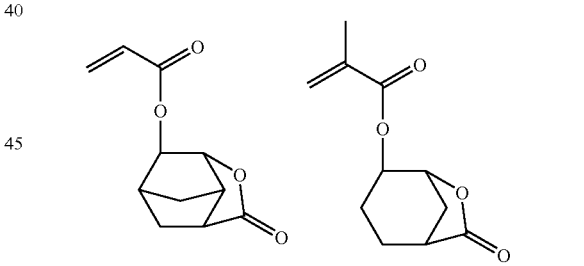

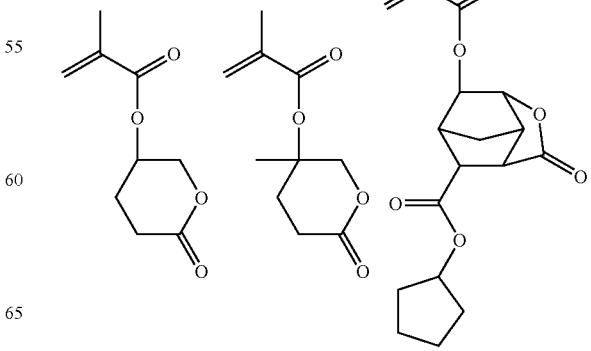

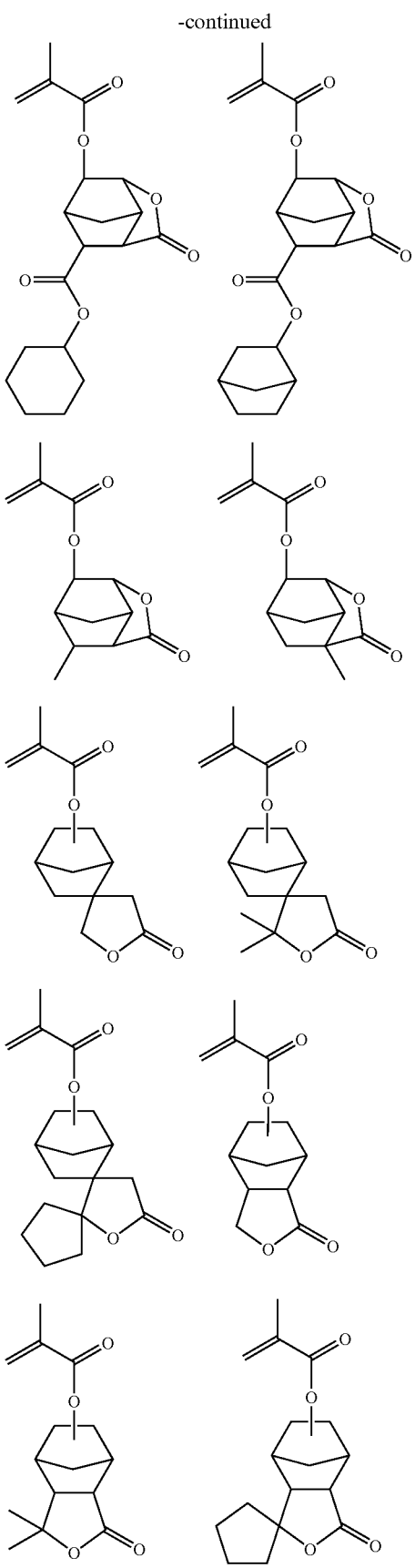

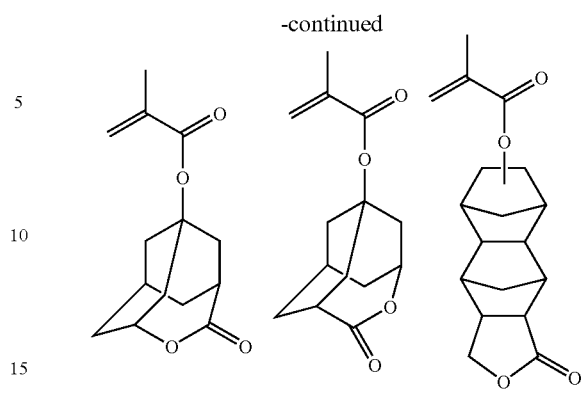

Next, an example of monomer d ((meth)acrylate with an acid labile group) for obtaining the repeating unit represented by the above general formula (d) is shown below.

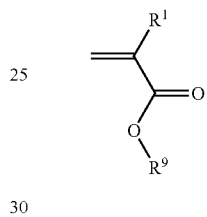

In the formula, $R^1$ represents the same as explained above; and $R^9$ represents an acid labile group.

In the above formulae, various acid labile groups can be selected as R and $R^9$. R may be the same or different. In particular, preferred acid labile groups has a structure in which a hydrogen atom of a hydroxy group or a hydroxy group of a carboxy group is substituted with a group represented by the following formulae (AL-10) or (AL-11), $C_{4-40}$ tertiary alkyl group represented by the following formulae (AL-12), $C_{4-20}$ oxoalkyl group, or the like.

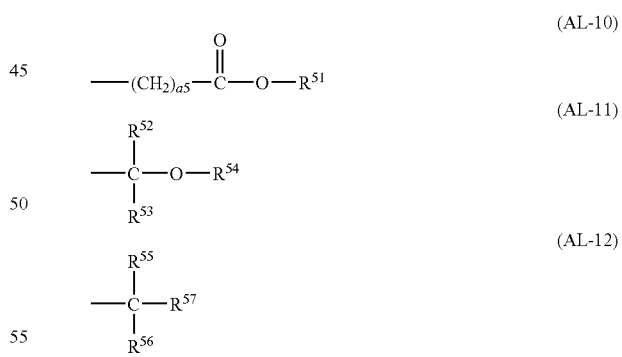

In the formulae (AL-10) and (AL-11), $R^{51}$ and $R^{54}$ represent a monovalent hydrocarbon group such as $C_{1-40}$, in particular $C_{1-20}$, linear, branched or cyclic alkyl group, which may contain hetero atom(s), such as oxygen, sulfur, nitrogen, or fluorine. $R^{52}$ and $R^{53}$ represent a hydrogen atom, or a monovalent hydrocarbon group such as $C_{1-20}$, linear, branched or cyclic alkyl group, which may contain hetero atom(s), such as oxygen, sulfur, nitrogen, or fluorine. a5 is an integer of 0-10. $R^{52}$ and $R^{53}$, $R^{52}$ and $R^{54}$, $R^{53}$ and $R^{54}$ may bond to each other to form a $C_{3-20}$, in particular $C_{4-16}$, ring with the carbon atom or the carbon atom and the oxygen to which $R^{52}$, $R^{53}$, and $R^{54}$ bond.

$R^{55}$, $R^{56}$ and $R^{57}$ independently represent a monovalent hydrocarbon group such as $C_{1-20}$, linear, branched or cyclic alkyl group, which may contain hetero atom(s), such as oxygen, sulfur, nitrogen, or fluorine. $R^{55}$ and $R^{56}$, $R^{55}$ and $R^{57}$, $R^{56}$ and $R^{57}$ may bond to each other to form a $C_{3-20}$, in particular $C_{4-16}$, ring with the carbon atom to which $R^{55}$, $R^{56}$, and $R^{57}$ bond.

Illustrative examples of the compound represented by the formula (AL-10) may include: tert-butoxy carbonyl group, tert-butoxy carbonyl methyl group, tert-amyloxy carbonyl group, tert-amyloxy carbonyl methyl group, 1-ethoxy ethoxy carbonyl methyl group, 2-tetrahydropyranyl oxy-carbonyl methyl group, 2-tetrahydrofuranyl oxy-carbonyl methyl group, and the like, and further the substituents represented by the following general formulae (AL-10)-1 to (AL-10)-10.

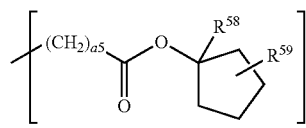
(AL-10)-1

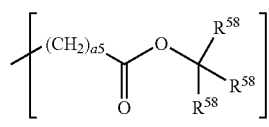
(AL-10)-2

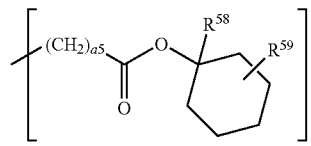
(AL-10)-1-3

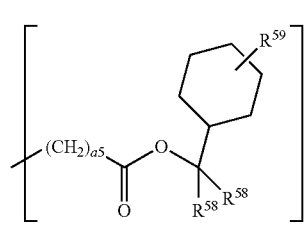
(AL-10)-4

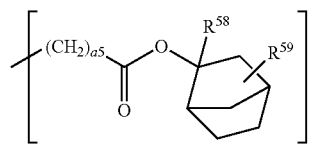
(AL-10)-5

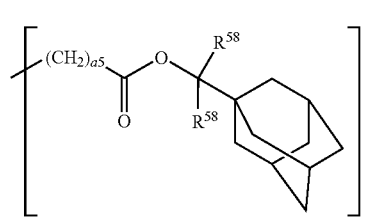
(AL-10)-6

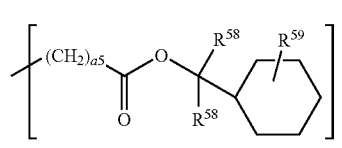
(AL-10)-7

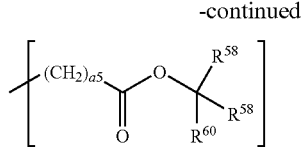
(AL-10)-8

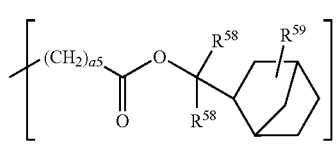
(AL-10)-9

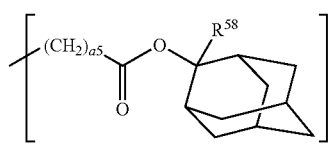
(AL-10)-10

In the formulae (AL-10)-1 to (AL-10)-10, $R^{58}$ may be the same or different, and represents a linear, branched or cyclic alkyl group having 1-8 carbon atoms, an aryl group having 6-20 carbon atoms or an aralkyl group having 7-20 carbon atoms. $R^{59}$ represents a hydrogen atom, or a linear, branched or cyclic alkyl group having 1-20 carbon atoms. $R^{60}$ represents an aryl group having 6-20 carbon atoms or an aralkyl group having 7-20 carbon atoms. a5 represents the same as explained above.

Examples of an acetal compound represented by the formula (AL-11) may include those represented by the formulae (AL-11)-1 to (AL-11)-34.

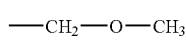
(AL-11)-1

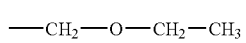
(AL-11)-2

(AL-11)-3

(AL-11)-4

(AL-11)-5

(AL-11)-6

(AL-11)-7

(AL-11)-8

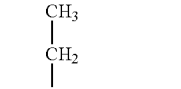
(AL-11)-9

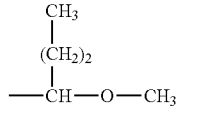
(AL-11)-10

-continued
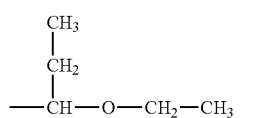 (AL-11)-11
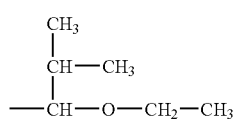 (AL-11)-12
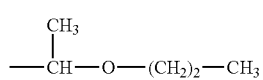 (AL-11)-13
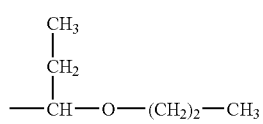 (AL-11)-14
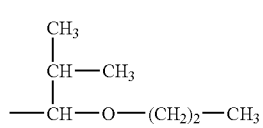 (AL-11)-15
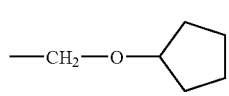 (AL-11)-16
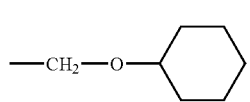 (AL-11)-17
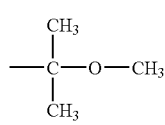 (AL-11)-18
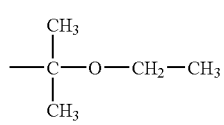 (AL-11)-19
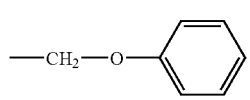 (AL-11)-20
 (AL-11)-21
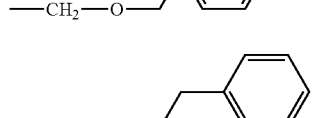 (AL-11)-22
 (AL-11)-23
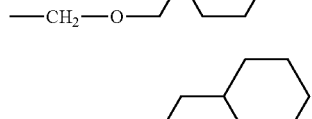 (AL-11)-24
-continued
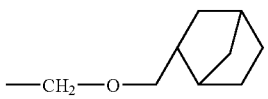 (AL-11)-25
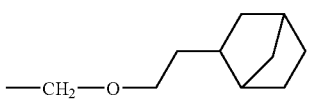 (AL-11)-26
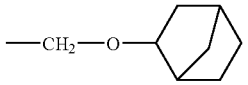 (AL-11)-27
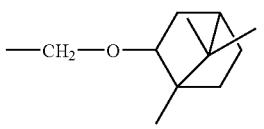 (AL-11)-28
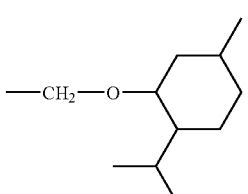 (AL-11)-29
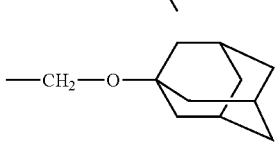 (AL-11)-30
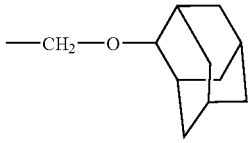 (AL-11)-31
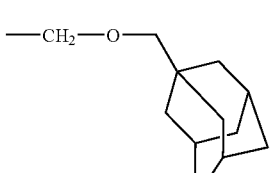 (AL-11)-32
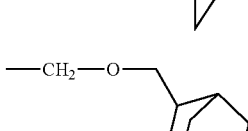 (AL-11)-33
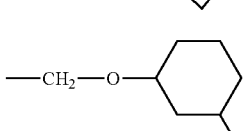 (AL-11)-34
By the way, an acid labile group represented by the following general formulae (AL-11a) or (AL-11b) may optionally crosslink the base resin intermolecularly or intramolecularly.

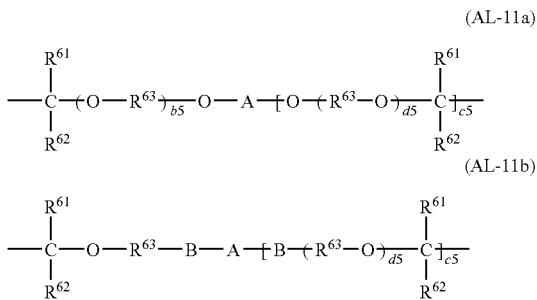
(AL-11a)
(AL-11b)

In these formulae, $R^{61}$ and $R^{62}$ represent a hydrogen atom, a linear, branched or cyclic alkyl group having 1-8 carbon hydroxyl group, a carboxyl group, a carbonyl group or a fluorine atom. B represents —CO—O—, —NHCO—O— or —NHCONH—.

In this case, A preferably represents a linear, branched or cyclic alkylene group, an alkyl-tri-yl group or an alkyl-tetra-yl group having 1-20 carbon atoms, or an arylene group having 6-30 carbon atoms. These groups may be bonded via a hetero atom such as O, S, or N, and hydrogen atoms bonded to a carbon atom of these groups may partially be substituted with a hydroxyl group, a carboxyl group, an acyl group or a halogen atom. c5 preferably represents an integer of 1 to 3.

Illustrative examples of the crosslinked acetal groups represented by the general formulae (AL-11a) and (AL-11b) may include those represented by the following formulae (AL-11)-35 to (AL-11)-42.

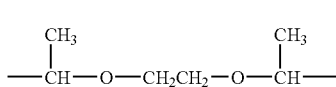
(AL-11)-35

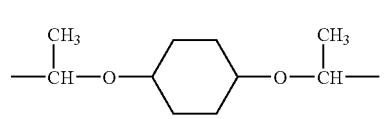
(AL-11)-36

(AL-11)-37

(AL-11)-38

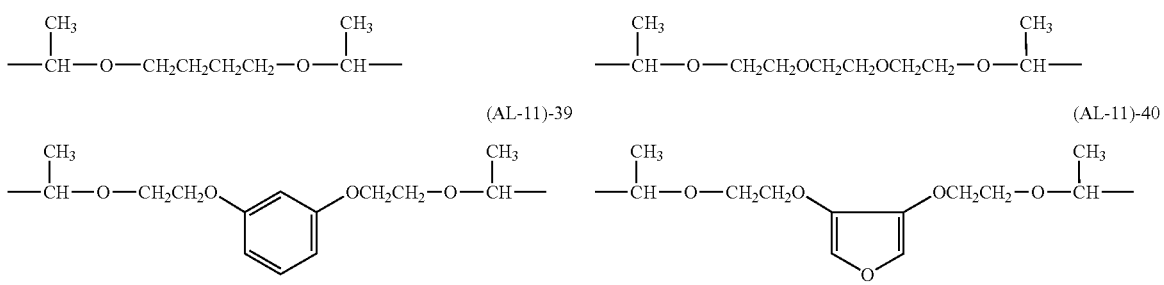
(AL-11)-39

(AL-11)-40

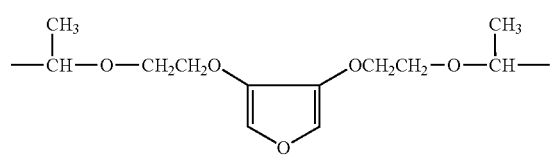

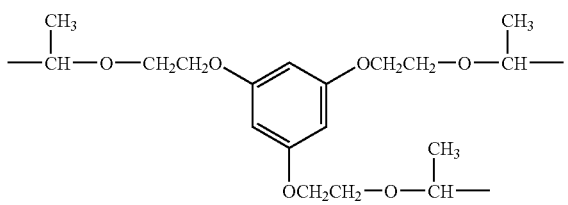
(AL-11)-41

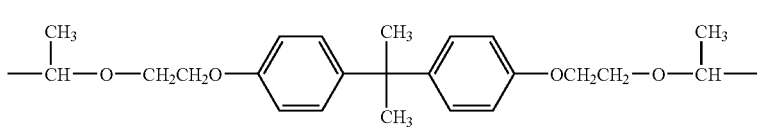
(AL-11)-42 atoms. Alternatively, $R^{61}$ and $R^{62}$ may bond to each other to form a ring with the carbon atom to which $R^{61}$ and $R^{62}$ bond. In the case that $R^{61}$ and $R^{62}$ form a ring, $R^{61}$ and $R^{62}$ represent a linear or branched alkylene group having 1-8 carbon atoms. $R^{63}$ represents a linear, branched or cyclic alkylene group having 1-10 carbon atoms. b5 and d5 represent an integer of 0 or 1 to 10, preferably an integer of 0 or 1 to 5. c5 represents an integer of 1 to 7. A represents an aliphatic or alicyclic saturated hydrocarbon group, an aromatic hydrocarbon group or a heterocyclic group of (c5+1) valence having 1 to 50 carbon atoms. These groups may be bonded via a hetero atom such as O, S, or N, and hydrogen atoms bonded to a carbon atom of these groups may partially be substituted with a Examples of the tertiary alkyl group shown in the formula (AL-12) may include: tert-butyl group, triethyl carbyl group, 1-ethyl norbornyl group, 1-methyl cyclohexyl group, 1-ethyl cyclopentyl group, tert-amyl group or the like, or those represented by the following general formulae (AL-12)-1 to (AL-12)-16.

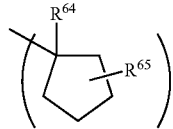
(AL-12)-1

-continued

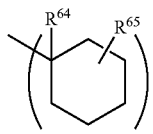

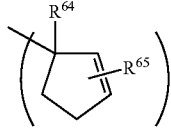

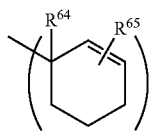

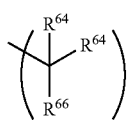

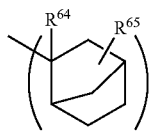

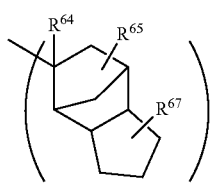

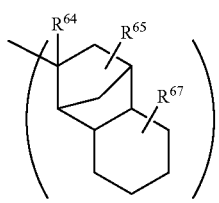

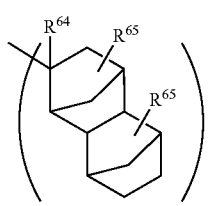

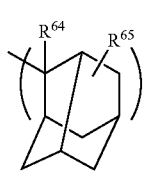

(AL-12)-2

(AL-12)-3

(AL-12)-4

(AL-12)-5

(AL-12)-6

(AL-12)-7

(AL-12)-8

(AL-12)-9

(AL-12)-10

-continued

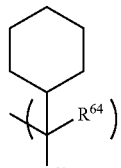
(AL-12)-11

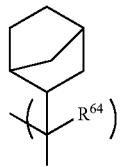
(AL-12)-12

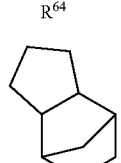
(AL-12)-13

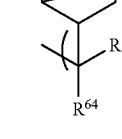
(AL-12)-14

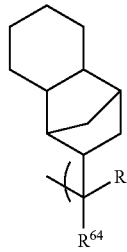
(AL-12)-15

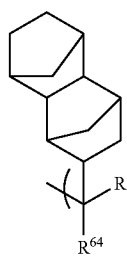
(AL-12)-16

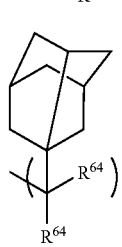

In these formulae, $R^{64}$ may be the same or different, represents a linear, branched or cyclic alkyl group having 1-8 carbon atoms, an aryl group having 6-20 carbon atoms or aralkyl group having 7-20 carbon atoms. $R^{65}$ and $R^{67}$ represent a hydrogen atom, or a linear, branched or cyclic alkyl group having 1-20 carbon atoms. $R^{66}$ represents an aryl group having 6-20 carbon atoms or an aralkyl group having 7-20 carbon atoms.

Furthermore as shown in (AL-12)-17 and (AL-12)-18, the polymer may be crosslinked intermolecularly or intramolecularly with including $R^{68}$ which is an alkylene group or arylene group of two or more valences. $R^{64}$ in the formulae (AL-12)-17 and (AL-12)-18 represents the same as mentioned above. $R^{68}$ represents a linear, branched or cyclic alkylene group or arylene group having 1-20 carbon atoms, and may contain hetero atom(s) such as an oxygen atom, a sulfur atom, or a nitrogen atom. b6 is an integer of 1-3.

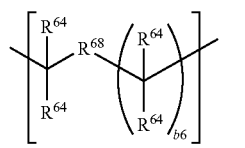

(AL-12)-17

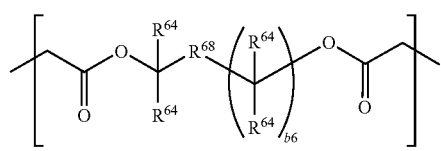

(AL-12)-18

Furthermore, $R^{64}$, $R^{65}$, $R^{66}$ and $R^{67}$ may have hetero atom(s), such as oxygen, nitrogen, or sulfur. Examples of $R^{64}$, $R^{65}$, $R^{66}$, and $R^{67}$ may include the following formulae (AL-13)-1 to (AL-13)-7.

 (AL-13)-1

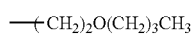 (AL-13)-2

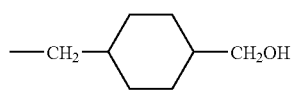 (AL-13)-3

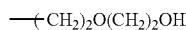 (AL-13)-4

 (AL-13)-5

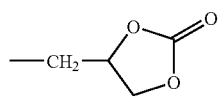 (AL-13)-6

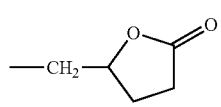 (AL-13)-7

In particular, an acid labile group of the formula (AL-12) has preferably exo-form structure represented by the following formula (AL-12)-19.

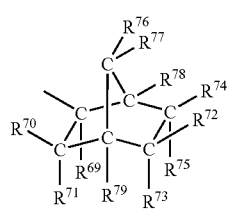

(AL-12)-19

In the formula, $R^{69}$ represents a $C_{1-8}$ linear, branched or cyclic alkyl group, or a $C_{6-20}$ aryl group which may optionally be substituted. $R^{70}$ to $R^{75}$, $R^{78}$ and $R^{79}$ independently represent a hydrogen atom, or a $C_{1-15}$ monovalent hydrocarbon group which may contain hetero atom(s). $R^{76}$ represents a hydrogen atom. Alternatively, $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ can be linked to form a ring. When the ring is formed, $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ represent a $C_{1-15}$ divalent hydrocarbon group which may contain hetero atom(s). $R^{70}$ and $R^{79}$, $R^{76}$ and $R^{79}$, and $R^{72}$ and $R^{74}$, which are bonded to the adjacent carbon atoms respectively, can be linked directly to form a double bond. $R^{77}$ represents a hydrogen atom, or a $C_{1-15}$ linear, branched or cyclic alkyl group which may contain hetero atom(s). The formula (AL-12)-19 also represents its enantiomer.

A repeating unit with the exo-form structure represented by the formula (AL-12)-19 is shown below.

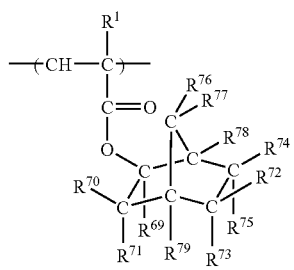

In the formula, $R^1$, $R^{69}$ to $R^{70}$ represents the same as explained above. The formula also represents its enantiomer.

Ester monomers for obtaining the repeating unit with the exo-form structure are disclosed in Japanese Publication of Unexamined Application No. 2000-327633. Examples of the monomer are shown below, but the monomer is not restricted thereto.

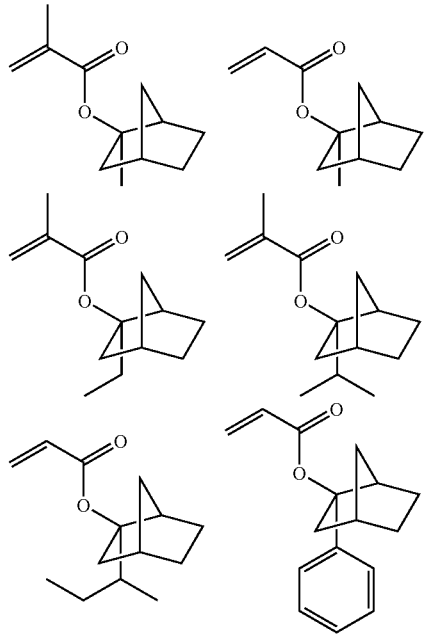

-continued

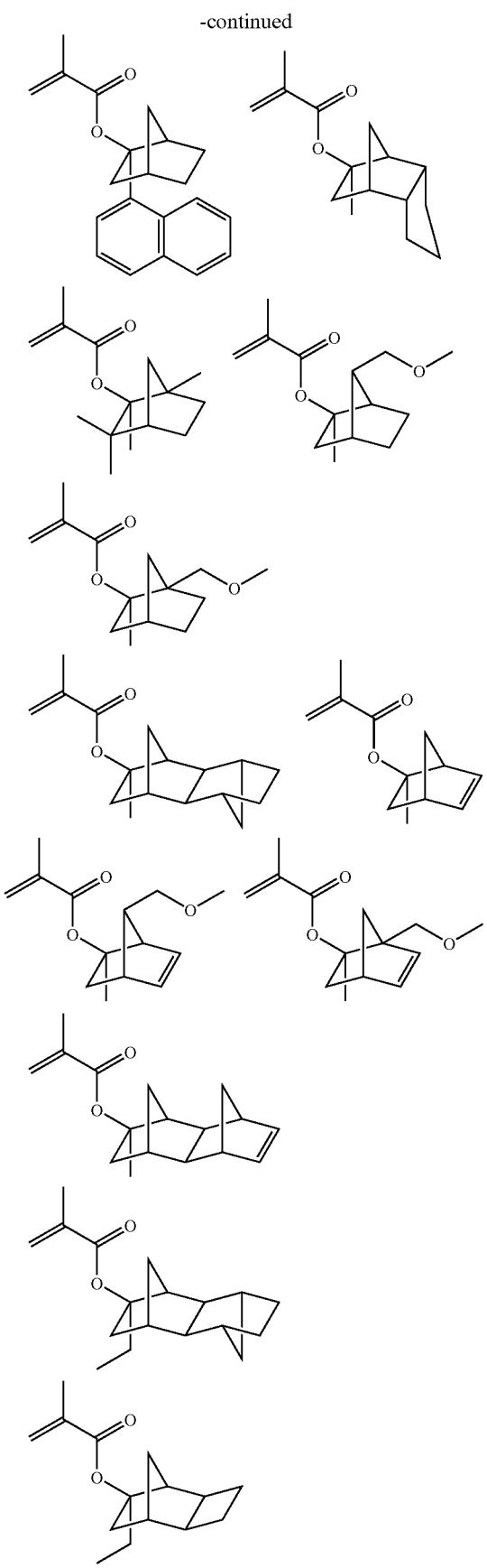

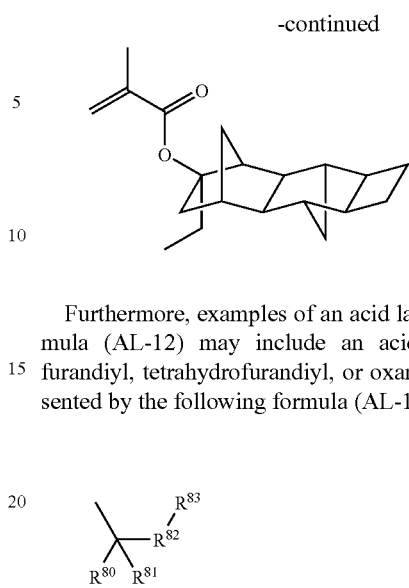

Furthermore, examples of an acid labile group of the formula (AL-12) may include an acid labile group with furandiyl, tetrahydrofurandiyl, or oxanorbornanediyl represented by the following formula (AL-12)-20.

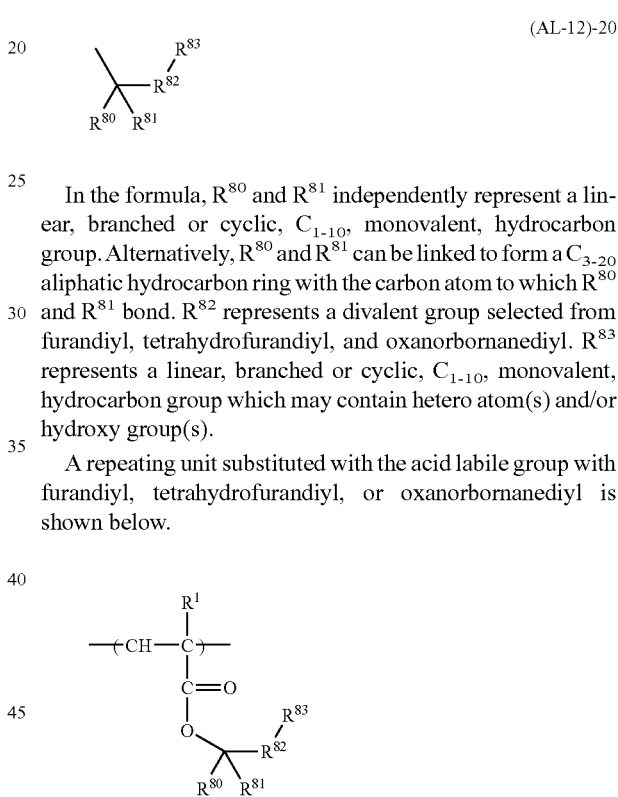

(AL-12)-20

In the formula, $R^{80}$ and $R^{81}$ independently represent a linear, branched or cyclic, $C_{1-10}$, monovalent, hydrocarbon group. Alternatively, $R^{80}$ and $R^{81}$ can be linked to form a $C_{3-20}$ aliphatic hydrocarbon ring with the carbon atom to which $R^{80}$ and $R^{81}$ bond. $R^{82}$ represents a divalent group selected from furandiyl, tetrahydrofurandiyl, and oxanorbornanediyl. $R^{83}$ represents a linear, branched or cyclic, $C_{1-10}$, monovalent, hydrocarbon group which may contain hetero atom(s) and/or hydroxy group(s).

A repeating unit substituted with the acid labile group with furandiyl, tetrahydrofurandiyl, or oxanorbornanediyl is shown below.

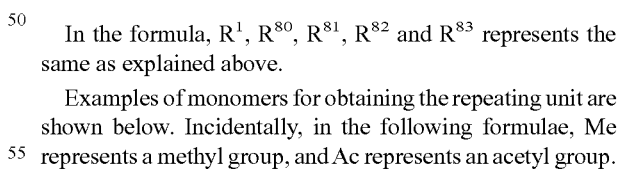

In the formula, $R^1$, $R^{80}$, $R^{81}$, $R^{82}$ and $R^{83}$ represents the same as explained above.

Examples of monomers for obtaining the repeating unit are shown below. Incidentally, in the following formulae, Me represents a methyl group, and Ac represents an acetyl group.

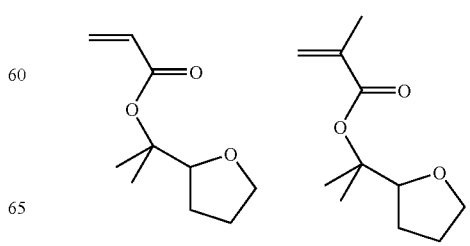

-continued
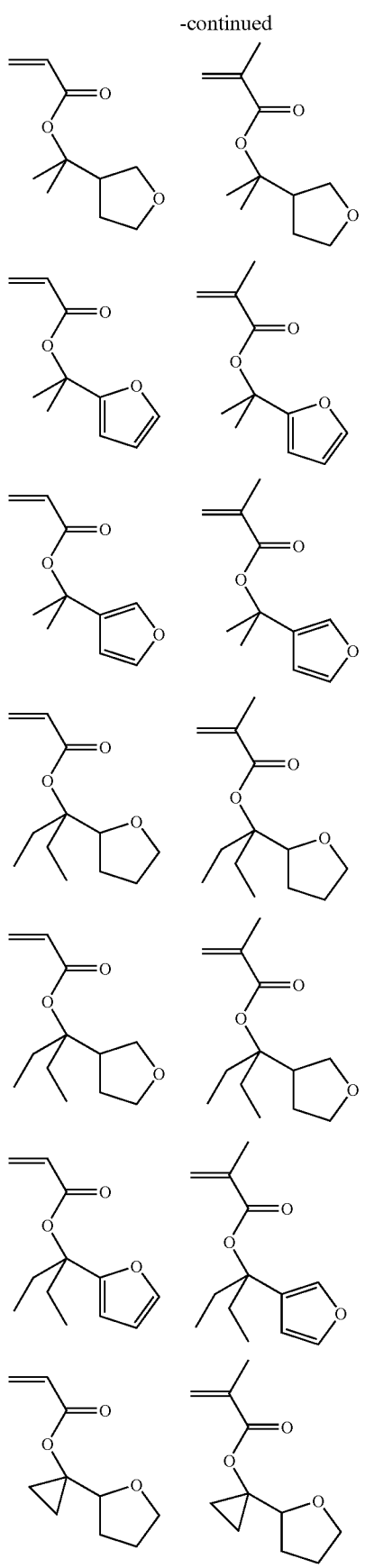
-continued
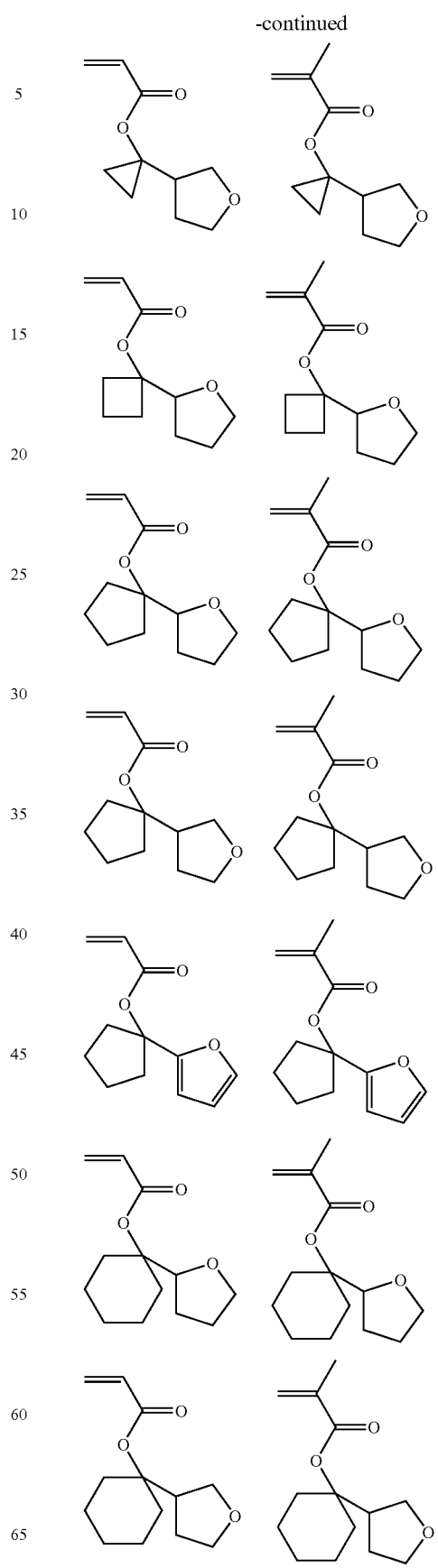

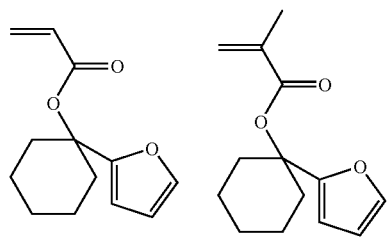
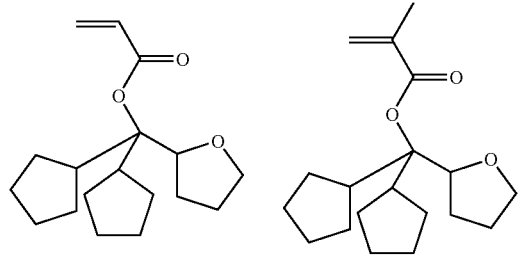
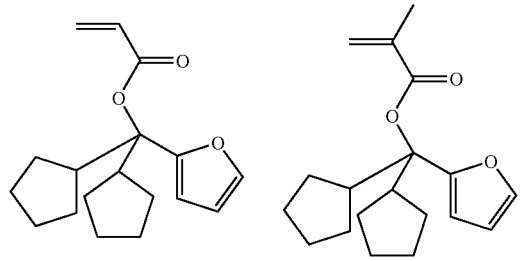
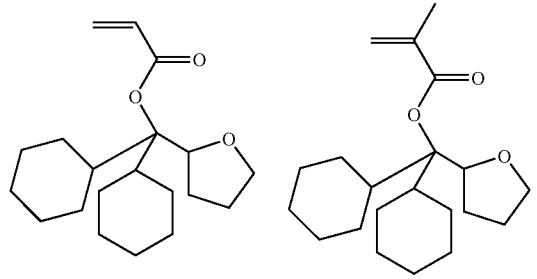
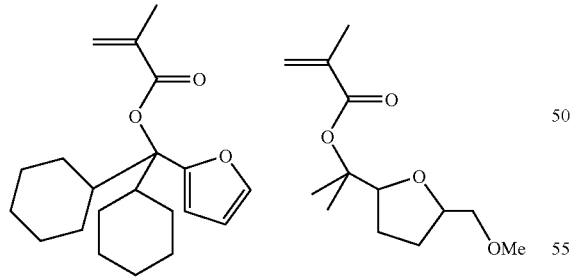
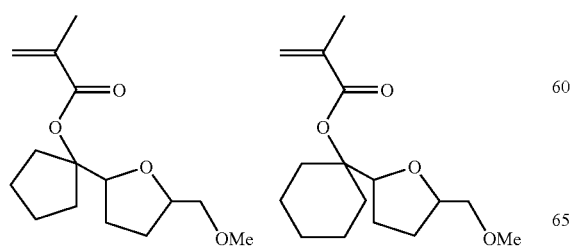
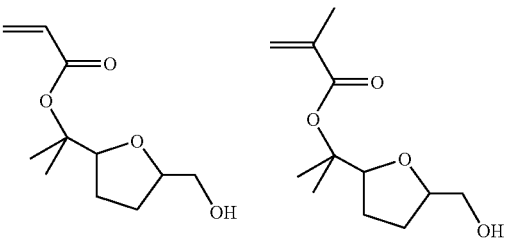
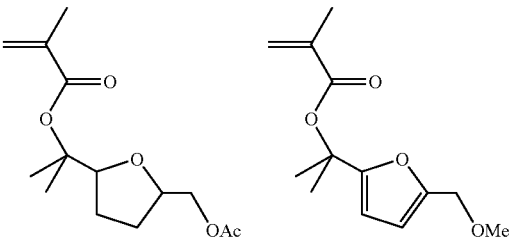
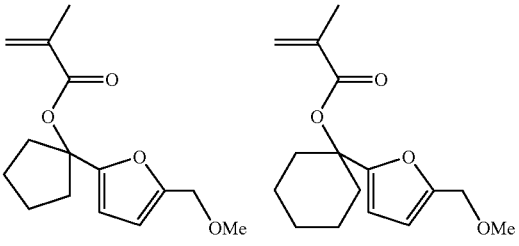
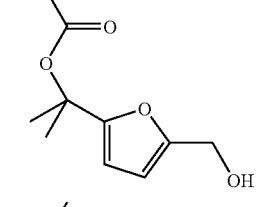
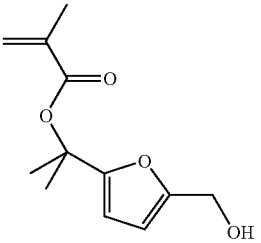
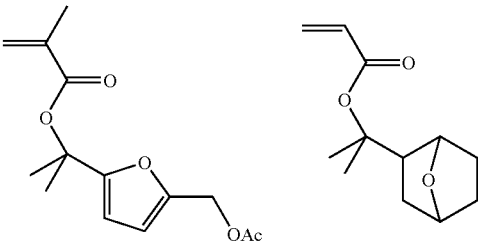
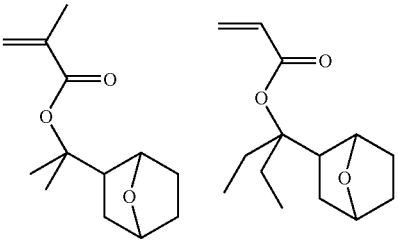

-continued
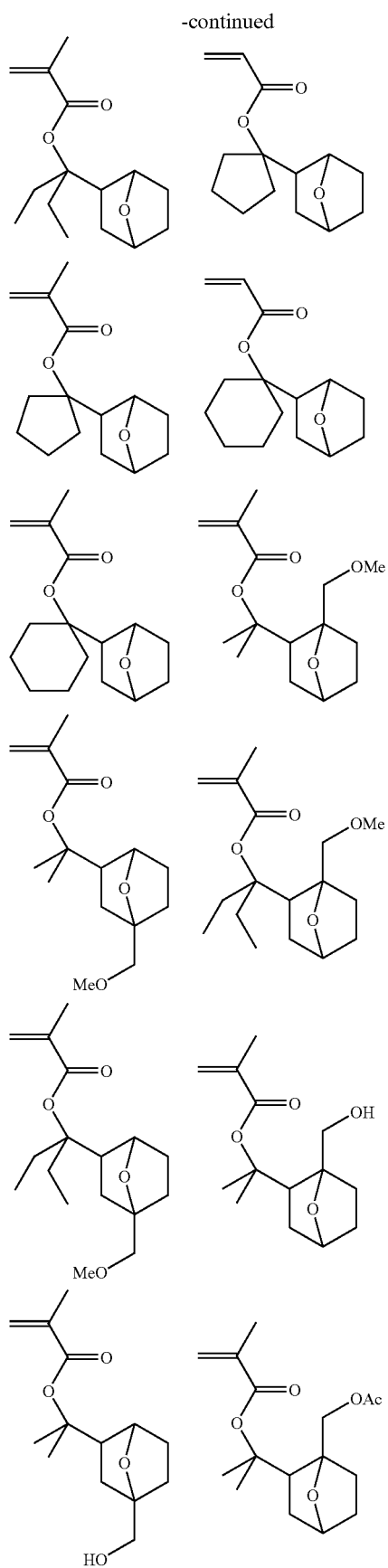
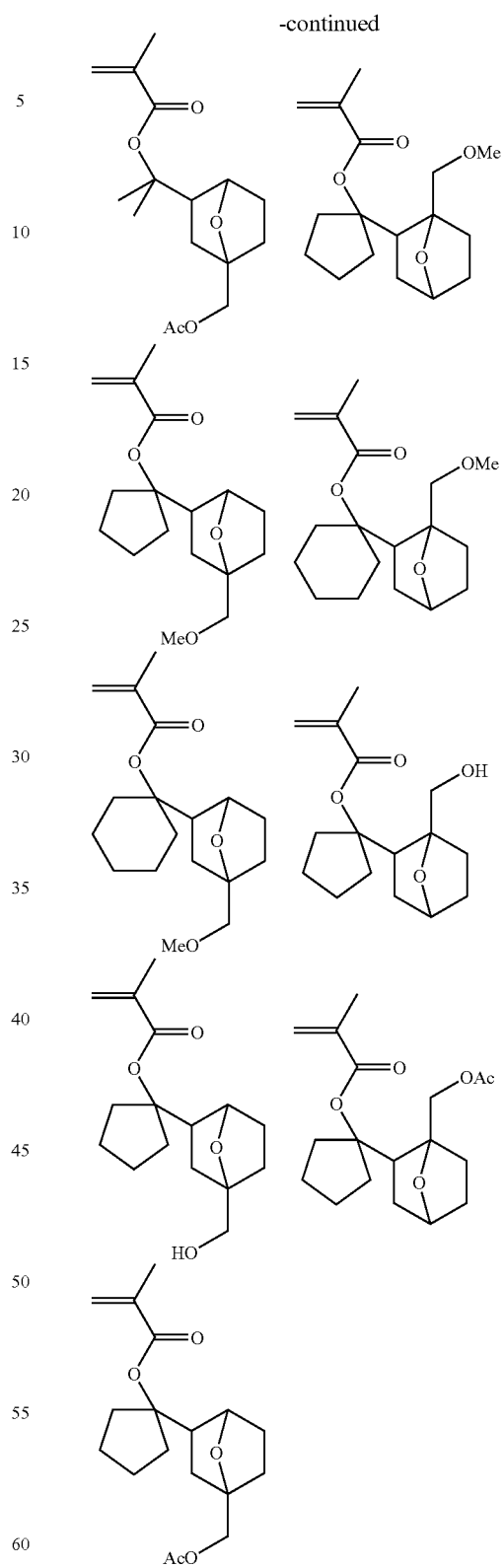
The polymer according to the present invention is required to include repeating units represented by the general formulae (a) and (b), and the polymer may additionally include repeating units represented by the general formulae (c) and/or (d). Moreover, a repeating unit with an adhesion group that does not fall within the general formulae (a), (b), (c) and (d) can be additionally copolymerized. Specifically, the polymer may optionally include a repeating unit (e) obtained by polymerizing an example monomer shown below.
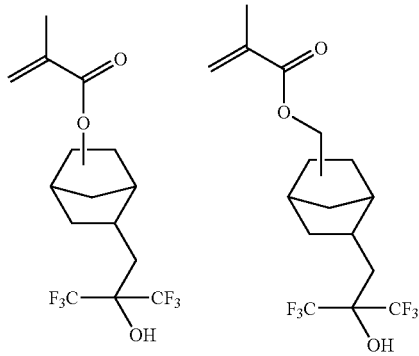
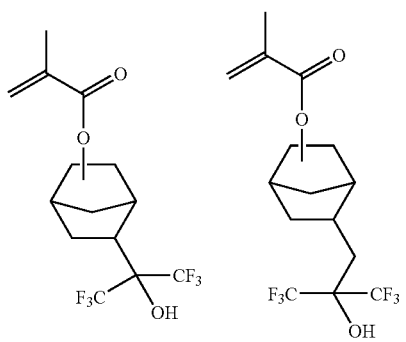
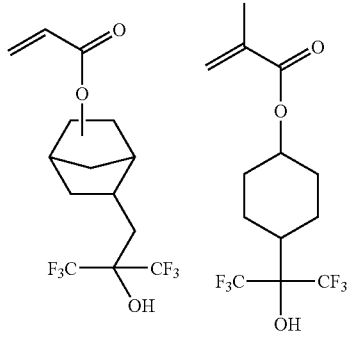
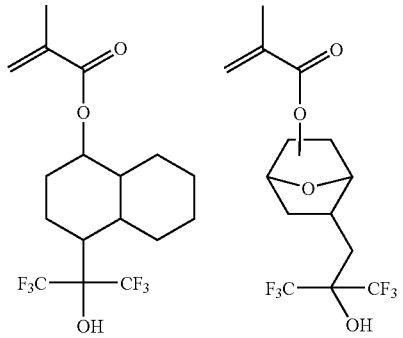
-continued
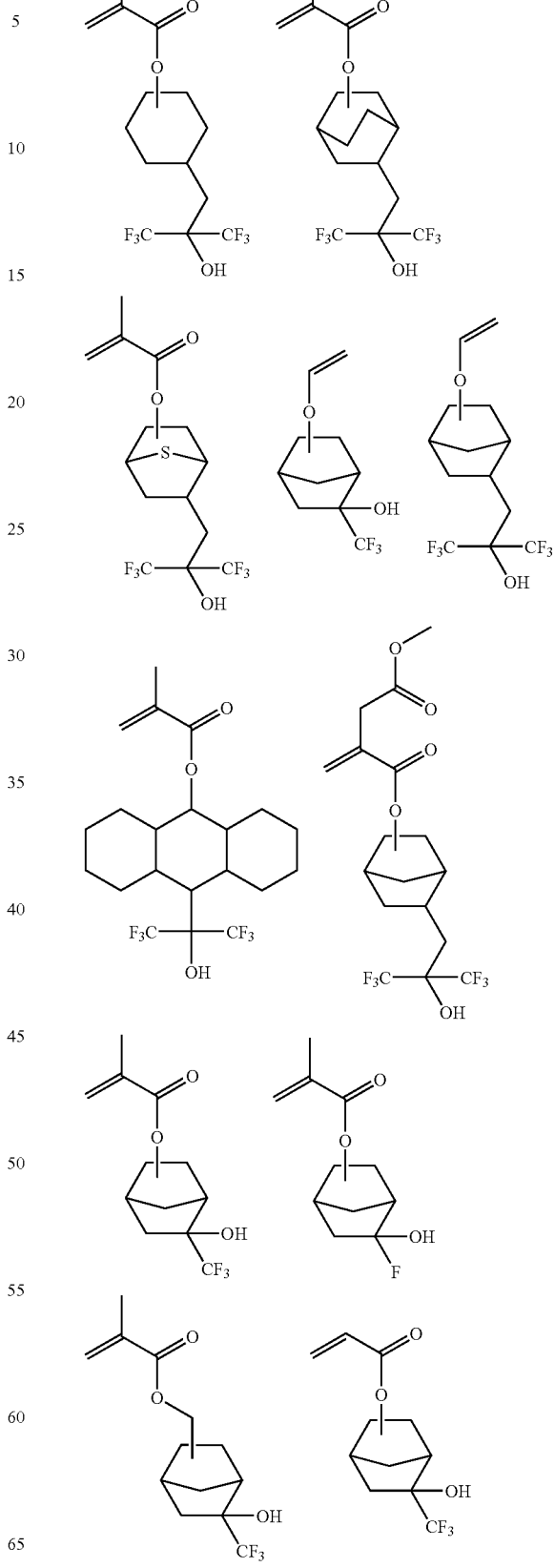

-continued
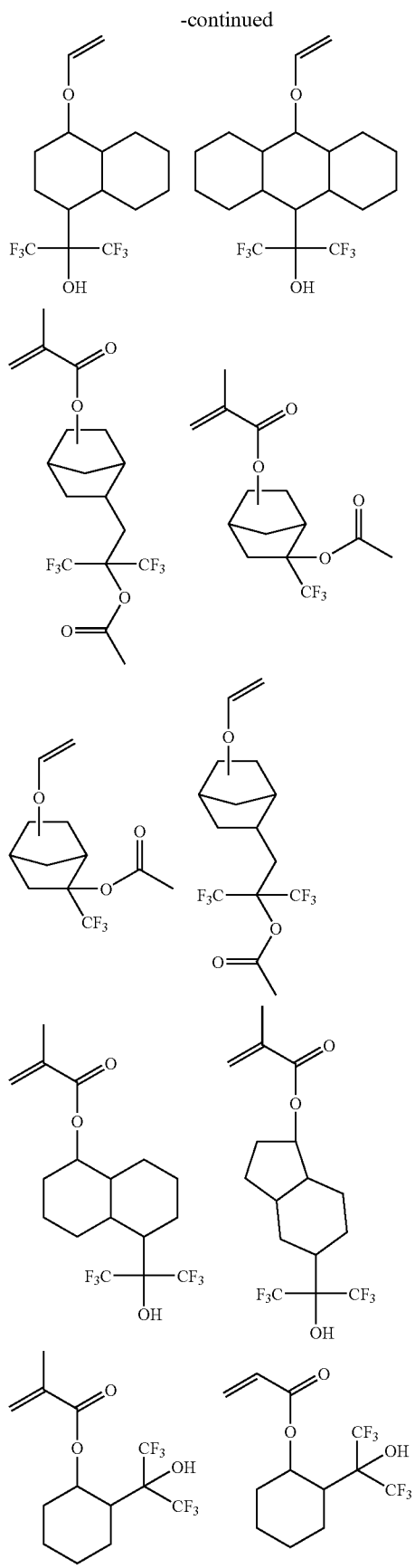
-continued
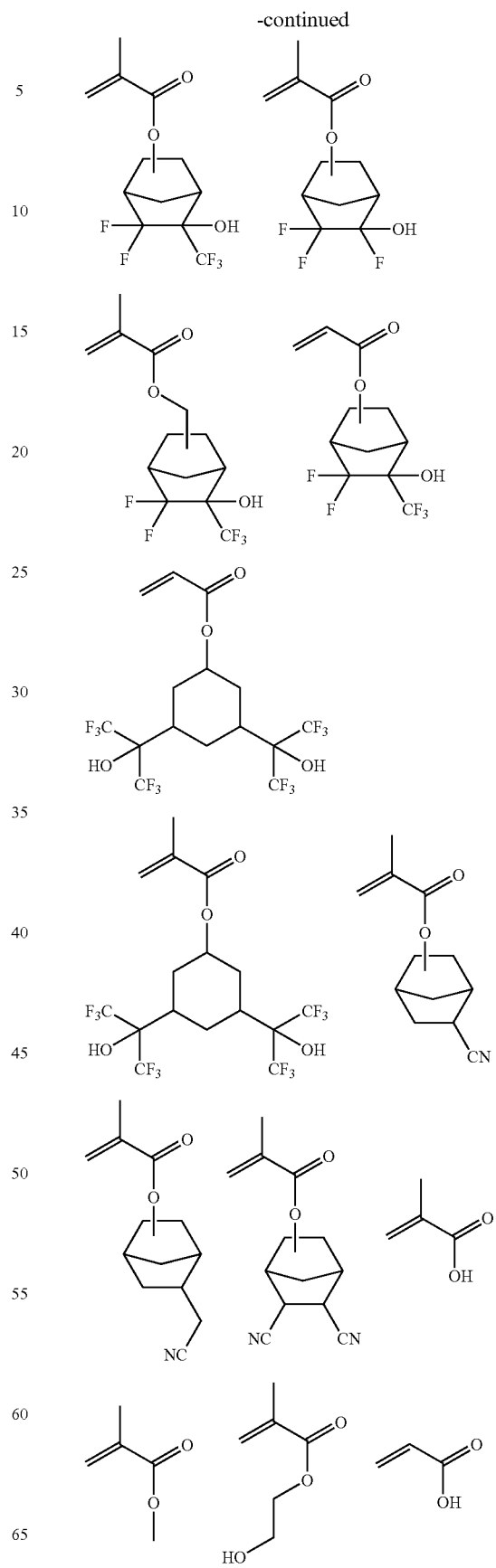

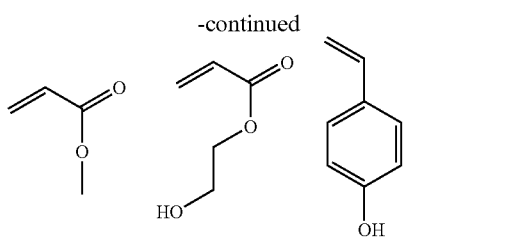
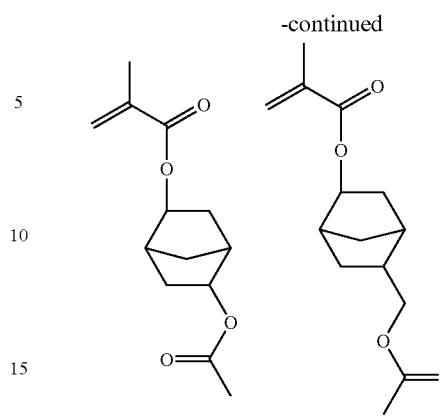
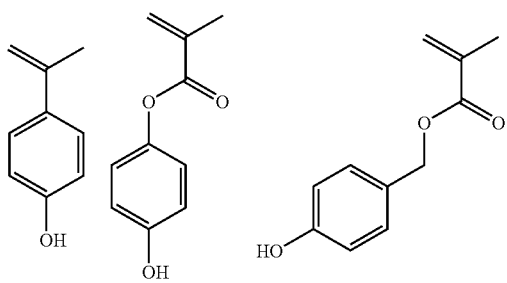
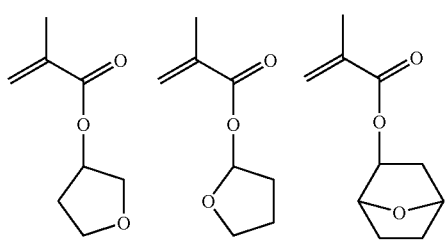
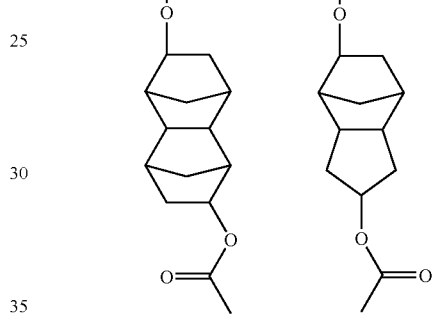
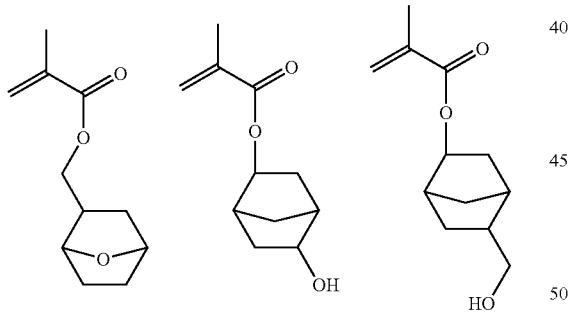
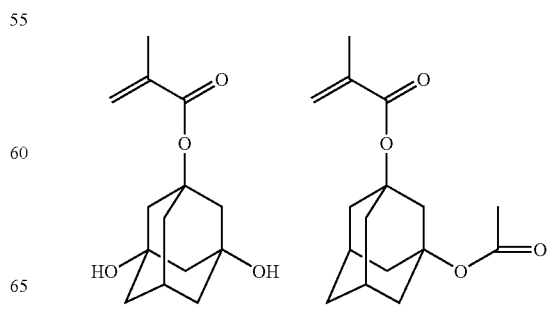

-continued

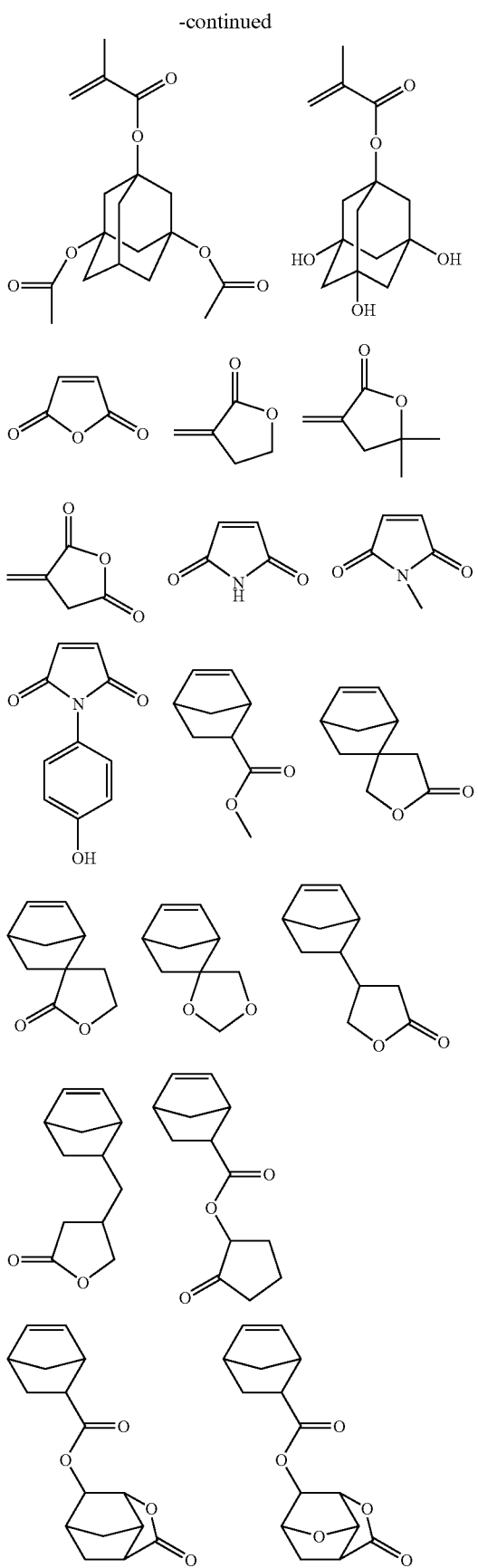

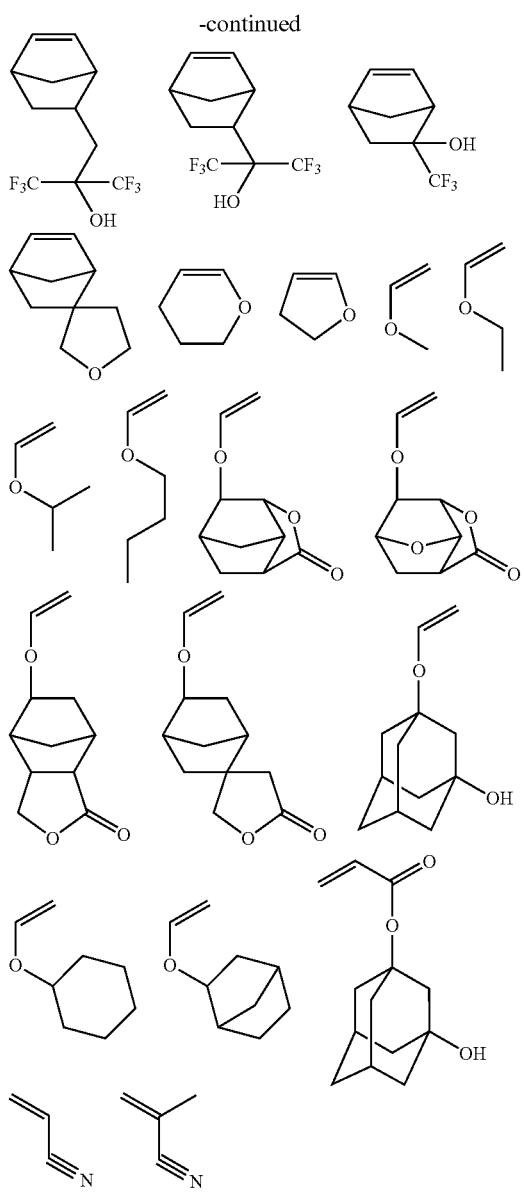

The copolymerization ratio of the repeating units (a), (b), (c), (d), and (e) satisfy preferably $0<a<1.0$, $0<b\leq0.8$, $0\leq c\leq0.8$, $0\leq d\leq0.8$, and $0\leq e\leq0.8$; more preferably $0.01\leq a\leq0.9$, $0.01\leq b\leq0.7$, $0.05\leq c+d\leq0.7$, $0\leq e\leq0.7$.

Mass-average molecular weight (relative to polystyrene standard) measured with gel permeation chromatography (GPC) of the polymer according to the present invention is preferably 1,000 to 500,000, in particular, 2,000 to 30,000. When mass-average molecular weight of the polymer is 1,000 or more, a resist composition including the polymer has sufficient heat resistance. When mass-average molecular weight of the polymer is 500,000 or less, alkaline solubility of the resist composition hardly lowers, and the footing phenomenon after patterning hardly occurs.

In addition, when the polymer according to the present invention has narrow molecular-weight distribution (Mw/Mn), presence of low molecular-weight polymer or high molecular-weight polymer hardly causes foreign matter on a pattern, or hardly degrade pattern profiles after exposure. Influence of molecular weight and molecular-weight distribution on a pattern becomes larger as a pattern rule becomes finer. Consequently, to obtain a resist composition suitably used for finer pattern size, molecular-weight distribution of a multicomponent copolymer to be used is preferably narrow of 1.0 to 2.0, more particularly 1.0 to 1.5.

As mentioned above, as a base resin of a resist composition according to the present invention, a copolymer including a repeating unit with a naphthylene group, a repeating unit of sulfonate, a repeating unit with an acid cleavable group, and/or an adhesive repeating unit with lactone is preferably used. The repeating unit with an acid cleavable group and the adhesive repeating unit with lactone are preferably obtained by using monomers of polyacrylic acid derivatives or polymethacrylic acid derivatives.

Moreover, a conventional polymer in which an onium salt of sulfonic acid having a polymerizable unsaturated bond is not copolymerized, in particular, one or more kinds of polymers selected from the following can be further blended with the base resin: polyacrylic acid and derivatives thereof; copolymer comprising 3, 4 or more types of monomers among cycloolefin derivatives-maleic anhydride alternating polymer, polyacrylic acid and derivatives thereof; cycloolefin derivatives-α trifluoromethylacryl copolymer; polynorbornene; and metathesis ring-opening polymer.

In order to synthesize a polymer according to the present invention, for example, the following method can be used: placing monomers with an unsaturated bond for obtaining the repeating units (a), (b), (c), (d), and (e) in an organic solvent, adding a radical initiator to the solvent, and conducting thermal polymerization, to obtain the polymer. Examples of the organic solvent used at the time of polymerization may include: toluene, benzene, tetrahydrofuran, diethyl ether, dioxane, and the like. Examples of the polymerization initiator may include: 2,2'-azobisisobutyronitrile (AIBN), 2,2'-azo bis(2,4-dimethyl valeronitrile), dimethyl-2,2-azo bis(2-methyl propionate), benzoyl peroxide, lauroyl peroxide, and the like. Polymerization can be conducted preferably by heating to 50° C. to 80° C. The reaction time may be 2 to 100 hours, preferably 5-20 hours. The acid labile group may be used as those introduced into the monomer, or the acid labile group may be cleaved by an acid catalyst once and then protected or partially protected.

The resist composition including the polymer according to the present invention can function as a chemically amplified positive resist composition. The polymer according to the present invention contains a polymeric acid generator as the repeating unit (b). Acid generated from the acid generator upon exposure to radiation cleaves an acid cleavable group to change an exposed area of the resist to be soluble in a developer. Thus, the chemically amplified positive resist composition can provide a pattern with extremely high precision.

The resist composition according to the present invention having the polymer as a base resin may optionally include an organic solvent, a dissolution inhibitor, a basic compound, a surfactant or other additives.

Although the polymer in the resist composition according to the present invention has a polymeric acid generator as the repeating unit (b), other acid generator(s) can be further added.

Any organic solvent that can dissolve a base resin, an acid generator and other additives can be used for a resist composition, in particular for a chemically amplified positive resist composition, of the present invention. Examples of such an organic solvent may include: ketones such as cyclohexanone, methyl-2-n-amyl ketone; alcohols such as 3-methoxy butanol, 3-methyl-3-methoxy butanol, 1-methoxy-2-propanol, 1-ethoxy-2-propanol; ethers such as propylene glycol monomethyl ether, ethylene glycol monomethyl ether, propylene glycol monomethyl ether, ethylene glycol monoethyl ether, propylene glycol dimethyl ether, diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono tert-butyl ether acetate; lactones such as γ-butyrolactone. Above solvents may be used alone or in admixture. However, the solvents are not limited thereto.

Among the solvents, diethylene glycol dimethyl ether, 1-ethoxy-2-propanol, propylene glycol monomethyl ether acetate, cyclohexanone, ethyl lactate, γ-butyrolactone or a mixture thereof can be preferably used for the present invention because these solvents have very high solubility of an acid generator in resist components.

An amount of the organic solvent to be added is preferably 200 to 1,000 parts (hereinafter, parts means parts by mass), more preferably 400 to 800 parts to 100 parts of a base resin.

The acid generators that can be further added to the resist composition according to the present invention are those suggested conventionally. Examples of the acid generators are as follows:

i) an onium salt represented by the following general formula (P1a-1), (P1a-2) or (P1b), ii) a diazomethane derivative represented by the following general formula (P2), iii) a glyoxime derivative represented by the following general formula (P3), iv) a bis sulfone derivative represented by the following general formula (P4), v) a sulfonate of a N-hydroxy imide compound represented by the following general formula (P5), vi) a β-keto sulfonic acid derivative, vii) a disulfone derivative, viii) a nitro benzyl sulfonate derivative, ix) a sulfonate derivative, etc.

(In the formulae, $R^{101a}$, $R^{101b}$, and $R^{101c}$ independently represent a linear, branched or cyclic alkyl group, alkenyl group, oxoalkyl group or oxoalkenyl group each having 1-12 carbon atoms, an aryl group having 6-20 carbon atoms, an aralkyl group or an aryl oxoalkyl group having 7-12 carbon atoms. Some or all of hydrogen atoms of these groups may be substituted with an alkoxy group etc. $R^{101b}$ and $R^{101c}$ may form a ring. In the case that $R^{101b}$ and $R^{101c}$ form a ring, $R^{101b}$ and $R^{101c}$ represent an alkylene group having 1-6 carbon atoms respectively. $K^-$ represents a non-nucleophilic counter ion.)

The above-mentioned $R^{101a}$, $R^{101b}$ and $R^{101c}$ may be the same or different. Illustrative examples thereof as an alkyl group may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cycloheptyl group, a cyclopropyl methyl group, 4-methyl cyclohexyl group, a cyclohexyl methyl group, a norbornyl group, an adamantyl group, etc. Illustrative examples of an alkenyl group may include: a vinyl group, an allyl group, a propenyl group, a butenyl group, a hexenyl group, a cyclohexenyl group, etc. Examples of an oxoalkyl group may include: 2-oxocyclopentyl group, 2-oxocyclohexyl group, etc. and 2-oxopropyl group, 2-cyclopentyl-2-oxoethyl group, 2-cyclohexyl-2-oxoethyl group, 2-(4-methylcyclohexyl)-2-oxoethyl group, etc. Examples of the oxoalkenyl group may include: 2-oxo-4-cyclohexenyl group, 2-oxo-4-propenyl group, etc. Examples of an aryl group may include: a phenyl group, a naphthyl group, etc., and an alkoxy phenyl groups such as p-methoxyphenyl group, m-methoxyphenyl group, o-methoxyphenyl group, an ethoxyphenyl group, p-tert-butoxyphenyl group, m-tert-butoxy phenyl group, etc.; an alkyl phenyl group such as 2-methylphenyl group, 3-methylphenyl group, 4-methylphenyl group, an ethylphenyl group, 4-tert-butylphenyl group, 4-butylphenyl group, a dimethyl phenyl group, etc.; an alkyl naphthyl group such as a methylnaphthyl group, an ethyl naphthyl group, etc.; an alkoxy naphthyl group such as a methoxy naphthyl group, an ethoxy naphthyl group, etc.; a dialkyl naphthyl group such as a dimethyl naphthyl group, a diethyl naphthyl group, etc.; a dialkoxy naphthyl group such as a dimethoxy naphthyl group, a diethoxy naphthyl group, etc. Examples of the aralkyl group may include a benzyl group, a phenylethyl group, a phenethyl group, etc. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, etc. Examples of a non-nucleophilic counter ion as K⁻ may include: a halide ion such as a chloride ion, or a bromide ion, a fluoro alkyl sulfonate such as triflate, 1,1,1-trifluoro ethanesulfonate, or nonafluoro butane sulfonate, an aryl sulfonate such as tosylate, benzene sulfonate, 4-fluorobenzene sulfonate, 1,2,3,4,5-pentafluoro benzene sulfonate, an alkyl sulfonate such as mesylate, or butane sulfonate.

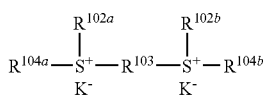

(P1b)

(In the formula, $R^{102a}$ and $R^{102b}$ each represents a, linear, branched or cyclic alkyl group having 1-8 carbon atoms. $R^{103}$ represents a linear, branched or cyclic alkylene group having 1-10 carbon atoms. $R^{104a}$ and $R^{104b}$ each represents a 2-oxoalkyl group having 3-7 carbon atoms. K⁻ represents a non-nucleophilic counter ion.)

Illustrative examples of the $R^{102a}$ and $R^{102b}$ may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group and the like. Examples of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group and the like. Examples of $R^{104a}$ and $R^{104b}$ may include: 2-oxopropyl group, 2-oxocyclopentyl group, 2-oxo-cyclohexyl group, 2-oxocycloheptyl group and the like. K⁻ represents the same as mentioned in the formulae (P1a-1) and (P1a-2).

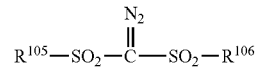

(P2)

(In the formula, $R^{105}$ and $R^{106}$ represent a linear, branched or cyclic alkyl group or alkyl-halide group having 1-12 carbon atoms, an aryl group or aryl-halide group having 6-20 carbon atoms, or an aralkyl group having 7-12 carbon atoms.)

Examples of the alkyl group as $R^{105}$ and $R^{106}$ may include: a methyl group, an ethyl group, a propyl group, an isopropyl group, n-butyl group, sec-butyl group, tert-butyl group, a pentyl group, a hexyl group, a heptyl group, an octyl group, an amyl group, a cyclopentyl group, a cyclohexyl group, a cycloheptyl group, a norbornyl group, an adamantyl group and the like. Examples of the alkyl-halide group may include: trifluoromethyl group, 1,1,1-trifluoroethyl group, 1,1,1-trichloroethyl group, a nonafluoro butyl group and the like. Examples of the aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, m-tert-butoxyphenyl group or the like, an alkylphenyl groups such as 2-methylphenyl group, 3-methylphenyl group, 4-methylphenyl group, an ethylphenyl group, 4-tert-butylphenyl group, 4-butylphenyl group, a dimethylphenyl group and the like. Examples of the aryl-halide group as $R^{105}$ and $R^{106}$ may include: a fluorophenyl group, a chlorophenyl group, 1,2,3,4,5-pentafluoro phenyl group and the like. Examples of the aralkyl group as $R^{105}$ and $R^{106}$ may include: a benzyl group, a phenethyl group, and the like.

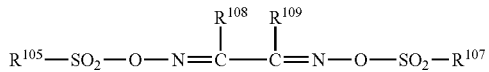

(P3)

(In the formula, $R^{107}$, $R^{108}$ and $R^{109}$ represent a linear, branched or cyclic alkyl group or an alkyl-halide group having 1 to 12 carbon atoms, an aryl group or an aryl-halide group having 6 to 20 carbon atoms, or an aralkyl group having 7 to 12 carbon atoms. $R^{108}$ and $R^{109}$ may bond each other to form a cyclic structure. When $R^{108}$ and $R^{109}$ form a cyclic structure, $R^{108}$ and $R^{109}$ each represents a linear or branched alkylene group having 1 to 6 carbon atoms. $R^{105}$ represents the same as mentioned in the formula (P2).)

Examples of the alkyl group, the alkyl-halide group, the aryl group, the aryl-halide group, and the aralkyl group as $R^{107}$, $R^{108}$ and $R^{109}$ may be the same as explained for $R^{105}$ and $R^{106}$. Examples of the alkylene group for $R^{108}$ and $R^{109}$ may include a methylene group, an ethylene group, a propylene group, a butylene group, a hexylene group and the like.

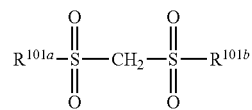

(P4)

(In the formula, $R^{101a}$ and $R^{101b}$ are the same as explained above.)

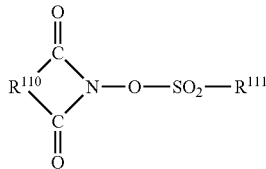
(P5)

(In the formula, $R^{110}$ represents an arylene group having 6-10 carbon atoms, an alkylene group having 1-6 carbon atoms or an alkenylene group having 2-6 carbon atoms. Some or all of hydrogen atoms of these groups may be further substituted with a linear or branched alkyl group or an alkoxy group having 1-4 carbon atoms, a nitro group, an acetyl group, or a phenyl group. $R^{111}$ represents a linear, branched or substituted alkyl group, alkenyl group or alkoxy alkyl group having 1-8 carbon atoms, a phenyl group or a naphthyl group. Some or all of hydrogen atoms of these groups may be substituted with an alkyl group or an alkoxy group having 1-4 carbon atoms; a phenyl group which may be substituted with an alkyl group or an alkoxy group having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphtylene group and the like. Examples of the alkylene group may include: a methylene group, an ethylene group, a trimethylene group, a tetramethylene group, a phenyl ethylene group, a norbornane-2,3-di-yl group, etc. Examples of the alkenylene group may include: 1,2-vinylene group, 1-phenyl-1,2-vinylene group, 5-norbornene-2,3-di-yl group and the like. Examples of the alkyl group as $R^{111}$ may be the same as exemplified for $R^{101a}$—$R^{101c}$. Examples of the alkenyl group as $R^{111}$ may include: a vinyl group, 1-propenyl group, an allyl group, 1-butenyl group, 3-butenyl group, an isoprenyl group, 1-pentenyl group, 3-pentenyl group, 4-pentenyl group, a dimethyl allyl group, 1-hexenyl group, 3-hexenyl group, 5-hexenyl group, 1-heptenyl group, 3-heptenyl group, 6-heptenyl group, 7-octenyl group and the like. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, a pentyloxy ethyl group, a hexyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group and the like.

In addition, examples of the alkyl group having 1-4 carbon atoms which may be further substituted may include: a methyl group, an ethyl group, a propyl group, an isopropyl group, n-butyl group, an isobutyl group, a tert-butyl group and the like. Examples of the alkoxy group having 1-4 carbon atoms may include: a methoxy group, an ethoxy group, a propoxy group, an isopropoxy group, n-butoxy group, an isobutoxy group, a tert-butoxy group and the like. Examples of the phenyl group which may be substituted with an alkyl group or an alkoxy group having 1-4 carbon atoms, a nitro group or an acetyl group may include: a phenyl group, a tolyl group, p-tert-butoxy phenyl group, p-acetyl phenyl group, p-nitrophenyl group and the like. Examples of a hetero aromatic group having 3-5 carbon atoms may include: a pyridyl group, a furyl group and the like.

Illustrative examples of an acid generator may include: an onium salt such as diphenyl iodonium trifluoromethane sulfonate, (p-tert-butoxy phenyl)phenyl iodonium trifluoromethane sulfonate, diphenyl iodonium p-toluenesulfonate, (p-tert-butoxy phenyl)phenyl iodonium p-toluenesulfonate, triphenyl sulfonium trifluoromethane sulfonate, (p-tert-butoxy phenyl)diphenyl sulfonium trifluoromethane sulfonate, bis(p-tert-butoxy phenyl)phenyl sulfonium trifluoromethane sulfonate, tris(p-tert-butoxy phenyl)sulfonium trifluoromethane sulfonate, triphenyl sulfonium p-toluenesulfonate, (p-tert-butoxy phenyl)diphenyl sulfonium p-toluenesulfonate, bis(p-tert-butoxy phenyl)phenyl sulfonium p-toluenesulfonate, tris(p-tert-butoxy phenyl)sulfonium p-toluenesulfonate, triphenyl sulfonium nonafluoro butane sulfonate, triphenyl sulfonium butane sulfonate, trimethyl sulfonium trifluoromethane sulfonate, trimethyl sulfonium p-toluenesulfonate, cyclohexyl methyl (2-oxocyclohexyl) sulfonium trifluoromethane sulfonate, cyclohexyl methyl (2-oxo cyclohexyl)sulfonium p-toluenesulfonate, dimethyl phenyl sulfonium trifluoromethane sulfonate, dimethyl phenyl sulfonium p-toluenesulfonate, dicyclohexyl phenyl sulfonium trifluoromethane sulfonate, dicyclohexyl phenyl sulfonium p-toluenesulfonate, trinaphthylsulfonium trifluoromethane sulfonate, (2-norbonyl)methyl (2-oxocyclohexyl)sulfonium trifluoromethane sulfonate, ethylene bis [methyl (2-oxocyclopentyl)sulfonium trifluoromethane sulfonate], 1,2'-naphthyl carbonyl methyl tetrahydro thiophenium triflate and the like.

Examples of a diazomethane derivative may include: bis (benzene sulfonyl)diazomethane, bis(p-toluene sulfonyl)diazomethane, bis(xylene sulfonyl)diazomethane, bis(cyclohexyl sulfonyl)diazomethane, bis(cyclopentyl sulfonyl) diazomethane, bis(n-butylsulfonyl)diazomethane, bis (isobutyl sulfonyl)diazomethane, bis(sec-butylsulfonyl) diazomethane, bis(n-propylsulfonyl)diazomethane, bis (isopropyl sulfonyl)diazomethane, bis(tert-butyl sulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butyl sulfonyl)diazomethane, 1-cyclohexyl sulfonyl-1-(tert-amyl sulfonyl)diazomethane, 1-tert-amyl sulfonyl-1-(tert-butyl-sulfonyl)diazomethane and the like.

Examples of a glyoxime derivative may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α- dimethylglyoxime, bis-O-(camphor sulfonyl)-α-dimethylglyoxime and the like.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane and the like.

Examples of the β-ketosulfone derivative may include: 2-cyclohexyl carbonyl-2-(p-toluene sulfonyl)propane, 2-isopropyl carbonyl-2-(p-toluene sulfonyl)propane and the like.

Examples of the disulfone derivative may include: diphenyl disulfone derivative, a dicyclohexyl disulfone derivative and the like.

Examples of the nitro benzyl sulfonate derivative may include: 2,6-dinitro benzyl p-toluenesulfonate, 2,4-dinitro benzyl p-toluenesulfonate, and the like.

Examples of the sulfonate derivative may include: 1,2,3-tris(methane sulfonyloxy)benzene, 1,2,3-tris(trifluoromethane sulfonyloxy)benzene, 1,2,3-tris(p-toluene sulfonyloxy)benzene, and the like.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimide-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxyimide methane sulfonate, N-hydroxy-5-norbornene-2,3-dicarboxyimide trifluoromethane sulfonate, N-hydroxy-5-norbornene-2,3-dicarboxyimide p-toluenesulfonate and the like.

In particular the following acid generators are preferably used: an onium salt such as triphenyl sulfonium trifluoromethane sulfonate, (p-tert-butoxy phenyl)diphenyl sulfonium trifluoromethane sulfonate, tris(p-tert-butoxy phenyl) sulfonium trifluoromethane sulfonate, triphenyl sulfonium p-toluenesulfonate, (p-tert-butoxy phenyl)diphenyl sulfonium p-toluenesulfonate, tris(p-tert-butoxy phenyl)sulfonium p-toluenesulfonate, trinaphthylsulfonium trifluoromethane sulfonate, cyclohexyl methyl (2-oxocyclohexyl) sulfonium trifluoromethane sulfonate, (2-norbonyl)methyl (2-oxocyclohexyl)sulfonium trifluoromethane sulfonate, 1,2'-naphthyl carbonylmethyl tetrahydrothiophenium triflate, and the like;

a diazomethane derivative such as bis(benzene sulfonyl)diazomethane, bis(p-toluene sulfonyl)diazomethane, bis(cyclohexyl sulfonyl)diazomethane, bis(n-butylsulfonyl)diazomethane, bis(isobutyl sulfonyl)diazomethane, bis(sec-butylsulfonyl)diazomethane, bis(n-propyl sulfonyl)diazomethane, bis(isopropyl sulfonyl)diazomethane, bis(tert-butylsulfonyl)diazomethane and the like;

a glyoxime derivative, such as bis-O-(p-toluene sulfonyl)-α-dimethylglyoxime and bis-O-(n-butane sulfonyl)-α-dimethylglyoxime and the like;

a bissulfone derivative, such as bisnaphthyl sulfonyl methane and the like;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate and N-hydroxy naphthalimide benzene sulfonate and the like.

An acid generator of oxime type disclosed in WO2004/074242 A2 can also be further added.

The above-mentioned acid generator may be used alone or in admixture. The onium salts are excellent to achieve straight wall profiles. The diazomethane derivatives and the glyoxime derivatives are excellent to reduce standing waves. Therefore, combining the onium salts, the diazomethane derivatives and the glyoxime derivatives enables fine adjustments of pattern profiles.

An amount of the acid generator to be added is preferably 0.1 to 50 parts, more preferably 0.5 to 40 parts to 100 parts of a base resin. When the addition amount is 0.1 parts or more, sufficient amount of acid is generated upon exposure to radiation and then sufficient sensitivity and resolution are achieved. When the addition amount is 50 parts or less, there is little possibility that transmittance of the resist lowers or resolution of the resist is degraded.

Furthermore, a dissolution inhibitor (a dissolution controller) can be added to a resist composition, in particular a chemically amplified positive resist composition, of the present invention. A suitable example of the dissolution inhibitor may be a compound of 100 to 1,000, preferably 150 to 800, mass average molecular weight, with two or more of phenolic hydroxyl groups in a molecule, in which hydrogen atoms of the phenolic hydroxyl groups are substituted with acid labile groups at a ratio of 0 to 100 mole % on average as a whole; or a compound of 100 to 1,000, preferably 150 to 800, mass average molecular weight, with a carboxyl group in a molecule, in which a hydrogen atom of the carboxyl group are substituted with an acid labile group at a ratio of 50 to 100 mole % on average as a whole.

The substitution rate of hydrogen atoms of the phenolic hydroxyl group with an acid labile group is 0 mole % or more of the whole phenolic hydroxyl groups on average, preferably 30 mole % or more. The upper limit of the substitution rate is 100 mole %. More preferably the substitution rate is 80 mole %.

The substitution rate of hydrogen atoms of the carboxyl group with an acid labile group of the whole carboxyl groups on average is 50 mole % or more, preferably 70 mole % or more. The upper limit of the substitution rate is 100 mole %.

Suitable examples of the compound which has two or more of phenolic hydroxyl groups and the compound which has a carboxyl group are shown by the following formulae (D1)-(D14).

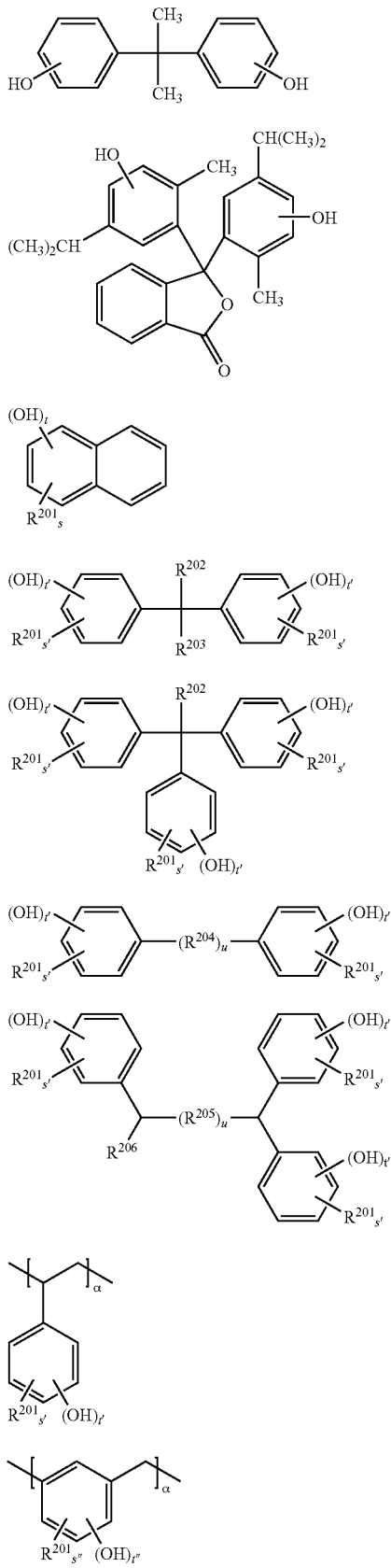

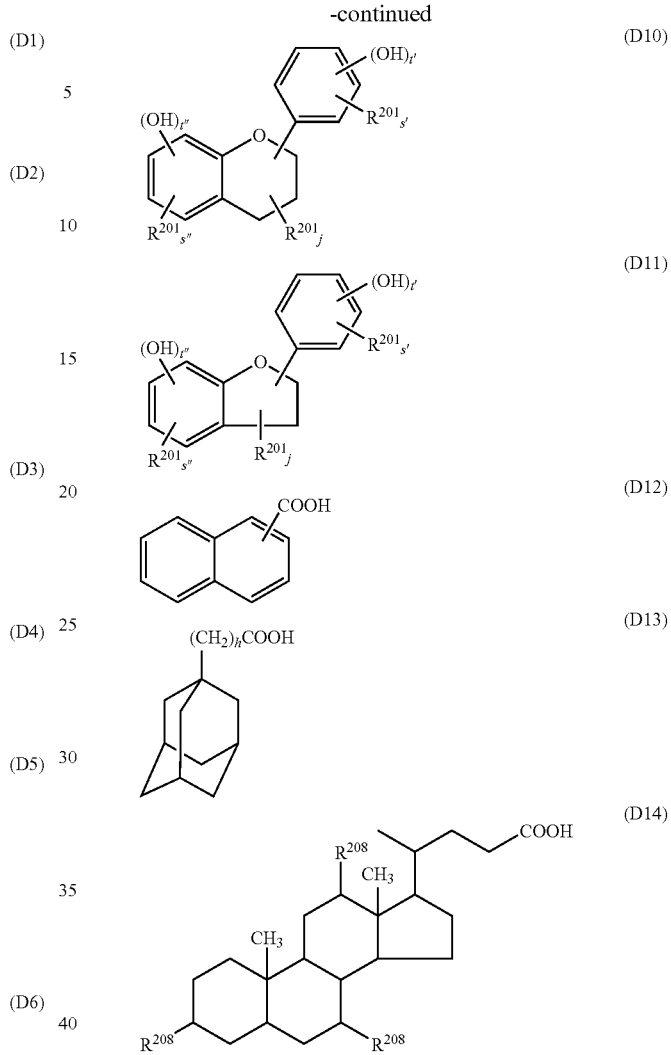

In the formulae, each of $R^{201}$ and $R^{202}$ represents a hydrogen atom or a linear or branched alkyl group or alkenyl group having 1-8 carbon atoms. $R^{203}$ represents a hydrogen atom or a linear or branched alkyl group or alkenyl group having 1-8 carbon atoms, or —$(R^{207})_h$COOH. $R^{204}$ represents —$(CH_2)_i$— (i=2-10), an arylene group having 6-10 carbon atoms, a carbonyl group, a sulfonyl group, an oxygen atom, or a sulfur atom. $R^{205}$ represents an alkylene group having 1-10 carbon atoms, an arylene group having 6-10 carbon atoms, a carbonyl group, a sulfonyl group, an oxygen atom, or a sulfur atom. $R^{206}$ represents a hydrogen atom, a linear or branched alkyl group or alkenyl group having 1-8 carbon atoms, a phenyl group or a naphthyl group each substituted with a hydroxyl group. $R^{207}$ represents a linear or branched alkylene group having 1-10 carbon atoms. $R^{208}$ represents a hydrogen atom or a hydroxyl group. j is an integer of 0-5. u and h are 0 or 1. s, t, s', t', s", and t" satisfy s+t=8, s'+t'=5, s"+t"=4, and are the number so that each of the phenyl skelton may have at least one hydroxyl group. α is the number that makes the molecular weight of the compounds of the formulae (D8) and (D9) to be 100 to 1,000.

The addition amount of the dissolution inhibitor is 0 to 50 parts, preferably 5 to 50 parts, more preferably 10 to 30 parts to 100 parts of a base resin. The dissolution inhibitor can be used alone or in admixture. Addition of the dissolution inhibitor enhance resolution. When the addition amount of the dissolution inhibitor is 50 parts or less, there is little possibility that film loss in a pattern is caused, and resolution is degraded.

A basic compound can be further added to a resist composition, in particular a chemically amplified positive resist composition, of the present invention.

Suitable basic compounds can suppress an acid diffusion rate when an acid generated from an acid generator diffuses in a resist film. Addition of the basic compound suppresses a diffusion rate of the acid in the resist film, thereby enhancing resolution, suppressing change of sensitivity after exposure to radiation, reducing dependency on a substrate or atmosphere, and enhancing exposure margin, pattern profile and the like.

Examples of such a basic compound may include: a primary, secondary and tertiary aliphatic amines, a mixed amine, an aromatic amine, a heterocyclic amine, a compound containing nitrogen which has a carboxyl group, a compound containing nitrogen which has a sulfonyl group, a compound containing nitrogen which has a hydroxyl group, a compound containing nitrogen which has a hydroxy phenyl group, an alcohol compound containing nitrogen, an amide derivative, an imide derivative and the like.

Specific examples of the primary aliphatic amine may include: ammonia, methylamine, ethylamine, n-propylamine, isopropylamine, n-butylamine, isobutyl amine, sec-butyl-amine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like. Examples of the secondary aliphatic amine may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like. Examples of the tertiary aliphatic amine may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine and the like.

Moreover, examples of the mixed amines may include: a dimethyl ethylamine, methyl ethyl propyl amine, benzylamine, phenethyl amine, benzyl dimethylamine, and the like.

Examples of the aromatic amines and the heterocyclic amines may include: an aniline derivative (for example, aniline, N-methyl aniline, and N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine and the like), diphenyl (p-tolyl) amine, methyl diphenylamine, triphenylamine, phenylenediamine, naphthylamine, diamino naphthalene, a pyrrole derivative (for example, pyrrole, 2H-pyrrole, 1-methyl pyrrole, 2,4-dimethyl pyrrole, 2,5-dimethyl pyrrole, N-methyl pyrrole, and the like), oxazole derivative (for example, oxazole, isoxazole and the like), a thiazole derivative (for example, thiazole, isothiazole, and the like), an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methyl pyrrolidine, pyrrolidinone, N-methyl pyrolidone and the like), an imidazoline derivative, an imidazolidine derivative, a pyridine derivative (for example, pyridine, methyl pyridine, ethyl pyridine, propyl pyridine, butyl pyridine, 4-(1-butyl pentyl)pyridine, dimethyl pyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethylpropyl)pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative and the like.

Furthermore, examples of a compound containing nitrogen which has a carboxyl group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, methoxy alanine) and the like. Examples of a compound containing nitrogen which has a sulfonyl group may include: 3-pyridine sulfonic acid, p-toluenesulfonic acid pyridinium and the like. Examples of a compound containing nitrogen which has a hydroxyl group, a compound containing nitrogen which has a hydroxy phenyl group, and an alcohol compound containing nitrogen may include: 2-hydroxy pyridine, amino cresol, 2,4-quinoline diol, 3-Indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl) pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidinone-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl)phthalimide, N-(2-hydroxyethyl)isonicotinamide, and the like.

Examples of an amide derivative may include: formamide, N-methyl formamide, N,N-dimethylformamide, acetamide, N-methyl acetamide, N,N-dimethylacetamide, propione amide, benzamide, and the like.

Examples of an imide derivative may include: phthalimide, succinimide, maleimide, and the like.

Furthermore, one or more basic compound selected from the compounds represented by the following general formula (B)-1 can also be added.

$$N(X)_n(Y)_{3-n} \quad (B)-1$$

(In the formula, n is 1, 2, or 3. The side chain X may be the same or different, and represent the following general formulae (X)-1 to (X)-3. The side chain Y may be the same or different, and represents a hydrogen atom or a linear, branched or cyclic alkyl group having 1-20 carbon atoms which may contain an ether group or a hydroxyl group. Moreover, X may bond each other and form a ring.)

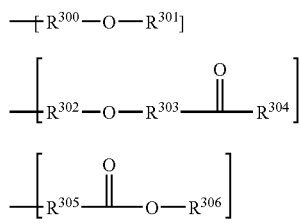

In the formulae, $R^{300}$, $R^{302}$, and $R^{305}$ represent a linear or branched alkylene group having 1-4 carbon atoms, and $R^{301}$ and $R^{304}$ represent a hydrogen atom or a linear, branched or cyclic alkyl group having 1-20 carbon atoms, which may contain one or more of a hydroxy group, an ether group, an ester group, and a lactone ring.

$R^{303}$ represents a single bond, or a linear or branched alkylene group having 1-4 carbon atoms, $R^{306}$ represents a linear, branched or cyclic alkyl group having 1-20 carbon atoms, which may contain one or more of a hydroxy group, an ether group, an ester group, and a lactone ring.

Examples of the compound represented by the general formula (B)-1 may be as follows:

Tris(2-methoxy methoxy ethyl)amine, tris{2-(2-methoxyethoxy)ethyl}amine, tris{2-(2-methoxy ethoxy methoxy) ethyl}amine, tris{2-(1-methoxyethoxy)ethyl}amine, tris{2-(1-ethoxy ethoxy)ethyl}amine, tris{2-(1-ethoxy propoxy) ethyl}amine, tris[2-{2-(2-hydroxy ethoxy)ethoxy}ethyl]amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclo octadecane, 1-aza-12-crown-4, 1-aza-15-crown-5, 1-aza-18-crown-6, tris (2-formyloxy-ethyl)amine, tris(2-acetoxy ethyl)amine, tris (2-propionyloxy-ethyl)amine, tris(2-butylyloxy-ethyl) amine, tris(2-isobutyryl oxy-ethyl)amine, tris(2-valeryloxy-ethyl)amine, tris(2-pivaloyloxy-ethyl)amine, N,N-bis(2-acetoxy ethyl) 2-(acetoxyacetoxy)ethylamine, tris(2-methoxycarbonyl oxy-ethyl)amine, tris(2-tert-butoxy carbonyl oxy-ethyl)amine, tris[2-(2-oxo propoxy)ethyl] amine, tris[2-(methoxycarbonyl methyl)oxy-ethyl]amine, tris[2-(tert-butoxycarbonylmethyloxy)ethyl]amine, tris[2-(cyclohexyloxy carbonylmethyloxy)ethyl]amine, tris(2-methoxycarbonyl ethyl)amine, tris(2-ethoxy carbonyl ethyl) amine, N,N-bis(2-hydroxy ethyl) 2-(methoxycarbonyl) ethylamine, N,N-bis(2-acetoxy ethyl) 2-(methoxycarbonyl) ethylamine, N,N-bis(2-hydroxy ethyl) 2-(ethoxy carbonyl) ethylamine, N,N-bis(2-acetoxy ethyl) 2-(ethoxy carbonyl) ethylamine, N,N-bis(2-hydroxy ethyl) 2-(2-methoxy ethoxy carbonyl)ethylamine, N,N-bis(2-acetoxy ethyl) 2-(2-methoxy ethoxy carbonyl)ethylamine, N,N-bis(2-hydroxy ethyl) 2-(2-hydroxy ethoxy carbonyl)ethylamine, N,N-bis(2-acetoxy ethyl) 2-(2-acetoxy ethoxy carbonyl)ethylamine, N,N-bis(2-hydroxy ethyl) 2-[(methoxycarbonyl)methoxycarbonyl]ethylamine, N,N-bis(2-acetoxy ethyl) 2-[(methoxycarbonyl)methoxycarbonyl]ethylamine, N,N-bis(2-hydroxy ethyl)-2-(2-oxo propoxy carbonyl)ethylamine, N,N-bis(2-acetoxy ethyl)-2-(2-oxo propoxy carbon-yl)ethylamine, N,N-bis(2-hydroxy ethyl) 2-(tetrahydro furfuryl oxy-carbonyl)ethylamine, N,N-bis(2-acetoxy ethyl) 2-(tetrahydro furfuryl oxy-carbonyl)ethylamine, N,N-bis(2-hydroxy ethyl) 2-[(2-oxo tetrahydrofuran-3-yl)oxy-carbonyl]ethylamine, N,N-bis(2-acetoxy ethyl) 2-[(2-oxo-tetrahydrofuran-3-yl)oxy-carbonyl]ethylamine, N,N-bis(2-hydroxy ethyl) 2-(4-hydroxy butoxy carbonyl)ethylamine, N,N-bis(2-formyl oxy-ethyl) 2-(4-formyloxybutoxy carbonyl)ethylamine, N,N-bis(2-formyl oxy-ethyl) 2-(2-formyloxy ethoxy carbonyl)ethylamine, N,N-bis(2-methoxy ethyl) 2-(methoxycarbonyl)ethylamine, N-(2-hydroxy ethyl)bis[2-(methoxycarbonyl)ethyl]amine, N-(2-acetoxy ethyl)bis[2-(methoxycarbonyl)ethyl]amine, N-(2-hydroxy ethyl)bis[2-(ethoxy carbonyl)ethyl]amine, N-(2-acetoxy ethyl)bis[2-(ethoxy carbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxy ethyl)bis[2-(methoxycarbonyl)ethyl]amine, N-butylbis[2-(methoxycarbonyl)ethyl]amine, N-butylbis[2-(2-methoxy ethoxy carbonyl)ethyl]amine, N-methyl bis(2-acetoxy ethyl) amine, N-ethyl bis(2-acetoxy ethyl)amine, N-methyl bis(2-pivaloyloxy-ethyl)amine, N-ethyl bis[2-(methoxy carbonyloxy)ethyl]amine, N-ethyl bis[2-(tert-butoxycarbonyloxy) ethyl]amine, tris(methoxycarbonyl methyl)amine, tris (ethoxy carbonyl methyl)amine, N-butyl bis (methoxycarbonyl methyl)amine, N-hexyl bis (methoxycarbonyl methyl)amine, and β-(diethylamino)-δ-valerolactone. However they are not limited thereto.

Furthermore, one or more kinds of a basic compound with the cyclic structure represented in the following general formula (B)-2 can also be added.

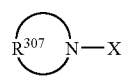

(In the formula, X represents the same as explained above, $R^{307}$ represents a linear or branched alkylene group having 2-20 carbon atoms, which may contain one or more of a carbonyl group, an ether group, an ester group, or a sulfide.)

Specific examples of (B)-2 may include: 1-[2-(methoxy methoxy)ethyl]pyrrolidine, 1-[2-(methoxy methoxy)ethyl] piperidine, 4-[2-(methoxy methoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidino ethyl acetate, 2-morpholino ethyl acetate, 2-(1-pyrrolidinyl)ethyl formate, 2-piperidino ethyl propionate, 2-morpholino ethyl acetoxy acetate, 2-(1-pyrrolidinyl)ethyl methoxy acetate, 4-[2-(methoxycarbonyloxy)ethyl]morpholine, 1-[2-(t-butoxycarbonyloxy)ethyl]piperidine, 4-[2-(2-methoxyethoxycarbonyloxy) ethyl]morpholine, methyl 3-(1-pyrrolidinyl)propionate, methyl 3-piperidino propionate, methyl 3-morpholino propionate, methyl 3-(thiomorpholino)propionate, methyl 2-methyl-3-(1-pyrrolidinyl)propionate, ethyl 3-morpholino propionate, methoxycarbonyl methyl 3-piperidino propionate, 2-hydroxy ethyl 3-(1-pyrrolidinyl)propionate, 2-acetoxy ethyl 3-morpholino propionate, 2-oxo tetrahydrofuran-3-yl 3-(1-pyrrolidinyl)propionate, tetrahydrofurfuryl 3-morpholino propionate, glycidyl 3-piperidino propionate, 2-methoxy ethyl 3-morpholino propionate, 2-(2-methoxyethoxy)ethyl 3-(1-pyrrolidinyl)propionate, butyl 3-morpholino propionate, cyclohexyl 3-piperidino propionate, α-(1-pyrrolidinyl)methyl-γ-butyrolactone, β-piperidino-γ- butyrolactone, β-morpholino-δ-valerolactone, methyl 1-pyrrolidinyl acetate, methyl piperidino acetate, methyl morpholino acetate, methyl thio morpholino acetate, ethyl 1-pyrrolidinyl acetate, 2-methoxy ethyl morpholino acetate, and the like.

Furthermore, a basic compound containing a cyano group represented by the general formulae (B)-3 to (B)-6 can be added.

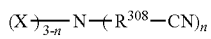  (B)-3

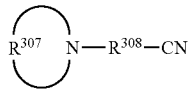  (B)-4

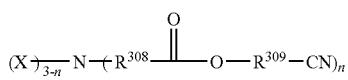  (B)-5

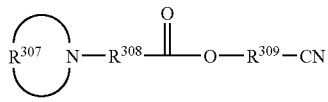  (B)-6

(In the formulae, X, $R^{307}$, and n are the same as explained above, and $R^{308}$ and $R^{309}$ are the same or different, and represent a linear or branched alkylene group having 1-4 carbon atoms.)

Examples of the basic compound comprising a cyano group may include: 3-(diethylamino)propiononitrile, N,N-bis(2-hydroxy ethyl)-3-amino propiononitrile, N,N-bis(2-acetoxy ethyl)-3-amino propiononitrile, N,N-bis(2-formyl oxyethyl)-3-amino propiononitrile, N,N-bis(2-methoxy ethyl)-3-amino propiononitrile, N,N-bis[2-(methoxy methoxy)ethyl]-3-amino propiononitrile, methyl N-(2-cyanoethyl)-N-(2-methoxy ethyl)-3-amino propionate, methyl N-(2-cyanoethyl)-N-(2-hydroxy ethyl)-3-amino propionate, methyl N-(2-acetoxy ethyl)-N-(2-cyanoethyl)-3-amino propionate, N-(2-cyanoethyl)-N-ethyl-3-amino propiononitrile, N-(2-cyanoethyl)-N-(2-hydroxy ethyl)-3-amino propiononitrile, N-(2-acetoxy ethyl)-N-(2-cyanoethyl)-3-amino propiononitrile, N-(2-cyanoethyl)-N-(2-formyl oxy-ethyl)-3-amino propiononitrile, N-(2-cyanoethyl)-N-(2-methoxy ethyl)-3-amino propiononitrile, N-(2-cyanoethyl)-N-[2-(methoxy methoxy)ethyl]-3-amino propiononitrile, N-(2-cyanoethyl)-N-(3-hydroxy-1-propyl)-3-amino propiononitrile, N-(3-acetoxy-1-propyl)-N-(2-cyanoethyl)-3-amino propiononitrile, N-(2-cyanoethyl)-N-(3-formyloxy-1-propyl)-3-amino propiononitrile, N-(2-cyanoethyl)-N-tetrahydrofurfuryl-3-amino propiononitrile, N,N-bis(2-cyanoethyl)-3-amino propiononitrile, diethyl amino acetonitrile, N,N-bis(2-hydroxy ethyl)amino acetonitrile, N,N-bis(2-acetoxy ethyl)amino acetonitrile, N,N-bis(2-formyl oxy-ethyl) amino acetonitrile, N,N-bis(2-methoxy ethyl)amino acetonitrile, N,N-bis[2-(methoxy methoxy)ethyl]amino acetonitrile, methyl N-cyanomethyl-N-(2-methoxy ethyl)-3-amino propionate, methyl N-cyanomethyl-N-(2-hydroxy ethyl)-3-amino propionate, methyl N-(2-acetoxy ethyl)-N-cyanomethyl-3-amino propionate, N-cyanomethyl-N-(2-hydroxy ethyl) amino acetonitrile, N-(2-acetoxy ethyl)-N-(cyanomethyl) amino acetonitrile, N-cyanomethyl-N-(2-formyloxy-ethyl) amino acetonitrile, N-cyanomethyl-N-(2-methoxy ethyl) amino acetonitrile, N-cyanomethyl-N-[2-(methoxy methoxy)ethyl]amino acetonitrile, N-(cyanomethyl)-N-(3-hydroxy-1-propyl)amino acetonitrile, N-(3-acetoxy-1-propyl)-N-(cyanomethyl)amino acetonitrile, N-cyanomethyl-N-(3-formyloxy-1-propyl)amino acetonitrile, N,N-bis (cyanomethyl)amino acetonitrile, 1-pyrrolidine propiononitrile, 1-piperidine propiononitrile, 4-morpholine propiononitrile, 1-pyrrolidine acetonitrile, 1-piperidine acetonitrile, 4-morpholine acetonitrile, cyanomethyl 3-diethyl amino propionate, cyanomethyl N,N-bis(2-hydroxyethyl)-3-amino propionate, cyanomethyl N,N-bis (2-acetoxy ethyl)-3-amino propionate, cyanomethyl N,N-bis(2-formyloxy-ethyl)-3-amino propionate, cyanomethyl N,N-bis(2-methoxy ethyl)-3-amino propionate, cyanomethyl N,N-bis [2-(methoxy methoxy)ethyl]-3-amino propionate, (2-cyanoethyl) 3-diethyl amino propionate, (2-cyanoethyl)N,N-bis(2-hydroxy ethyl)-3-amino propionate, (2-cyanoethyl) N,N-bis(2-acetoxyethyl)-3-amino propionate, (2-cyanoethyl)N,N-bis(2-formyl oxy-ethyl)-3-amino propionate, (2-cyanoethyl)N,N-bis(2-methoxy ethyl)-3-amino propionate, (2-cyanoethyl)N,N-bis[2-(methoxy methoxy)ethyl]-3-amino propionate, cyanomethyl 1-pyrrolidine propionate, cyanomethyl 1-piperidine propionate, cyanomethyl 4-morpholine propionate, (2-cyanoethyl) 1-pyrrolidine propionate, (2-cyanoethyl) 1-piperidine propionate, (2-cyanoethyl) 4-morpholine propionate, and the like.

The addition amount of the basic compound to the resist composition of the present invention is preferably 0.001 to 2 parts, more preferably 0.01 to 1 parts to 100 part of a base resin. The addition amount of 0.001 parts or more provides sufficient effects of adding the, basic compound. The addition amount of 2 parts or less provides sufficient sensitivity.

As a compound which has the group represented by ≡C—COOH in the molecule which can be added to the resist composition of the present invention, for example, one or more kinds of compounds selected from the following group I and group II can be used, but it is not limited thereto. By blending this component, PED (Post Exposure Delay) stability of a resist, and edge roughness on a nitride film substrate are improved.

[Group I]

The compounds wherein some or all hydrogen atoms of phenolic hydroxyl groups of the compound represented by the following general formulae (A1)-(A10) are substituted with —$R^{401}$—COOH ($R^{401}$ represents a linear or branched alkylene group having 1-10 carbon atoms), and a mole ratio of the phenolic hydroxyl group (C) and the group (D) represented by ≡C—COOH in a molecule is as follows:

C/(C+D)=0.1 to 1.0.

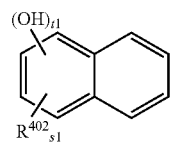  (A1)

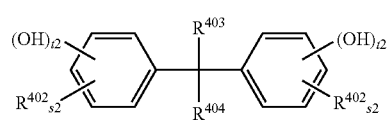  (A2)

-continued

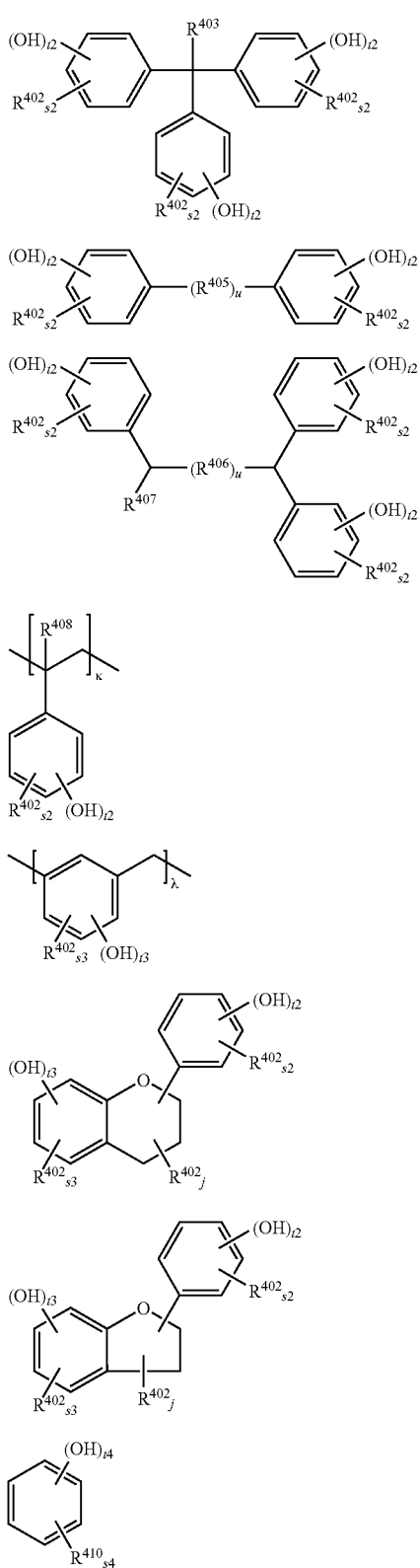

(A3)
(A4)
(A5)
(A6)
(A7)
(A8)
(A9)
(A10)

In the formulae, $R^{408}$ represents a hydrogen atom or a methyl group. $R^{402}$ and $R^{403}$ independently represent a hydrogen atom or a linear or branched alkyl group or alkenyl group having 1-8 carbon atoms. $R^{404}$ represents a hydrogen atom or a linear or branched alkyl group or alkenyl group having 1-8 carbon atoms, or $-(R^{409})_h-COOR'$ (R' represents a hydrogen atom or $-R^{409}-COOH$). $R^{405}$ represents $-(CH_2)_i-$ (i=2-10), an arylene group having 6-10 carbon atoms, a carbonyl group, a sulfonyl group, an oxygen atom, or a sulfur atom. $R^{406}$ represents an alkylene group having 1-10 carbon atoms, an arylene group having 6-10 carbon atoms, a carbonyl group, a sulfonyl group, an oxygen atom, or a sulfur atom. $R^{407}$ represents a hydrogen atom or a linear or branched alkyl group or alkenyl group having 1-8 carbon atoms, a phenyl group or a naphthyl group substituted with a hydroxyl group. $R^{409}$ represents a linear or branched alkyl group or alkenyl group having 1-10 carbon atoms, or a $-R^{411}-COOH$ group. $R^{410}$ represents a hydrogen atom or a linear or branched alkyl group or alkenyl group having 1-8 carbon atoms, or $-R^{411}-COOH$ group. $R^{411}$ represents a linear or branched alkylene group having 1-10 carbon atoms. h is an integer of 1-4. j is the number of 0 to 3. Each of s1 to s4 and t1 to t4 satisfies s1+t1=8, s2+t2=5, s3+t3=4, and s4+t4=6, and is the number that makes at least one hydroxyl group exist in each phenyl skeleton. u is an integer of 1 to 4. κ is the number that makes the mass average molecular weight of the compound represented by the formula (A6) fall within the range of 1,000 to 5,000. λ is the number that makes the mass average molecular weight of the compound represented by the formula (A7) fall within the range of 1,000 to 10,000.

[Group II]

The compounds represented by the following general formulae (A11) to (A15).

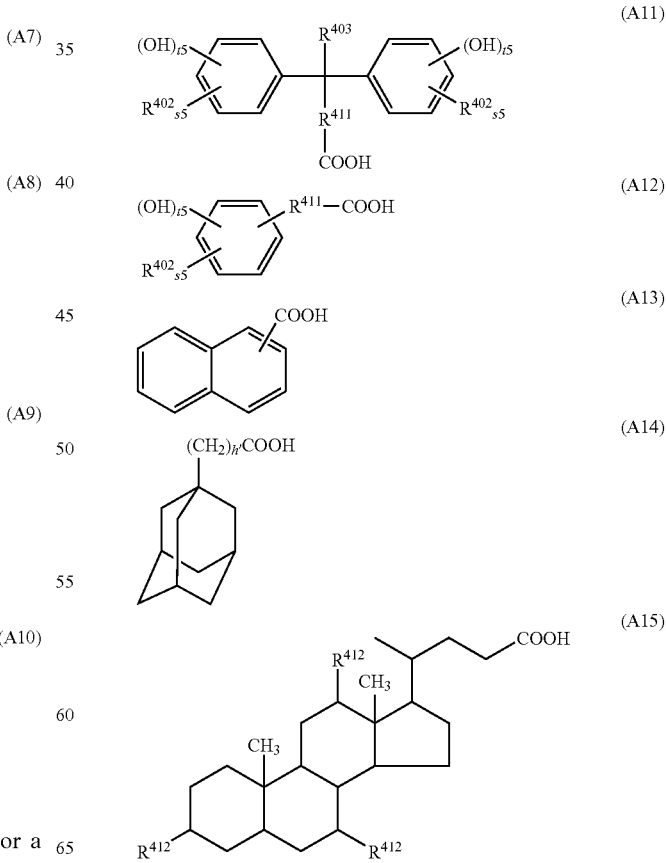

(A11)
(A12)
(A13)
(A14)
(A15)

In the formulae, $R^{402}$, $R^{403}$, and $R^{411}$ represent the same as explained above. $R^{412}$ represents a hydrogen atom or a hydroxyl group. s5 and t5 are the number which satisfy: $s5 \geqq 0$, $t5 \geqq 0$, and $s5+t5=5$. h' is 0 or 1.

Illustrative examples of the above compounds may include compounds represented by the following general formulae (AI-1) to (AI-14) and (AII-1) to (AII-10). However, it is not limited thereto.

(AI-1)
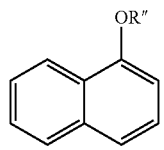

(AI-2)
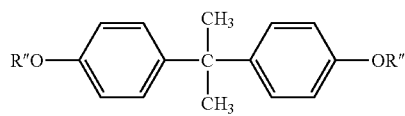

(AI-3)
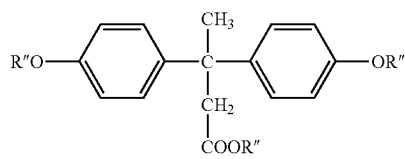

(AI-4)
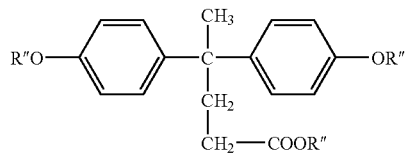

(AI-5)
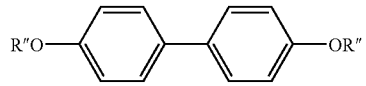

(AI-6)
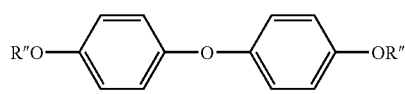

(AI-7)
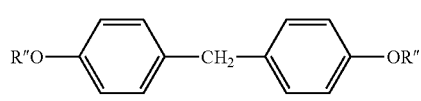

(AI-8)
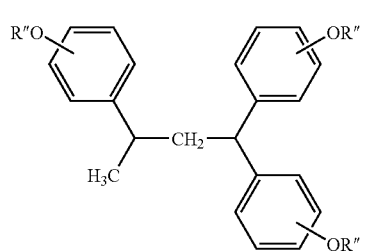

-continued (AI-9)
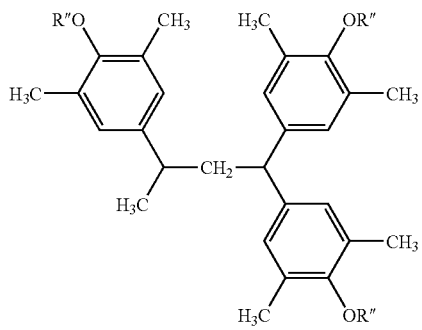

(AI-10)
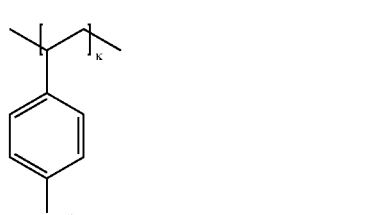

(AI-11)
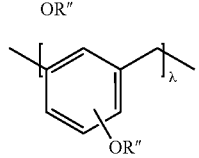

(AI-12)
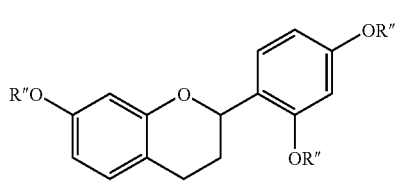

(AI-13)
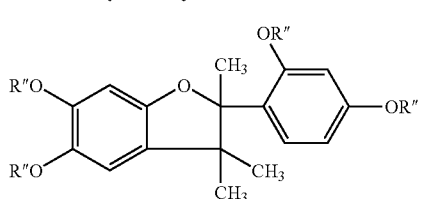

(AI-14)
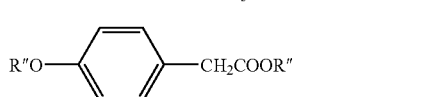

In the forumlae, R" represents a hydrogen atom or a —CH$_2$COOH group, and 10 to 100 mole % of R" represents a —CH$_2$COOH group in each compound. κ and λ represents the same as mentioned above.

(AII-1)
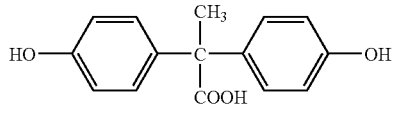

(AII-2)
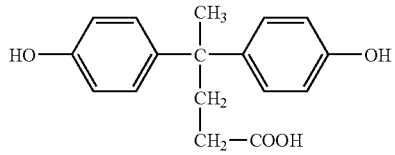

-continued

 (AII-3)

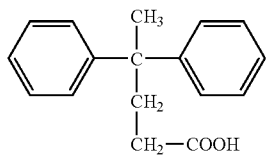 (AII-4)

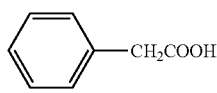 (AII-5)

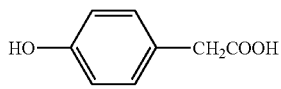 (AII-6)

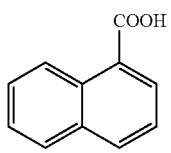 (AII-7)

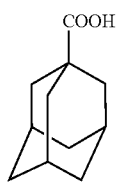 (AII-8)

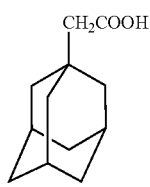 (AII-9)

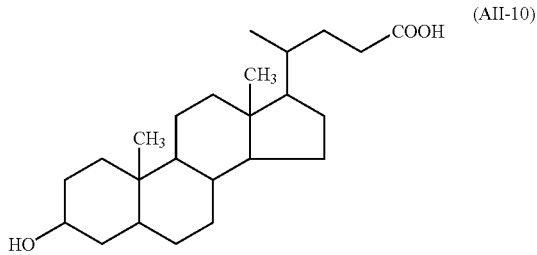 (AII-10)

An addition amount of the compound which has the ≡C—COOH group in a molecule is 0 to 5 parts, preferably 0.1 to 5 parts, more preferably 0.1 to 3 parts, still more preferably 0.1 to 2 parts to 100 parts of the base resin. When the addition amount is 5 parts or less, there is little possibility that resolution of the resist composition is degraded.

A surfactant for improving application property and so on can be further added to a resist composition, in particular to a chemically amplified positive resist composition, according to the present invention.

The surfactant is not restricted. Examples thereof may include: nonionic surfactants such as polyoxyethylene alkyl ethers, such as polyoxyethylene lauryl ether, polyethylene stearyl ether, polyoxyethylene cetyl ether, or polyoxyethylene olein ether; polyoxyethylene alkyl aryl ethers such as polyoxyethylene octyl-phenol ether, or polyoxyethylene nonyl phenol; polyoxyethylene polyoxy propylene block copolymers; sorbitan fatty acid esters such as sorbitan monolaurate, sorbitan monopalmitate, or sorbitan monostearate; polyoxyethylene sorbitan fatty acid esters such as polyoxyethylene sorbitan monolaurates, polyoxyethylene sorbitan monopalmitate, polyoxyethylene sorbitanmonostearate, polyoxyethylene sorbitan trioleate, polyoxyethylene sorbitan tristearate; fluorinated surfactants such as EFTOP EF301, EF303 and EF352 (Tohchem), MEGAFACE F171, F172, and F173 (manufactured by Dainippon Ink Industry), Fluorad FC-430, FC-431 (manufactured by Sumitomo 3M), Asahiguard AG710, Surflon S-381, S-382, SC101, SC102, SC103, SC104, SC105 and SC106, Surfynol E1004, KH-10, KH-20, KH-30 and KH-40 (manufactured by Asahi Glass Co., Ltd.); organo siloxane polymer KP-341, X-70-092, X-70-093 (manufactured by Shin-Etsu Chemical Co., Ltd.), acrylic or methacrylic POLYFLOW No. 75, No. 95 (KYOEISHA CHEMICAL), or the like. Among the surfactants, Fluorad FC430, Surflon S-381, Surfynol E1004, KH-20 and KH-30 are preferably used. Above surfactants may be used alone or in admixture.

An addition amount of the surfactant to a resist composition, in particular to a chemically amplified positive resist composition, according to the present invention is 2 parts or less, preferably 1 part or less to 100 parts of a base resin in the resist composition.

In the case of using a resist composition, in particular a chemically amplified positive resist composition containing an organic solvent, the polymer, an acid generator and the like, according to the present invention for manufacturing various integrated circuits, known lithography techniques can be used. However, the manufacturing is not limited to the known lithography techniques.

For example, the resist composition according to the present invention is applied on a substrate for manufacturing integrated circuits such as Si, $SiO_2$, SiN, SiON, TiN, WSi, BPSG, SOG, an organic antireflection coating, Cr, CrO, CrON, or MoSi by an appropriate coating method such as spin coating, roll coating, flow coating, dip coating, spray coating, or doctor coating so that the thickness of the coated film is 0.1 to 2.0 μm, and is prebaked on a hot plate at 60 to 150° C. for 1 to 10 minutes, preferably at 80 to 120° C. for 1 to 5 minutes. Subsequently, a target pattern is exposed through a predetermined mask with a light source selected from ultraviolet ray, far ultraviolet ray, electron beam, X-ray, excimer lasers, γ ray, synchrotron-radiation and the like, preferably at an exposure wavelength of 300 nm or less, more preferably at an exposure wavelength in the range of 180 to 200 nm. The exposure dose is about 1 to 200 mJ/cm², preferably about 10 to 100 mJ/cm$^2$. Next, post exposure baking (PEB) is conducted on a hot plate at 60 to 150° C. for 1 to 5 minutes, preferably at 80 to 120° C. for 1 to 3 minutes.

Next, the target pattern is formed on the substrate by developing for 0.1 to 3 minutes, preferably for 0.5 to 2 minutes with a developer of an aqueous alkali solution such as 0.1 to 5 mass %, preferably 2 to 3 mass % tetramethyl ammonium hydroxide (TMAH), according to a conventional method, such as a dip method, a puddle method, or a spray method. The resist composition of the present invention is extremely suitable for micropatterning with a high-energy beam, in particular, a far ultraviolet ray at a wavelength of 254 to 193 nm, a vacuum ultraviolet radiation at a wavelength of 157 nm, electron beam, soft X ray, X-ray, excimer lasers, γ ray, synchrotron-radiation, more preferably with a high energy beam at a wavelength of 200 nm or less, in particular in the range of 180 to 200 nm.

Moreover, the resist composition according to the present invention can be applicable to the liquid immersion lithography. In ArF immersion lithography, pure water is used as an immersion solvent. In the liquid immersion lithography, exposure to radiation is conducted with inserting water between the pre-baked resist film and a projection lens. The liquid immersion lithography can enhance a numerical aperture (NA) of a projection lens to be 1.0 or more, and thereby improving resolution. Consequently, the liquid immersion lithography is an important technology for carrying on ArF lithography until 65 nm node, and the development of the liquid immersion lithography has been accelerated.

A lactone ring, which has been used conventionally as a hydrophilic group of ArF resist, has a solubility in both an aqueous alkaline solution and water. When a lactone or an acid anhydride such as maleic anhydride or itaconic anhydride, which has high solubility in water, is used as a hydrophilic group, water infiltrates through the resist surface by immersion in water, and this causes a problem that the resist surface swells. However, hydroxynaphthalene is soluble in an aqueous alkaline solution, but insoluble in water at all. Consequently, it is considered that influence of the dissolution and the swelling caused by immersion is small.

EXAMPLE

Synthetic Examples, Comparative Synthetic Examples, Examples, and Comparative Example will be shown and the present invention will be explained in detail hereafter. However, the present invention is not restricted to the following Examples.

Incidentally, mass-average molecular weight (Mw) means mass-average molecular weight relative to polystyrene standard measured with GPC.

Synthetic Example 1

To a 100 mL flask were added 5.78 g of 1-hydroxy-5-naphthyl, 3.2 g of 4-(1-oxo-2-propenyloxy)phenyl diphenylfonium perfluoro-n-butane sulfonate, 6.9 g of 3-ethyl-3-exotetracyclo[4.4.0.1$^{2,5}$.1$^{7,10}$]dodecanyl methacrylate, and 10.8 g of 3-oxo-2,7-dioxatricyclo[4.2.1.0$^{4,8}$]nonane-9-yl methacrylate, and 30 g of tetrahydrofuran as a solvent. This reaction vessel was cooled to −70° C. under nitrogen atmosphere, and degasing under reduced pressure and nitrogen flowing were repeated 3 times. 0.2 g of AIBN (2,2'-azobisisobutyronitrile) was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 23.5 g of white polymer was obtained.

The obtained polymer was analyzed by $^{13}$C, $^1$H-NMR and GPC measurement, and the following results were obtained.
Copolymerization ratio (mole ratio)
a11:b11:c11:d11=0.25:0.05:0.45:0.25
Mass-average molecular weight (Mw)=8,900
Molecular-weight distribution (Mw/Mn)=1.72
The polymer is defined as Polymer 1.

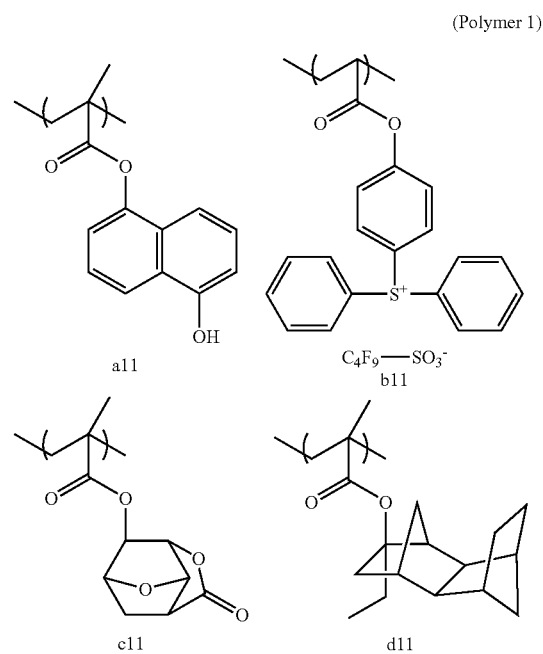

(Polymer 1)

Synthetic Example 2

To a 100 mL flask were added 4.6 g of 5-hydroxy-1-naphthyl methacrylate, 3.2 g of 4-(1-oxo-2-propenyloxy)phenyl diphenylfonium perfluoro-n-butane sulfonate, 7.4 g of 2-ethyl-2-adamantane methacrylate, 4.7 g of 3-hydroxy-1-adamantyl methacrylate, and 5.6 g of 3-oxo-2,7-dioxatricyclo[4.2.1.0$^{4,8}$]nonane-9-yl methacrylate, and 30 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 22.7 g of white polymer was obtained.

The obtained polymer was analyzed by $^{13}$C, $^1$H-NMR and GPC measurement, and the following results were obtained.
Copolymerization ratio (mole ratio)
a11:b11:c11:d12:e11=0.20:0.05:0.25:0.30:0.20
Mass-average molecular weight (Mw)=8,500
Molecular-weight distribution (Mw/Mn)=1.78

The polymer is defined as Polymer 2.

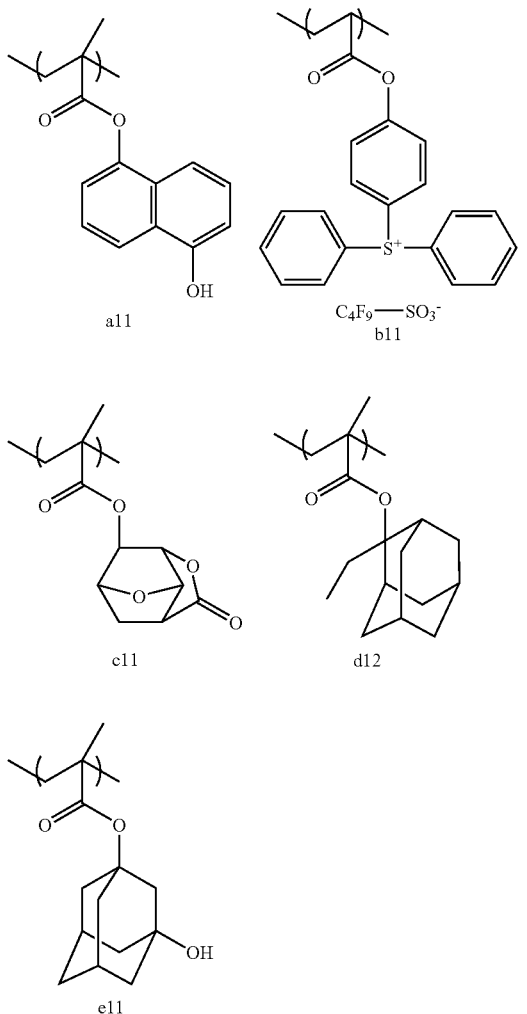

(Polymer 2)

Synthetic Example 3

To a 100 mL flask were added 4.6 g of 5-hydroxy-1-vinyl-naphthalene, 3.2 g of 4-(1-oxo-2-propenyloxy)phenyl diphenylfonium perfluoro-n-butane sulfonate, 6.9 g of 3-ethyl-3-exotetracyclo[4.4.0.1$^{2,5}$.1$^{7,10}$]dodecanyl methacrylate, and 10.8 g of 3-oxo-2,7-dioxatricyclo[4.2.1.0$^{4,8}$]nonane-9-yl methacrylate, and 30 g of tetrahydrofuran as a solvent. This reaction vessel was cooled to −70° C. under nitrogen atmosphere, and degasing under reduced pressure and nitrogen flowing were repeated 3 times. 0.2 g of AIBN (2,2'-azobisisobutyronitrile) was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 22.8 g of white polymer was obtained.

The obtained polymer was analyzed by $^{13}$C, $^1$H-NMR and GPC measurement, and the following results were obtained.

Copolymerization ratio (mole ratio)

a12:b11:c11:d11=0.25:0.05:0.45:0.25

Mass-average molecular weight (Mw)=8,100

Molecular-weight distribution (Mw/Mn)=1.79

The polymer is defined as Polymer 3.

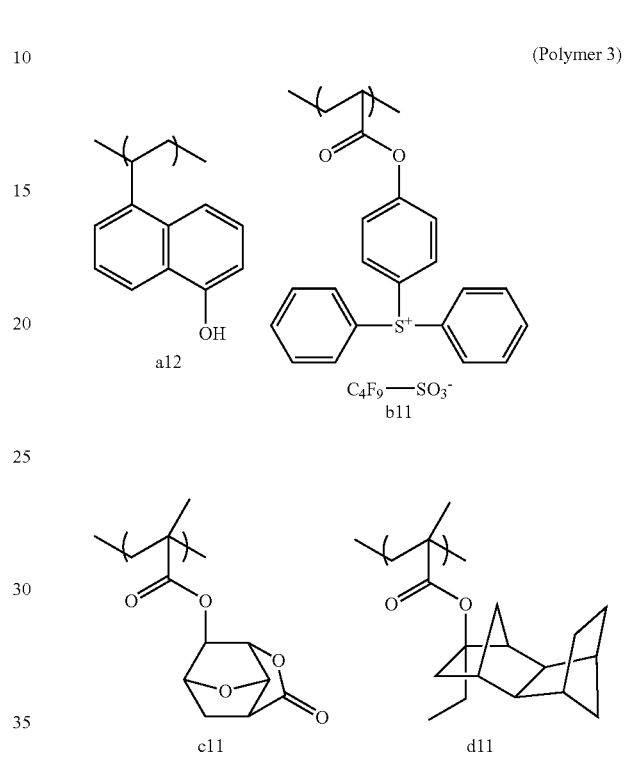

(Polymer 3)

Synthetic Example 4

To a 100 mL flask were added 6.8 g of 1-hydroxy-5-naphthyl methacrylate, 3.2 g of 4-(1-oxo-2-propenyloxy)phenyl diphenylfonium perfluoro-n-butane sulfonate, 6.3 g of 1-(7-oxanorbornane-2-yl)cyclopentyl, and 9.0 g of 3-oxo-2,7-dioxatricyclo[4.2.1.0$^{4,8}$]nonane-9-yl methacrylate, and 30 g of tetrahydrofuran as a solvent. This reaction vessel was cooled to −70° C. under nitrogen atmosphere, and degasing under reduced pressure and nitrogen flowing were repeated 3 times. 0.2 g of AIBN (2,2'-azobisisobutyronitrile) was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 22.3 g of white polymer was obtained.

The obtained polymer was analyzed by $^{13}$C, $^1$H-NMR and GPC measurement, and the following results were obtained.

Copolymerization ratio (mole ratio)

a11:b11:c11:d13=0.30:0.05:0.40:0.25

Mass-average molecular weight (Mw)=8,900

Molecular-weight distribution (Mw/Mn)=1.72

The polymer is defined as Polymer 4.

The polymer is defined as Polymer 5.

(Polymer 4)

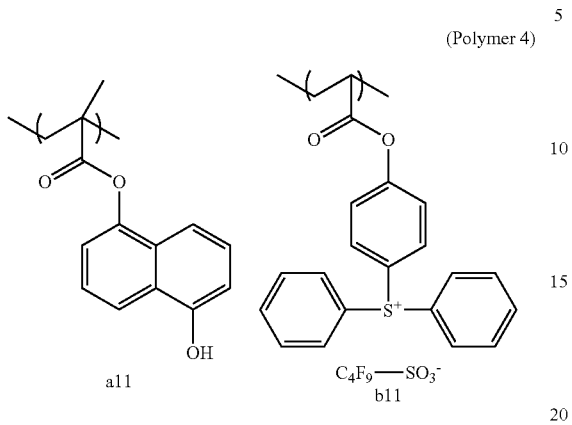

(Polymer 5)

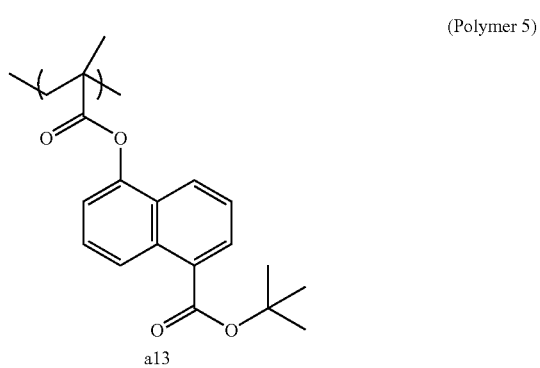

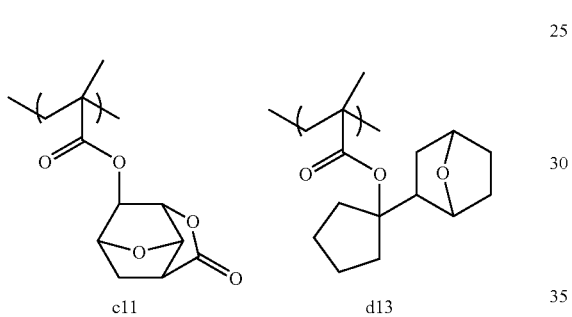

Synthetic Example 5

To a 100 mL flask were added 12.5 g of 5-t-butoxycarbonyl-1-naphthyl methacrylate, 3.2 g of 4-(1-oxo-2-propenyloxy)phenyl diphenylfonium perfluoro-n-butane sulfonate, 12.1 g of 5-oxo-4-oxatricyclo[4.2.1.0$^{3,7}$]nonane-2-yl methacrylate, and 30 g of tetrahydrofuran as a solvent. This reaction vessel was cooled to −70° C. under nitrogen atmosphere, and degasing under reduced pressure and nitrogen flowing were repeated 3 times. 0.2 g of AIBN (2,2'-azobisisobutyronitrile) was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 24.5 g of white polymer was obtained.

The obtained polymer was analyzed by $^{13}$C, $^{1}$H-NMR and GPC measurement, and the following results were obtained.

Copolymerization ratio (mole ratio)

a13:b11:c12=0.40:0.05:0.55

Mass-average molecular weight (Mw)=8,100

Molecular-weight distribution (Mw/Mn)=1.67

Synthetic Example 6

To a 100 mL flask were added 12.5 g of 5-t-butoxycarbonyl-1-naphthyl methacrylate, 3.2 g of 4-(1-oxo-2-propenyloxy)phenyl diphenylfonium perfluoro-n-butane sulfonate, 13.8 g of 4-oxatricyclo[5.2.2.0$^{2,8}$]undecane-3-one 8(9)-methacrylate, and 30 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 30.2 g of white polymer was obtained.

The obtained polymer was analyzed by $^{13}$C, $^{1}$H-NMR and GPC measurement, and the following results were obtained.

Copolymerization ratio (mole ratio)

a13:b11:c13=0.40:0.05:0.55

Mass-average molecular weight (Mw)=8,700

Molecular-weight distribution (Mw/Mn)=1.62

The polymer is defined as Polymer 6.

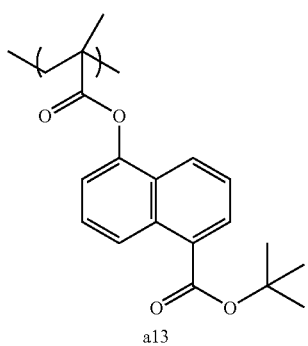
(Polymer 6)
a13

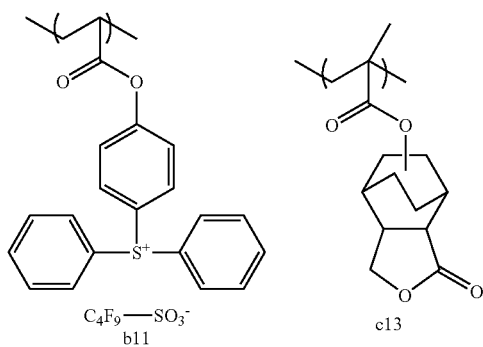
b11   c13

Synthetic Example 7

To a 100 mL flask were added 14.6 g of 1-hydroxy-5-naphthyl methacrylate, 6.5 g of 4-(1-oxo-2-methyl-2-propenyloxy)phenyl diphenylfonium perfluoro-n-butane sulfonate, and 6.9 g of 3-ethyl-3-exotetracyclo[4.4.0.1$^{2,5}$.1$^{7,10}$]dodecanyl methacrylate, and 40 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 24.8 g of white polymer was obtained.

The obtained polymer was analyzed by $^{13}$C, $^{1}$H-NMR and GPC measurement, and the following results were obtained.

Copolymerization ratio (mole ratio)

a11:b12:d11=0.65:0.10:0.25

Mass-average molecular weight (Mw)=8,100

Molecular-weight distribution (Mw/Mn)=1.45

The polymer is defined as Polymer 7.

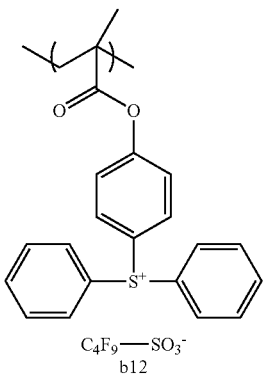
(Polymer 7)
a11   b12

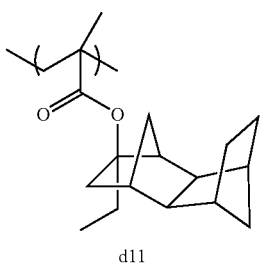
d11

Synthetic Example 8

To a 100 mL flask were added 12.0 g of 5-hydroxy-1-vinylnaphthalene, 6.5 g of 4-(1-oxo-2-methyl-2-propenyloxy)phenyl diphenylfonium perfluoro-n-butane sulfonate, and 6.9 g of 3-ethyl-3-exotetracyclo[4.4.0.1$^{2,5}$.1$^{7,10}$]dodecanyl methacrylate, and 40 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 22.6 g of white polymer was obtained.

The obtained polymer was analyzed by $^{13}$C, $^{1}$H-NMR and GPC measurement, and the following results were obtained.

Copolymerization ratio (mole ratio)

a12:b12:d11=0.65:0.10:0.25

Mass-average molecular weight (Mw)=7,300

Molecular-weight distribution (Mw/Mn)=1.46

The polymer is defined as Polymer 8.

The polymer is defined as Polymer 9.

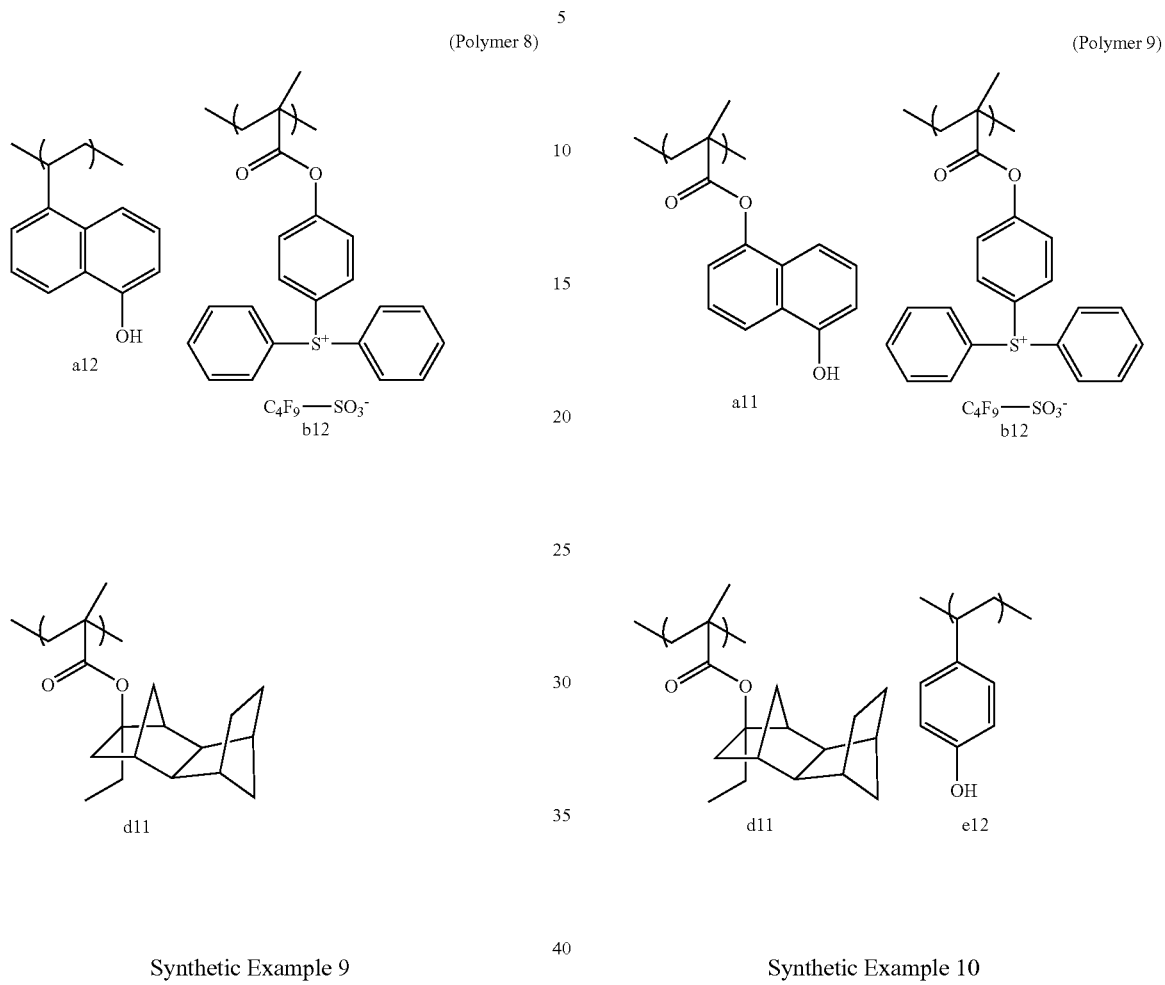

(Polymer 8)

(Polymer 9)

Synthetic Example 9

To a 100 mL flask were added 8.0 g of 1-hydroxy-5-methacrylate, 6.5 g of 4-(1-oxo-2-methyl-2-propenyloxy)phenyl diphenylfonium perfluoro-n-butane sulfonate, 6.9 g of 3-ethyl-3-exotetracyclo[4.4.0.1$^{2,5}$.1$^{7,10}$]dodecanyl methacrylate, and 3.6 g of 4-hydroxystyrene, and 40 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 22.8 g of white polymer was obtained.

The obtained polymer was analyzed by $^{13}$C, $^{1}$H-NMR and GPC measurement, and the following results were obtained.

Copolymerization ratio (mole ratio)

a11:b12:d11:e12=0.35:0.10:0.25:0.30

Mass-average molecular weight (Mw)=9,300

Molecular-weight distribution (Mw/Mn)=1.63

Synthetic Example 10

To a 100 mL flask were added 9.2 g of 5-hydroxy-1-vinylnaphthalene, 6.5 g of 4-(1-oxo-2-methyl-2-propenyloxy)phenyl diphenylfonium perfluoro-n-butane sulfonate, and 12.5 g of 5-t-butoxycarbonyl-1-naphthyl methacrylate, and 40 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 25.5 g of white polymer was obtained.

The obtained polymer was analyzed by $^{13}$C, $^{1}$H-NMR and GPC measurement, and the following results were obtained.

Copolymerization ratio (mole ratio)

a12:a13:b12=0.50:0.40:0.10

Mass-average molecular weight (Mw)=8,900

Molecular-weight distribution (Mw/Mn)=1.45

The polymer is defined as Polymer 10.

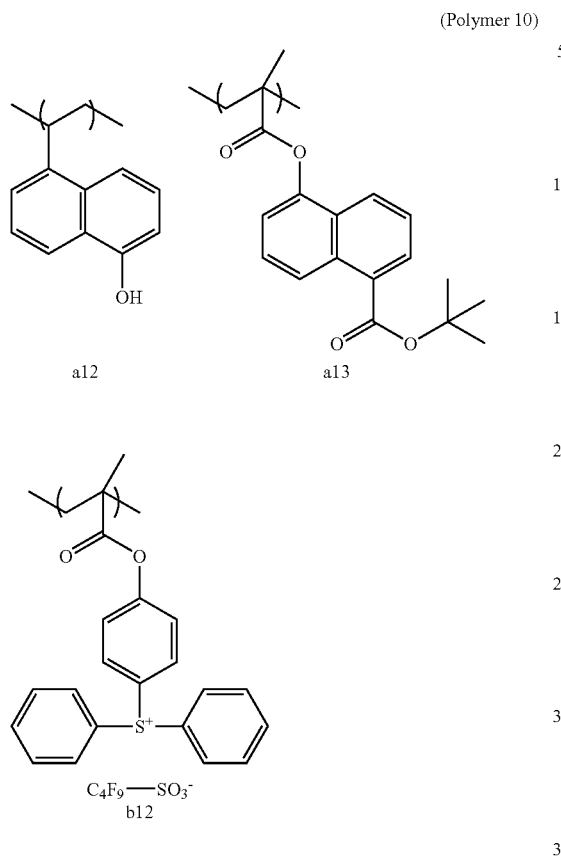

(Polymer 10)

a12   a13

C₄F₉—SO₃⁻
b12

Synthetic Example 11

To a 100 mL flask were added 7.4 g of 6-acetoxy-2-vinyl-naphthalene, 6.5 g of 4-(1-oxo-2-methyl-2-propenyloxy) phenyl diphenylfonium perfluoro-n-butane sulfonate, 6.9 g of 3-ethyl-3-exotetracyclo[4.4.0.1$^{2,5}$.1$^{7,10}$]dodecanyl methacrylate, and 4.8 g of 4-acetoxystyrene, and 40 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. The obtained white solid was dissolved again in 50 mL of methanol and 80 mL of tetrahydrofuran. To this solution were added 5 g of triethylamine and 5 g of water. And deprotection reaction of an acetyl group was conducted at 40° C. for 5 hours. The reaction solution was neutralized with acetic acid. The reaction solution was concentrated, and then was dissolved in 50 mL of acetone. Then, precipitation, filtration, drying at 60° C. as with above were conducted, and 20.2 g of white polymer was obtained.

The obtained polymer was analyzed by $^{13}$C, $^1$H-NMR and GPC measurement, and the following results were obtained.

Copolymerization ratio (mole ratio)
a14:b12:d11:e12=0.35:0.10:0.25:0.30
Mass-average molecular weight (Mw)=8,600
Molecular-weight distribution (Mw/Mn)=1.84

The polymer is defined as Polymer 11.

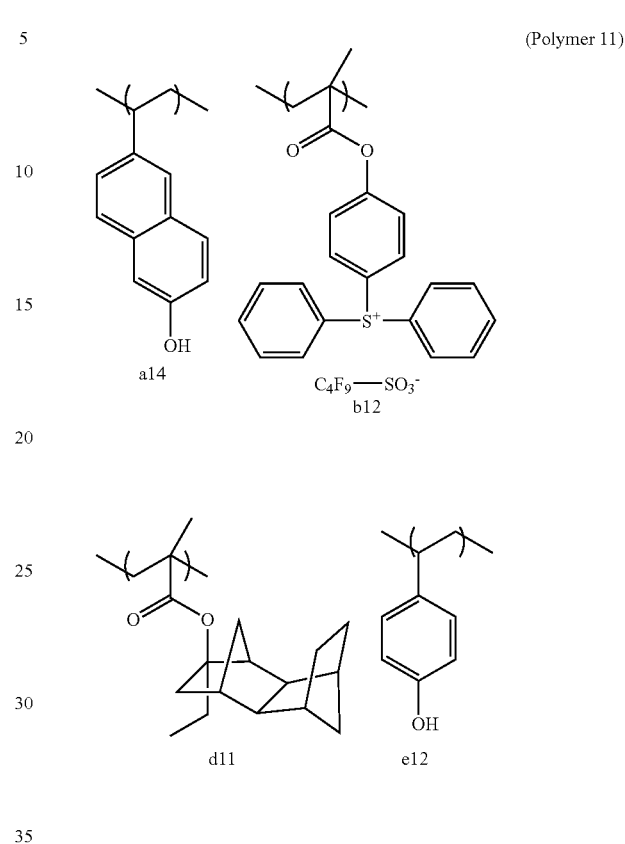

(Polymer 11)

a14

C₄F₉—SO₃⁻
b12 d11   e12

Synthetic Example 12

To a 100 mL flask were added 7.4 g of 6-acetoxy-2-vinyl-naphthalene, 6.9 g of 4-(1-oxo-2-methyl-2-propenyloxy)-1, 6-dimethylphenyl diphenylfonium perfluoro-n-butane sulfonate, 6.9 g of 3-ethyl-3-exotetracyclo[4.4.0.1$^{2,5}$.1$^{7,10}$] dodecanyl methacrylate, and 4.8 g of 4-acetoxystyrene, and 40 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. The obtained white solid was dissolved again in 50 mL of methanol and 80 mL of tetrahydrofuran. To this solution were added 5 g of triethylamine and 5 g of water. And deprotection reaction of an acetyl group was conducted at 40° C. for 5 hours. The reaction solution was neutralized with acetic acid. The reaction solution was concentrated, and then was dissolved in 50 mL of acetone. Then, precipitation, filtration, drying at 60° C. as with above were conducted, and 20.5 g of white polymer was obtained.

The obtained polymer was analyzed by $^{13}$C, $^1$H-NMR and GPC measurement, and the following results were obtained.

Copolymerization ratio (mole ratio)
a14:b13:d11:e12=0.35:0.10:0.25:0.30
Mass-average molecular weight (Mw)=8,800
Molecular-weight distribution (Mw/Mn)=1.87

The polymer is defined as Polymer 12.

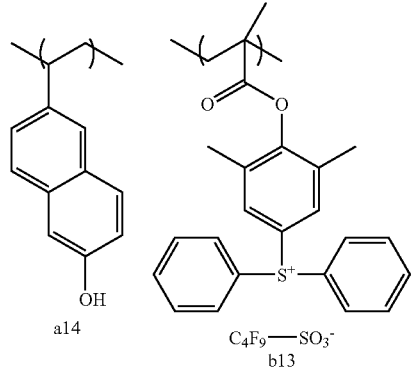

(Polymer 12)

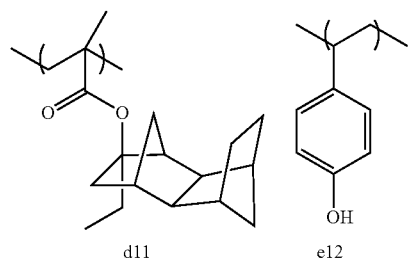

Comparative Synthetic Example 1

To a 100 mL flask were added 8.7 g of 2-ethyl-2-adamantane methacrylate, 7.5 g of 3-hydroxy-1-adamantyl methacrylate, 7.3 g of 5-oxo-4-oxatricyclo[4.2.1.0$^{3,7}$]nonane-2-yl methacrylate, and 30 g of tetrahydrofuran as a solvent. This reaction vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 19.5 g of white polymer was obtained.

The obtained polymer was analyzed by $^{13}$C, $^{1}$H-NMR and GPC measurement, and the following results were obtained.

Copolymerization ratio (mole ratio)

c12:d12:e11=0.35:0.35:0.30

Mass-average molecular weight (Mw)=8,900

Molecular-weight distribution (Mw/Mn)=1.83

The polymer is defined as Comparative Polymer 1.

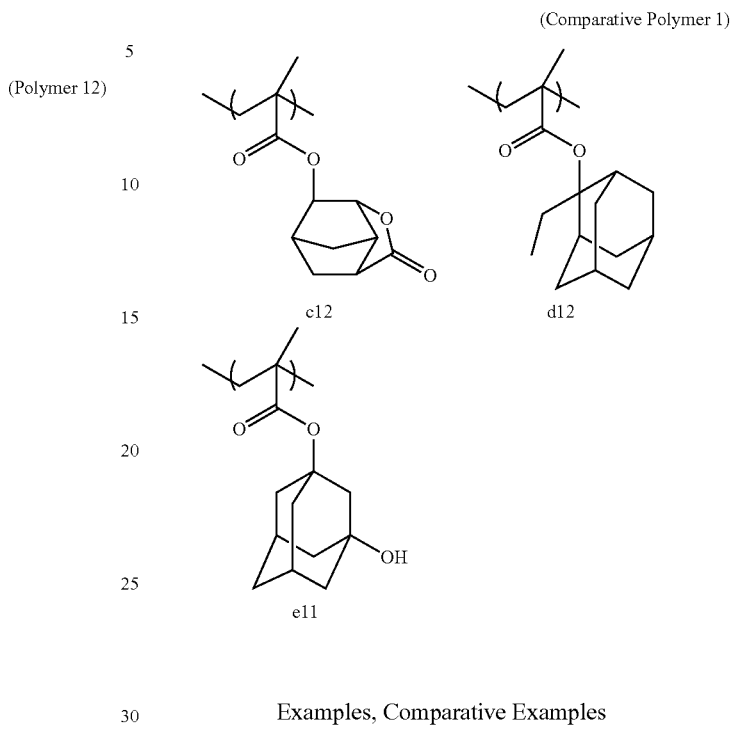

(Comparative Polymer 1)

Examples, Comparative Examples

[Preparation of Positive Resist Composition]

The Polymers synthesized above (Polymers 1 to 9 and Comparative polymer 1), an acid generator (PAG1), a basic compound (triethanolamine, TMMEA, AAA, AACN), a dissolution inhibitor (DRI-1) represented by the following formulae were dissolved into an organic solvent at composition shown in the Table 1 to prepare resist compositions. Then, the compositions were filtered through 0.2 μm filters to prepare resist solutions, respectively.

Each composition in the Table 1 is as follows.

Polymer 1 to Polymer 9: obtained from Synthetic Examples 1 to 9

Comparative Polymer 1: obtained from Comparative Synthetic Example 1

Acid Generator: PAG1 (refer to the following structural formula)

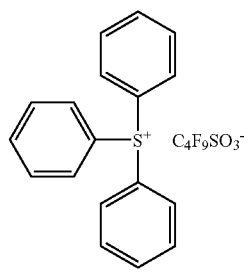

PAG1

Basic Compound: TMMEA, AAA, AACN (refer to the following structural formulae)

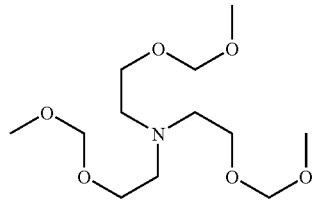
TMMEA

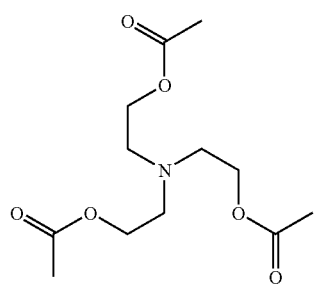
AAA

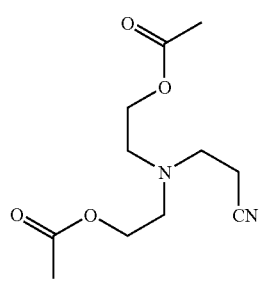
AACN

Dissolution Inhibitor: DRI-1 (refer to the following structural formula)

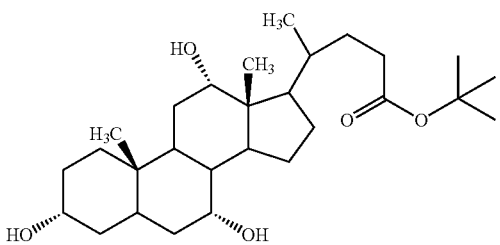
DRI-1

Organic Solvent: PGMEA (propylene glycol methyl ether acetate)

[Evaluation of Exposure Patterning]

Each of thus-prepared solutions of the resist compositions (Examples 1 to 15 and Comparative example 1) was spin-coated onto a silicon wafer which was subjected to HMDS vapor prime process, and was baked at 120° C. for 60 seconds on a hot plate to give a 250 nm thick resist film.

The substrates were exposed to radiation with the ArF excimer laser stepper (NSR-S305B, NA=0.68, σ0.85, ⅔ annular illumination, 6% halftone phase shift mask, manufactured by Nikon), were baked at 110° C. for 60 seconds immediately after exposure, and were developed for 60 seconds in 2.38 mass % aqueous solution of tetramethylammonium hydroxide, to give positive patterns.

Each obtained resist pattern was evaluated as follows.

An exposure dose when 0.12 μm line and space was resolved in 1:1 was determined as sensitivity of a resist, and a minimum line width of line and space resolved with the exposure dose was determined as resolution of a resist to be evaluated.

Moreover, Line Edge Roughness of 0.12 μm line and space pattern was measured with the CD-SEM (S-9220 manufactured by Hitachi, LTD.). Resist profile of the pattern was observed with SEM (S 4200 manufactured by Hitachi, LTD.).

Obtained results were shown collectively in the Table 1.

TABLE 1

| Resist Composition | Polymer (parts by mass) | Acid Generator (parts by mass) | Basic Compound (parts by mass) | Dissolution Inhibitor (parts by mass) | Organic Solvent (parts by mass) | Sensitivity (ml/cm$^2$) | Resolution (μm) | Resist Pattern Profile | Line Edge Roughness (3 σ, nm) |
|---|---|---|---|---|---|---|---|---|---|
| Example 1 | Polymer 1 (100) | — | triethanol amine (0.45) | — | PGMEA (800) | 21 | 0.11 | rectangle | 7.6 |
| Example 2 | Polymer 2 (100) | — | triethanol amine (0.45) | — | PGMEA (800) | 18 | 0.11 | rectangle | 6.7 |
| Example 3 | Polymer 3 (100) | — | triethanol amine (0.45) | — | PGMEA (800) | 22 | 0.11 | rectangle | 7.9 |
| Example 4 | Polymer 4 (100) | — | triethanol amine (0.45) | — | PGMEA (800) | 17 | 0.11 | rectangle | 7.8 |
| Example 5 | Polymer 5 (100) | — | triethanol amine (0.45) | — | PGMEA (800) | 14 | 0.11 | rectangle | 7.9 |
| Example 6 | Polymer 6 (100) | — | triethanol amine (0.45) | — | PGMEA (800) | 19 | 0.11 | rectangle | 7.6 |
| Example 7 | Polymer 7 (100) | — | triethanol amine (0.45) | — | PGMEA (800) | 18 | 0.11 | rectangle | 7.7 |
| Example 8 | Polymer 8 (100) | — | triethanol amine (0.45) | — | PGMEA (800) | 17 | 0.11 | rectangle | 7.5 |
| Example 9 | Polymer 9 (100) | — | triethanol amine (0.45) | — | PGMEA (800) | 18 | 0.11 | rectangle | 7.4 |
| Example 10 | Polymer 2 (100) | — | TMMEA (0.6) | — | PGMEA (800) | 21 | 0.11 | rectangle | 7.4 |

TABLE 1-continued

| Resist Composition | Polymer (parts by mass) | Acid Generator (parts by mass) | Basic Compound (parts by mass) | Dissolution Inhibitor (parts by mass) | Organic Solvent (parts by mass) | Sensitivity (ml/cm$^2$) | Resolution (μm) | Resist Pattern Profile | Line Edge Roughness (3 σ, nm) |
|---|---|---|---|---|---|---|---|---|---|
| Example 11 | Polymer 2 (100) | — | AAA (0.6) | — | PGMEA (800) | 19 | 0.11 | rectangle | 7.6 |
| Example 12 | Polymer 2 (100) | — | AACN (0.6) | — | PGMEA (800) | 22 | 0.11 | rectangle | 7.7 |
| Example 13 | Polymer 2 (100) | — | triethanol amine (0.45) | DRI-1 (10) | PGMEA (800) | 16 | 0.11 | rectangle | 7.8 |
| Example 14 | Polymer 7 (50) Comparative Polymer 1 (50) | — | triethanol amine (0.45) | — | PGMEA (800) | 16 | 0.11 | rectangle | 7.6 |
| Example 15 | Polymer 2 (100) | PAG1 (0.5) | triethanol amine (0.30) | — | PGMEA (800) | 14 | 0.11 | rectangle | 8.5 |
| Comparative Example 1 | Comparative Polymer 1 (100) | PAG1 (4.5) | triethanol amine (0.45) | — | PGMEA (800) | 28 | 0.12 | rectangle | 10.5 |

From the results of Table 1, it is obvious that the resist compositions of Examples 1 to 15 shows high resolution. In particular, in the case of using a high-reflectivity substrate with a Si base layer, unevenness due to generation of standing waves is reduced, and Line Edge Roughness is small.

[Observation of Resist Pattern Profile after Pseudo Liquid-Immersion-Exposure]

Next, by using each of the solution of resist composition prepared above (Examples 1 to 15 and Comparative Example 1), a resist film was formed, exposed and developed as with above. And 0.12 μm line and space pattern profile after development was observed.

Moreover, a resist film was formed, exposed and developed as with above, except that a rinse for 300 seconds with pure water was performed between prebake and exposure (this is referred to as "before exposure"), and/or between exposure and PEB (this is referred to as "after exposure") to conduct pseudo liquid-immersion-exposure. And 0.12 μm line and space pattern profile after development was observed.

Obtained results were shown collectively in the Table 2.

TABLE 2

| Resist Composition | Normal Process without Rinse | Process with Rinse Before Exposure | Process with Rinse After Exposure | Process with Rinse Before Exposure and Rinse After Exposure |
|---|---|---|---|---|
| Example 1 | rectangle | rectangle | rectangle | rectangle |
| Example 2 | rectangle | rectangle | rectangle | rectangle |
| Example 3 | rectangle | rectangle | rectangle | rectangle |
| Example 4 | rectangle | rectangle | rectangle | rectangle |
| Example 5 | rectangle | rectangle | rectangle | rectangle |
| Example 6 | rectangle | rectangle | rectangle | rectangle |
| Example 7 | rectangle | rectangle | rectangle | rectangle |
| Example 8 | rectangle | rectangle | rectangle | rectangle |
| Example 9 | rectangle | rectangle | rectangle | rectangle |
| Example 10 | rectangle | rectangle | rectangle | rectangle |
| Example 11 | rectangle | rectangle | rectangle | rectangle |
| Example 12 | rectangle | rectangle | rectangle | rectangle |
| Example 13 | rectangle | rectangle | rectangle | rectangle |
| Example 14 | rectangle | rectangle | rectangle | rectangle |
| Example 15 | rectangle | rectangle | rectangle | rectangle |
| Comparative Example 1 | rectangle | rather taper | rather T-top and taper | rather T-top and taper |

From the results of Table 2, it has been confirmed that the resist compositions according to the present invention (Examples 1 to 15) do not deform after water rinse for a long time in comparison with the Comparative Example 1, thus the resist compositions are adequately applicable to the liquid immersion exposure.

[Evaluation of Electron Beam Lithography]

In evaluation of lithography, the polymers synthesized above were dissolved into an organic solvent according to the composition shown in Table 3, respectively. And these solutions (Examples 16 to 21 and Comparative Example 2) were filtered through 0.2 μm filters to prepare positive resist compositions, respectively.

Each component in the following Table 3 is as follows.

Polymer 7 to Polymer 12: obtained from Synthetic Examples 7 to 12

Comparative Polymer 1: obtained from Comparative Synthetic Example 1

Acid Generator (PAG1) and Organic Solvent (PGMEA) are the same as above.

Each of thus-obtained positive resist composition was spin-coated on a silicon substrate 6 inches (200 mm) across with Clean Track Mark 5 (Manufactured by Tokyo Electron Limited), and was prebaked at 110° C. for 90 seconds on a hot plate to give a 100 nm thick resist film. Lithography was performed on the resist film in a vacuum chamber with HL-800D manufactured by Hitachi Ltd. at 50 keV of HV voltage.

Post exposure bake (PEB) was performed immediately after lithography with Clean Track Mark 5 (Manufactured by Tokyo Electron Limited) at 110° C. for 90 seconds on a hot plate. And the puddle development was performed for 30 seconds in 2.38 mass % aqueous solution of TMAH, to give a positive pattern.

The obtained resist pattern was evaluated as follows.

An exposure dose when 0.12 μm line and space was resolved in 1:1 was determined as sensitivity of resist. And minimum pattern size resolved at the exposure dose was determined as resolution of the resist.

The resist compositions and results of sensitivity and resolution at electron beam exposure were shown in Table 3.

From the results of Table 3, it has been confirmed that the resist compositions of Examples 16 to 21 shows high sensitivity and high resolution.

[Evaluation of Dry Etching Resistance]

In dry etching resistance tests, 2 g of the each polymer synthesized above (Polymers 1 to 12, and Comparative Polymer 1) was dissolved in 10 g of PGMEA and filtered through a 0.2 μm filter to give a polymer solution. The polymer solution was spin coated onto a silicon substrate to form a 300 nm thick film. Then, etch resistance was evaluated under 2 conditions.

(1) Etching Test with $CHF_3/CF_4$ Gas

A difference of a thickness of each polymer film before and after etching was measured with dry-etching-system TE-8500P manufactured by Tokyo Electron, Ltd.

Etching conditions are shown below.

Chamber pressure: 40.0 Pa
RF power: 1,000 W
Gap: 9 mm
$CHF_3$ gas flow amount: 30 ml/min
$CF_4$ gas flow amount: 30 ml/min
Ar gas flow amount: 100 ml/min
Time: 60 sec (2) Etching Test with $Cl_2/BCl_3$ Gas A difference of a thickness of each polymer film before and after etching was measured with a dry etching system L-507D-L manufactured by Nichiden ANELVA Co., Ltd.

Etching conditions are shown below.

| | |
|---|---|
| Chamber pressure | 40.0 Pa |
| RF power | 300 W |
| Gap | 9 mm |
| $Cl_2$ gas flow amount | 30 ml/min |
| $BCl_3$ gas flow amount | 30 ml/min |
| $CHF_3$ gas flow amount | 100 ml/min |
| $O_2$ gas flow amount | 2 ml/min |
| Time | 60 sec |

TABLE 3

| Resist Composition | Polymer (parts by mass) | Acid Generator (parts by mass) | Basic Compounds (parts by mass) | Dissolution Inhibitor (parts by mass) | Organic Solvent (parts by mass) | Sensitivity (μC/cm²) | Resolution (μm) |
|---|---|---|---|---|---|---|---|
| Example 16 | Polymer 7 (100) | — | triethanol amine (0.2) | — | PGMEA (1,000) | 8 | 0.08 |
| Example 17 | Polymer 8 (100) | — | triethanol amine (0.2) | — | PGMEA (1,000) | 8 | 0.08 |
| Example 18 | Polymer 9 (100) | — | triethanol amine (0.2) | — | PGMEA (1,000) | 8 | 0.08 |
| Example 19 | Polymer 10 (100) | — | triethanol amine (0.2) | — | PGMEA (1,000) | 7 | 0.08 |
| Example 20 | Polymer 11 (100) | — | triethanol amine (0.2) | — | PGMEA (1,000) | 8 | 0.08 |
| Example 21 | Polymer 12 (100) | — | triethanol amine (0.2) | — | PGMEA (1,000) | 10 | 0.08 |
| Comparative Example 2 | Comparative Polymer 1 (100) | PAG1 (10.0) | triethanol amine (0.2) | — | PGMEA (1,000) | 20 | 0.12 |

Results of the tests are shown in Table 4.

TABLE 4

| Polymer | CHF$_3$/CF$_4$ gas etching rate (nm/min.) | Cl$_2$/BCl$_3$ gas etching rate (nm/min.) |
|---|---|---|
| Polymer 1 | 136 | 188 |
| Polymer 2 | 144 | 197 |
| Polymer 3 | 142 | 183 |
| Polymer 4 | 140 | 178 |
| Polymer 5 | 140 | 177 |
| Polymer 6 | 114 | 189 |
| Polymer 7 | 120 | 155 |
| Polymer 8 | 118 | 148 |
| Polymer 9 | 120 | 143 |
| Polymer 10 | 116 | 140 |
| Polymer 11 | 120 | 147 |
| Polymer 12 | 121 | 148 |
| Comparative Polymer 1 | 158 | 350 |

As is evident from the results of Table 4, the polymers according to the present invention (Polymers 1 to 12) have higher dry etching resistance than Comparative Polymer 1.

The present invention is not limited to the above-described embodiments. The above-described embodiments are mere examples, and those having the substantially same structure as that described in the appended claims and providing the similar action and advantages are included in the scope of the present invention.

The invention claimed is:

1. A resist composition which comprises, at least, a polymer including repeating units represented by the following general formulae (a) and (b),

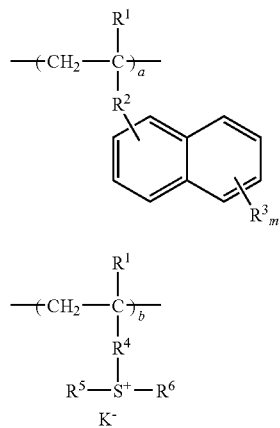

wherein $R^1$, which may be the same or different, represents a hydrogen atom or a methyl group;
$R^2$ represents a single bond;
$R^3$ represents any one of a hydroxy group, a hydroxy group substituted with an acid labile group or an acetyl group, a carboxy group, and a carboxy group substituted with an acid labile group;
$R^4$ represents any one of a phenylene group, —O—$R^7$—, —C(=O)—$X^1$—$R^7$—, —C(=O)—O —$C_2H_4$—O—$Y^1$—, —C(=O)—O—$Z^1$—C(=O)—CH$_2$—, —$Z^1$—C(=O)—CH$_2$—, —C(=O)—O—$Z^1$—CH$_2$—, and —C(=O)—$X^1$—$R^7$—$Z^1$—;
$X^1$ represents an oxygen atom or NH;
$R^7$ represents a linear, branched or cyclic alkylene group having 1-6 carbon atoms which may contain a carbonyl group, an ester group or an ether group or an arylene group having 6-8 carbon atoms which may contain a carbonyl group, an ester group or an ether group;
$Y^1$ represents any one of a phenylene group, a naphthylene group, and an anthrylene group;
$Z^1$ represents a phenylene group;
$R^5$ and $R^6$, which may be the same or different, represent a linear, branched or cyclic alkyl group having 1-12 carbon atoms which may contain a carbonyl group, an ester group or an ether group, an aryl group having 6-12 carbon atoms, an aralkyl group having 7-20 carbon atoms or a thiophenyl group;
$R^5$ and $R^6$ can be linked to form a ring;
$K^-$ represents $C_4F_9$—$SO_3^-$;
m represents 1 or 2;
a satisfies 0<a<1.0; and
b satisfies 0<b≦0.8,
wherein the formula (b) is a repeating unit represented by the following general Formula (b') or (b")

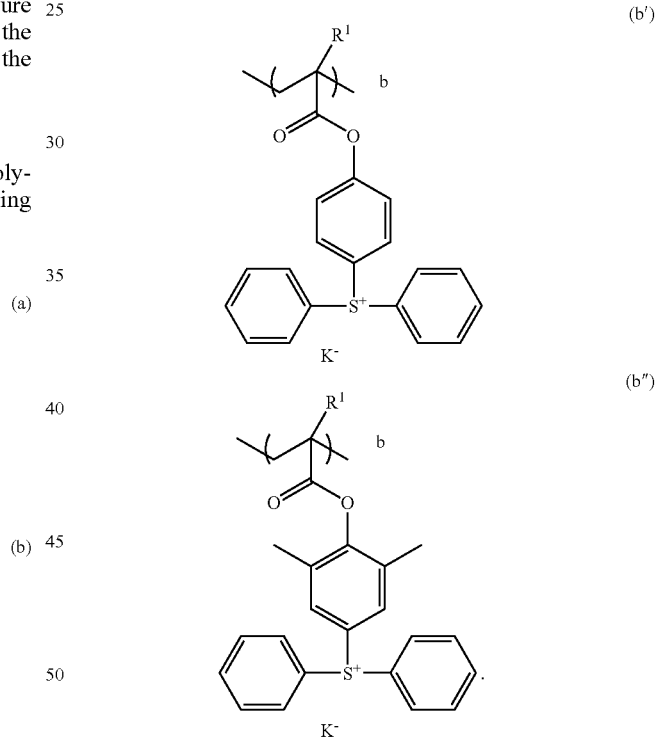

2. The resist composition according to claim 1 wherein the polymer further includes repeating units represented by the following general formulae (c) and/or (d),

-continued (d)

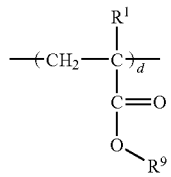

wherein $R^1$ represents a hydrogen atom or a methyl group;
$R^8$ represents an adhesion group with lactone;
$R^9$ represents an acid labile group;
$R^{10}$ represents any one of a hydrogen atom, a methyl group, and —$CH_2$—C(=O)—O —$CH_3$; and
c and d satisfies $0 \leq c \leq 0.8$, $0 \leq d \leq 0.8$, and $0 < c+d \leq 0.8$.

3. The resist composition according to claim 1, wherein the resist composition is a chemically amplified positive resist composition.

4. The resist composition according to claim 2, wherein the resist composition is a chemically amplified positive resist composition.

5. The resist composition according to claim 1, which further contains any one or more of an organic solvent, a basic compound, a dissolution inhibitor and a surfactant.

6. The resist composition according to claim 2, which further contains any one or more of an organic solvent, a basic compound, a dissolution inhibitor and a surfactant.

7. The resist composition according to claim 3, which further contains any one or more of an organic solvent, a basic compound, a dissolution inhibitor and a surfactant.

8. The resist composition according to claim 4, which further contains any one or more of an organic solvent, a basic compound, a dissolution inhibitor and a surfactant.

9. A patterning process comprising: at least, a step of applying the resist composition according to claim 1 over a substrate; a step of exposing the substrate to high energy beam after heat-treatment; and a step of developing the substrate with a developer.

10. A patterning process comprising: at least, a step of applying the resist composition according to claim 2 over a substrate; a step of exposing the substrate to high energy beam after heat-treatment; and a step of developing the substrate with a developer.

11. A patterning process comprising: at least, a step of applying the resist composition according to claim 3 over a substrate; a step of exposing the substrate to high energy beam after heat-treatment; and a step of developing the substrate with a developer.

12. A patterning process comprising: at least, a step of applying the resist composition according to claim 4 over a substrate; a step of exposing the substrate to high energy beam after heat-treatment; and a step of developing the substrate with a developer.

13. A patterning process comprising: at least, a step of applying the resist composition according to claim 5 over a substrate; a step of exposing the substrate to high energy beam after heat-treatment; and a step of developing the substrate with a developer.

14. A patterning process comprising: at least, a step of applying the resist composition according to claim 6 over a substrate; a step of exposing the substrate to high energy beam after heat-treatment; and a step of developing the substrate with a developer.

15. A patterning process comprising: at least, a step of applying the resist composition according to claim 7 over a substrate; a step of exposing the substrate to high energy beam after heat-treatment; and a step of developing the substrate with a developer.

16. A patterning process comprising: at least, a step of applying the resist composition according to claim 8 over a substrate; a step of exposing the substrate to high energy beam after heat-treatment; and a step of developing the substrate with a developer.

17. The patterning process according to claim 9, wherein the high energy beam has a wavelength of 200 nm or less.

18. The patterning process according to claim 9, wherein, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

19. The patterning process according to claim 10, wherein, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

20. The patterning process according to claim 11, wherein, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

21. The patterning process according to claim 12, wherein, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

22. The patterning process according to claim 13, wherein, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

23. The patterning process according to claim 14, wherein, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

24. The patterning process according to claim 15, wherein, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

25. The patterning process according to claim 16, wherein, in the step of exposing the substrate to high energy beam, an ArF excimer laser with a wavelength of 193 nm is used as a light source, a gap between the substrate over which the resist composition is applied and a projection lens is filled with liquid, and liquid immersion exposure in which the substrate is exposed through the liquid is conducted.

* * * * *